US012568617B2

(12) United States Patent

Lee

(10) Patent No.: US 12,568,617 B2
(45) Date of Patent: Mar. 3, 2026

(54) DECOUPLING CAPACITOR STRUCTURE AND SEMICONDUCTOR DEVICE INCLUDING THE SAME

(71) Applicant: Samsung Electronics Co., Ltd., Suwon-si (KR)

(72) Inventor: Jongmin Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 722 days.

(21) Appl. No.: 17/945,542

(22) Filed: Sep. 15, 2022

(65) Prior Publication Data

US 2023/0189511 A1      Jun. 15, 2023

(30) Foreign Application Priority Data

Dec. 13, 2021    (KR) ........................ 10-2021-0177757

(51) Int. Cl.
*H10B 12/00* (2023.01)

(52) U.S. Cl.
CPC .................................... *H10B 12/50* (2023.02)

(58) Field of Classification Search
CPC .. H10B 12/50; H10B 12/0335; H10B 12/482; H10B 12/033; H10B 12/09; H10B 12/315; H10B 12/05; H10B 12/48; H10D 1/716; H10D 1/68; H10D 1/692; H01L 23/642; G11C 11/4097
See application file for complete search history.

(56) References Cited

U.S. PATENT DOCUMENTS 8,558,347 B2    10/2013  Kwon et al.
8,648,440 B2    2/2014   Jie
(Continued)

FOREIGN PATENT DOCUMENTS

KR          10-1067859 B1      9/2011
KR      10-2014-0011225 A      1/2014
(Continued)

OTHER PUBLICATIONS

Taiwanese Office Action dated Jul. 18, 2023 issued in corresponding Taiwanese Patent Application No. 111137699.
(Continued)

*Primary Examiner* — Patricia D Valenzuela
(74) *Attorney, Agent, or Firm* — Fish & Richardson P.C.

(57) ABSTRACT

A decoupling capacitor structure includes an insulating division pattern, conductive pads, lower electrode sets, a support structure, a dielectric layer, and an upper electrode structure. The conductive pads are at opposite sides of the insulating division pattern. The lower electrode sets are spaced apart from each other in a horizontal direction on each conductive pad. The support structure contacts and connects sidewalls of the lower electrodes. The dielectric layer is on the lower electrodes and the support structure. The upper electrode structure is on the dielectric layer. The lower electrode sets include first lower electrodes adjacent to the insulating division pattern and second lower electrodes spaced apart from the first lower electrodes in the horizontal direction. The support structure defines an opening between the second lower electrodes. The opening is not formed between the first lower electrodes or between the first lower electrodes the second lower electrodes.

20 Claims, 60 Drawing Sheets

(56)     References Cited

U.S. PATENT DOCUMENTS

| | | | |
|---|---|---|---|
| 8,847,353 B2 | 9/2014 | Hasunuma | |
| 9,799,724 B2 | 10/2017 | Lee et al. | |
| 10,032,778 B2 | 7/2018 | Kim et al. | |
| 10,283,509 B2 | 5/2019 | Pak et al. | |
| 11,270,933 B2 | 3/2022 | Han et al. | |
| 11,910,593 B2 | 2/2024 | Choi et al. | |
| 2013/0175667 A1* | 7/2013 | Kwon ..................... | H10D 1/716 |
| | | | 257/532 |
| 2013/0228837 A1 | 9/2013 | Sukekawa et al. | |
| 2016/0073502 A1* | 3/2016 | Lee ...................... | H10D 84/212 |
| | | | 174/260 |
| 2016/0233218 A1 | 8/2016 | Mikasa | |
| 2019/0139965 A1 | 5/2019 | Ikebuchi | |

FOREIGN PATENT DOCUMENTS

| | | |
|---|---|---|
| KR | 10-2018-0066523 A | 6/2018 |
| KR | 10-2021-0063577 A | 6/2021 |
| KR | 10-2021-0086777 A | 7/2021 |

OTHER PUBLICATIONS

Office Action in Korean Appln. No. 10-2021-0177757, mailed on Jul. 10, 2025, 13 pages (with English translation).

\* cited by examiner

Figure 10:
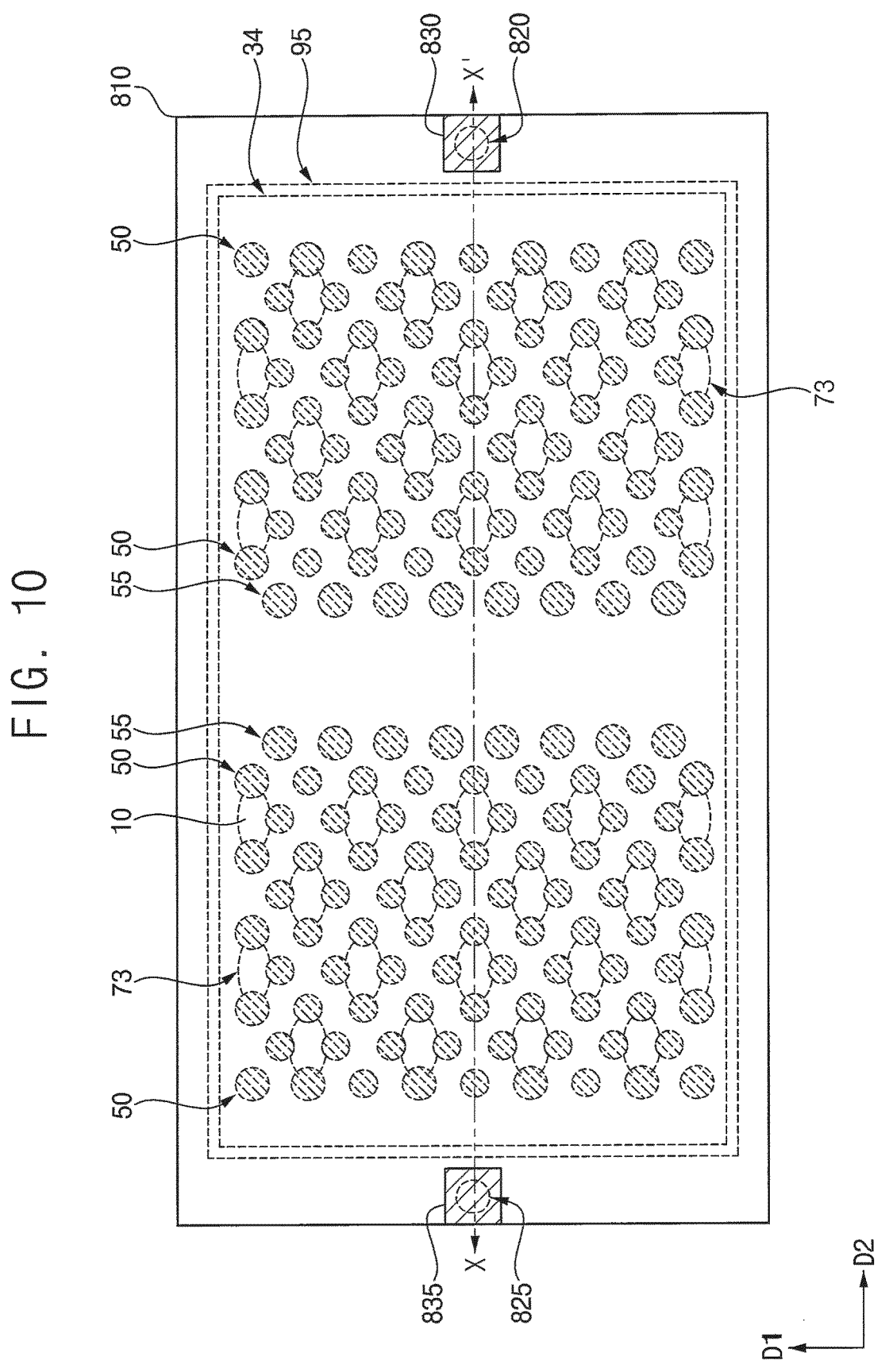

F I G. 44
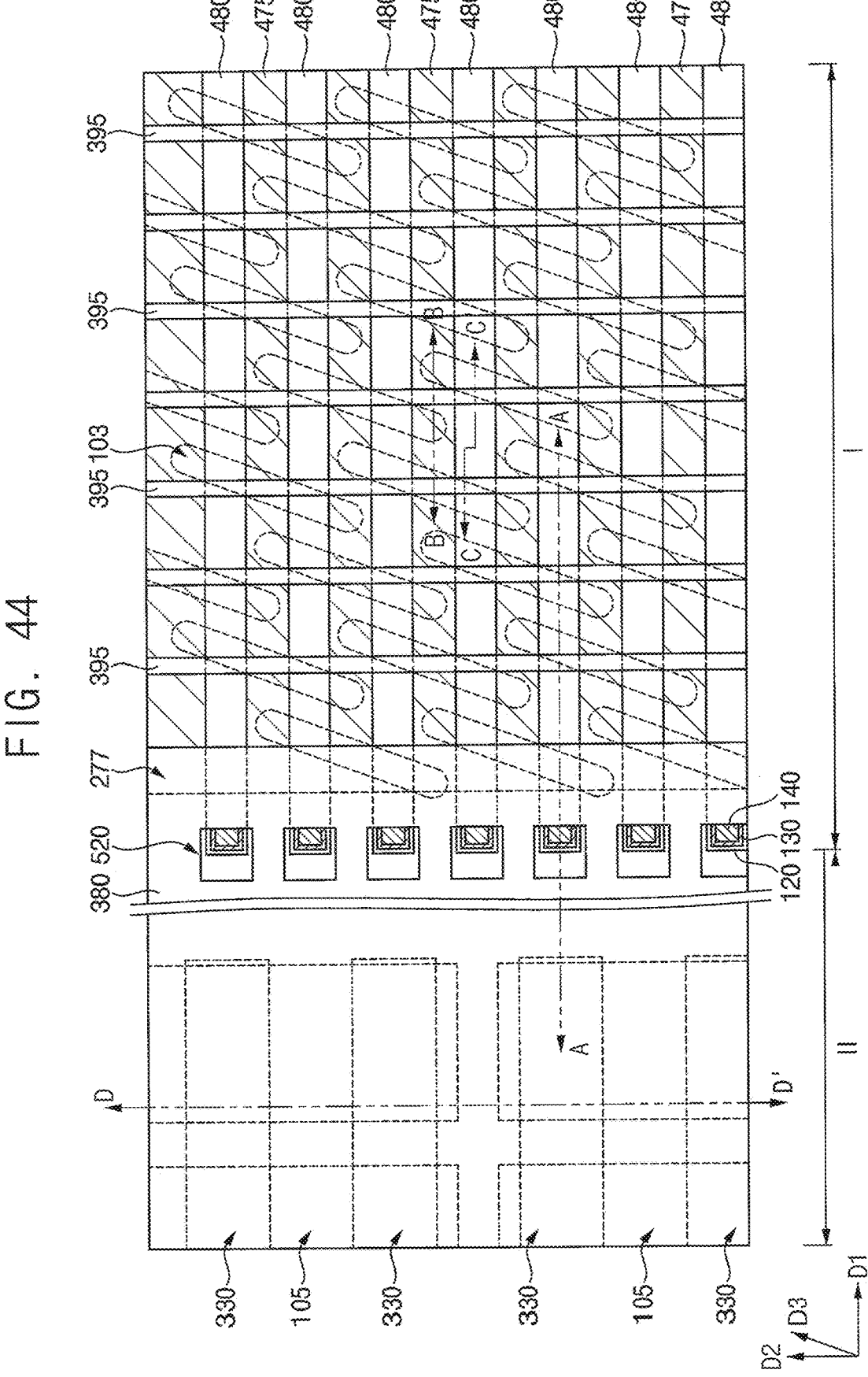

Figure 51:
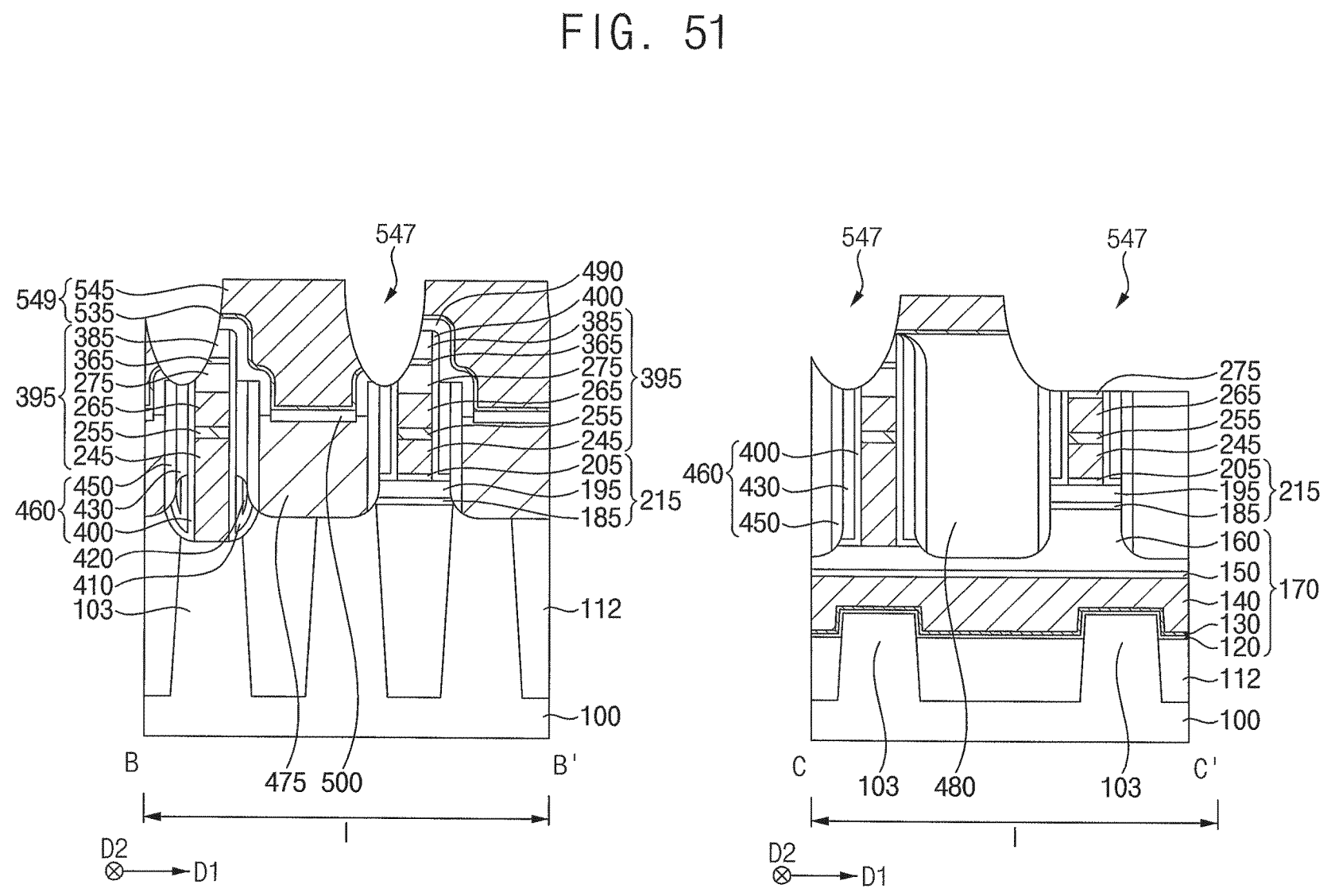

DECOUPLING CAPACITOR STRUCTURE AND SEMICONDUCTOR DEVICE INCLUDING THE SAME

CROSS-REFERENCE TO RELATED APPLICATION

This application claims priority under 35 U.S.C. § 119 to Korean Patent Application No. 10-2021-0177757 filed on Dec. 13, 2021 in the Korean Intellectual Property Office, the disclosure of which is hereby incorporated by reference in its entirety.

TECHNICAL FIELD

Example embodiments of the present disclosure relate to a decoupling capacitor structure and a semiconductor device including the same. More particularly, example embodiments of the present disclosure relate to a decoupling capacitor structure and a DRAM device including the same.

DISCUSSION OF RELATED ART

In a DRAM device, cell capacitors may be formed in a cell region, and decoupling capacitors may be formed in a peripheral circuit region. The cell capacitors and the decoupling capacitors may have a high aspect ratio to easily fall down. A support structure may be formed to prevent the cell capacitors and the decoupling capacitors from falling down. If the support structure is damaged, cracks may be formed in the support structure.

SUMMARY

Example embodiments provide a decoupling capacitor structure having improved structural stability.

Example embodiments provide a semiconductor device including a decoupling capacitor structure having improved structural stability.

According to example embodiments of the inventive concepts, there is a decoupling capacitor structure. The decoupling capacitor structure may include an insulating division pattern, first and second conductive pads, first and second lower electrode sets, a support structure, a dielectric layer, and an upper electrode structure. The insulating division pattern may be formed on a substrate and may extend in a first direction substantially parallel to an upper surface of the substrate. The first conductive pad and the second conductive pad may be formed on the substrate. The first conductive pad may be at first side of the insulating division pattern, the second conductive pad being at a second side of the insulating division pattern, the first side and the second side being opposite sides a second direction substantially parallel to the upper surface of the substrate and substantially perpendicular to the first direction. The first lower electrode set may be formed on the first conductive pad. The second lower electrode set may be formed on the second conductive pad. The first and second lower electrode sets may be spaced apart from each other in a horizontal direction substantially parallel to the upper surface of the substrate. The support structure may be formed between the first and second lower electrode sets and may contact a first sidewall of the first lower electrode sets and a second sidewall of the second lower electrode set and connect the first and second lower electrode sets to each other. The dielectric layer may be formed on a first surface of the first lower electrode set, a second surface of the second lower electrode set, and the support structure. The upper electrode structure may be formed on a surface of the dielectric layer. Each of the first and second lower electrode sets may include first lower electrodes arranged in the first direction and adjacent to the insulating division pattern and second lower electrodes spaced apart from the first lower electrodes in the horizontal direction. The support structure may define an opening through the support structure. The opening may be formed between multiple second lower electrodes neighboring in the horizontal direction and may not be formed between the first lower electrodes or between any of the first lower electrodes and one of the second lower electrodes adjacent thereto.

According to example embodiments of the inventive concepts, there is a decoupling capacitor structure. The decoupling capacitor structure may include a conductive pad, first lower electrodes, second lower electrodes, a support structure, a dielectric layer, and an upper electrode structure. The conductive pad may be formed on a substrate. The first lower electrodes may be formed on an edge portion of the conductive pad and may be spaced apart from each other in a first direction substantially parallel to an upper surface of the substrate. The second lower electrodes may be formed on the conductive pad and may be spaced apart from the first lower electrodes in a second direction substantially parallel to the upper surface of the substrate and substantially perpendicular to the first direction. The second lower electrodes may be spaced apart from each other in the first and second directions. The support structure may contact sidewalls of the first and second lower electrodes and connect the first and second lower electrodes to each other. The dielectric layer may be formed on surfaces of the first and second lower electrodes and the support structure. The upper electrode structure may be formed on a surface of the dielectric layer. The support structure may contact the at least one sidewall of each of the first lower electrodes, and may not contact the sidewalls of ones of the second lower electrodes neighboring with other second lower electrodes.

According to example embodiments of the inventive concepts, there is a semiconductor device. The semiconductor device may include gate structures, bit line structures, contact plug structures, a first capacitor structure, a pair of conductive pads, and a second capacitor structure. The gate structures may be buried in a substrate including a cell region and a peripheral circuit region, and each of the gate structures may extend in the cell region of the substrate in a first direction substantially parallel to an upper surface of the substrate. The bit line structures may be formed on the cell region of the substrate, and each of the bit line structures may extend in a second direction substantially parallel to the upper surface of the substrate and crossing the first direction. The contact plug structures may be disposed in the second direction between two of the bit line structures on the substrate. The first capacitor structure may include first capacitors and a first support structure. Each of the first capacitors may include a first lower electrode on each of the contact plug structures, a first dielectric layer on a surface of the first lower electrode, and a first upper electrode structure on a surface of the first dielectric layer. The first support structure may contact sidewalls of the first lower electrodes and support the first lower electrodes. The pair of conductive pads may be formed on the peripheral circuit region of the substrate and electrically insulated from the substrate. The conductive pads may be spaced apart from each other by an insulating division pattern extending in a third direction substantially parallel to the upper surface of the substrate. The second capacitor structure may include second capacitors and a second support structure. Each of the second capacitors may include second and third lower electrodes spaced apart from each other on each of the pair of conductive pads, a second dielectric layer on surfaces of the second and third lower electrodes, and a second upper electrode structure on a surface of the second dielectric layer. The second support structure may contact sidewalls of the second and third lower electrodes and support the second and third lower electrodes. The support structure may define an opening through the support structure. The opening may be defined between multiple third lower electrodes neighboring in a horizontal direction and may not be formed between the second lower electrodes or between one of the second lower electrodes and one of the third lower electrodes adjacent thereto.

The decoupling capacitor structure may include the support structure contacting and supporting the sidewalls of the lower electrodes, and cracks may not be generated even with outer impact on the support structure. Thus, the decoupling capacitor structure may have a stable structure.

BRIEF DESCRIPTION OF THE DRAWINGS

FIGS. 1 to 11 are plan views and cross-sectional views illustrating a method of forming a decoupling capacitor structure in accordance with example embodiments.

FIGS. 12 and 13 are plan views illustrating a support structure of a decoupling capacitor structure in a comparative embodiment and the support structure of the decoupling capacitor structure in accordance with example embodiments.

FIGS. 21 to 60 are plan views and cross-sectional views illustrating a method of manufacturing a semiconductor device according to example embodiments.

DETAILED DESCRIPTION

Figure 2:
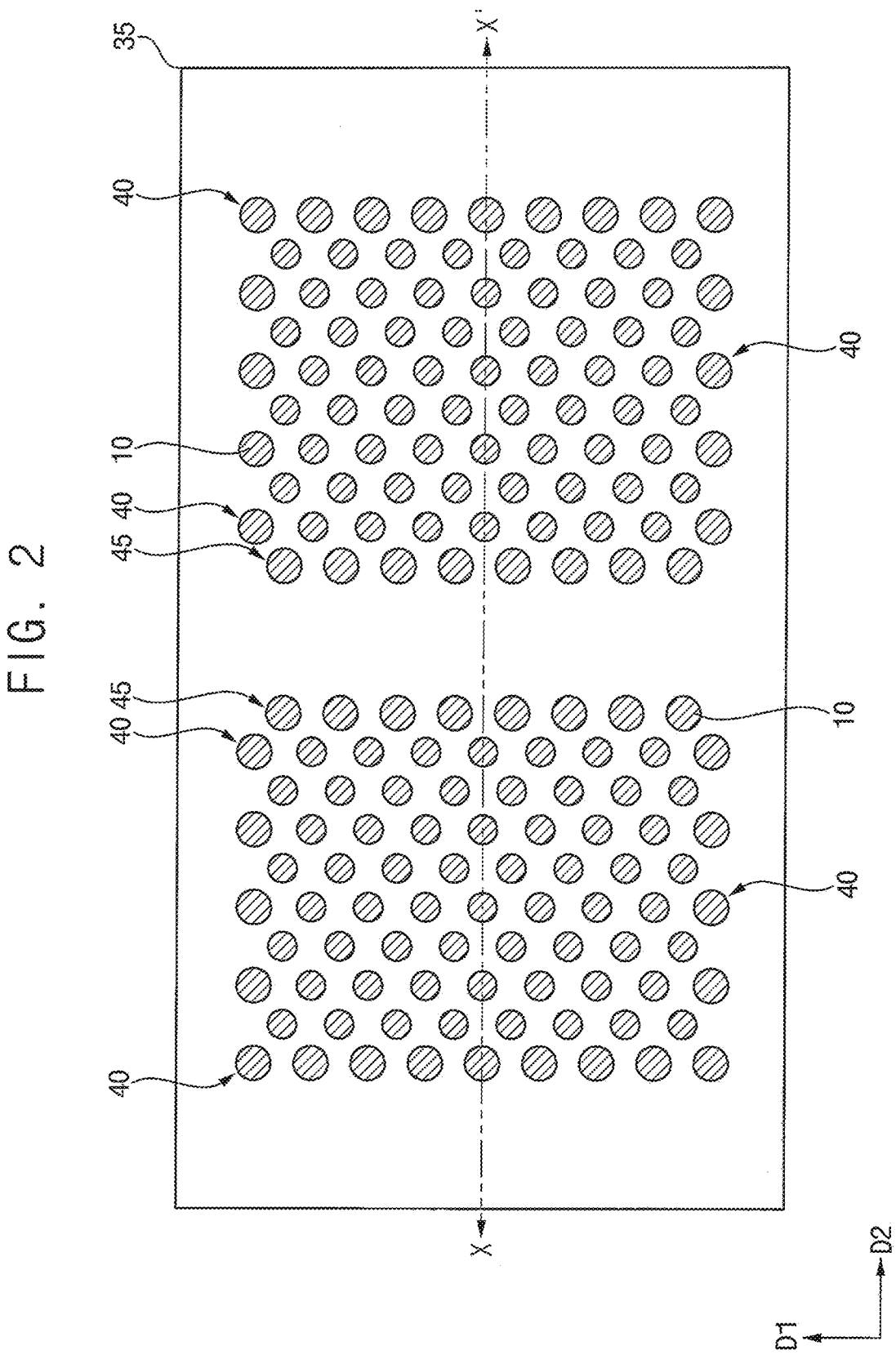

The above and other aspects and features of a decoupling capacitor structure and a method of forming the same, and a semiconductor device including the decoupling capacitor structure and a method of manufacturing the same in accordance with example embodiments will become readily understood from detail descriptions that follow, with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another region, layer, or section. Thus, a first element, component, region, layer, or section discussed below could be termed a second or third element, component, region, layer, or section without departing from the teachings of inventive concepts.

FIGS. 1 to 11 are plan views and cross-sectional views illustrating a method of forming a decoupling capacitor structure in accordance with example embodiments.

Particularly, FIGS. 2, 4, 6 and 10 are the plan views, and FIGS. 1, 3, 5, 7-9 and 11 are cross-sectional views taken along lines X-X' of corresponding plan views, respectively.

Figure 1:
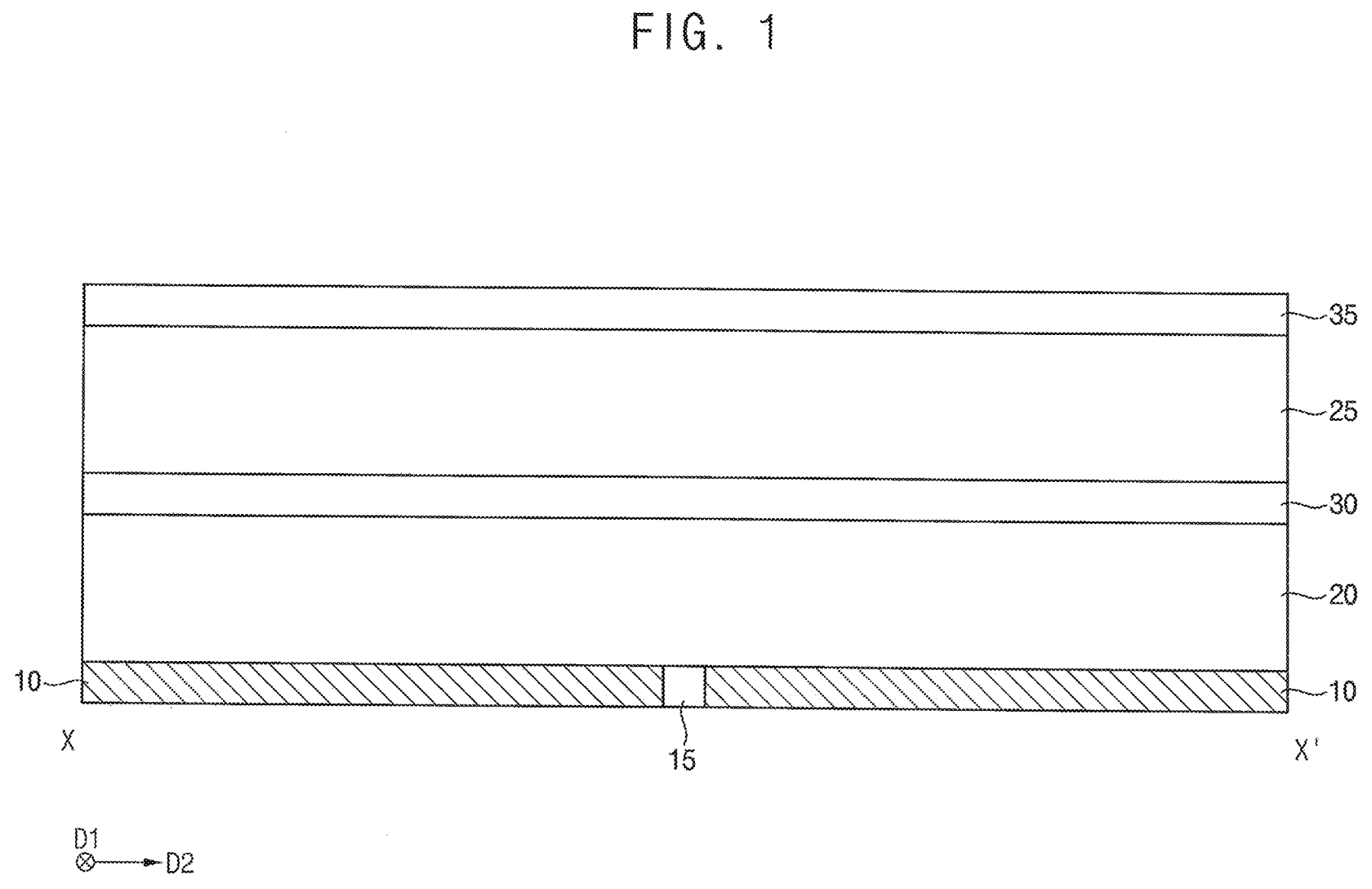

Referring to FIG. 1, a first mold layer 20, a first support layer 30, a second mold layer 25 and a second support layer 35 may be sequentially formed on a conductive pad 10 and an insulating division pattern 15.

The conductive pad 10 may be formed by forming a conductive pad layer on a substrate and forming (or defining) a first opening through the conductive pad layer to expose an upper surface of the substrate. The insulating division pattern 15 may be formed on an insulating division layer on the substrate to fill the first opening and planarizing the insulating division layer until an upper surface of the conductive pad 10 is exposed.

In example embodiments, the insulating division pattern 15 may extend on the substrate in a first direction D1 substantially parallel to the upper surface of the substrate and may divide the conductive pad layer in a second direction D2 substantially parallel to the upper surface of the substrate and substantially perpendicular to the first direction D1. Thus, one conductive pad 10 may be formed at each of opposite sides of the insulating division pattern 15 in the second direction D2.

Each of the first and second mold layers 20 and 25 may include an oxide, e.g., silicon oxide, and each of the first and second support layers 30 and 35 may include a nitride, e.g., silicon nitride. However, the inventive concept may not be limited thereto, and the first and second mold layers 20 and 25 and the first and second support layers 30 and 35 may include any different insulating materials from each other.

Figure 3:
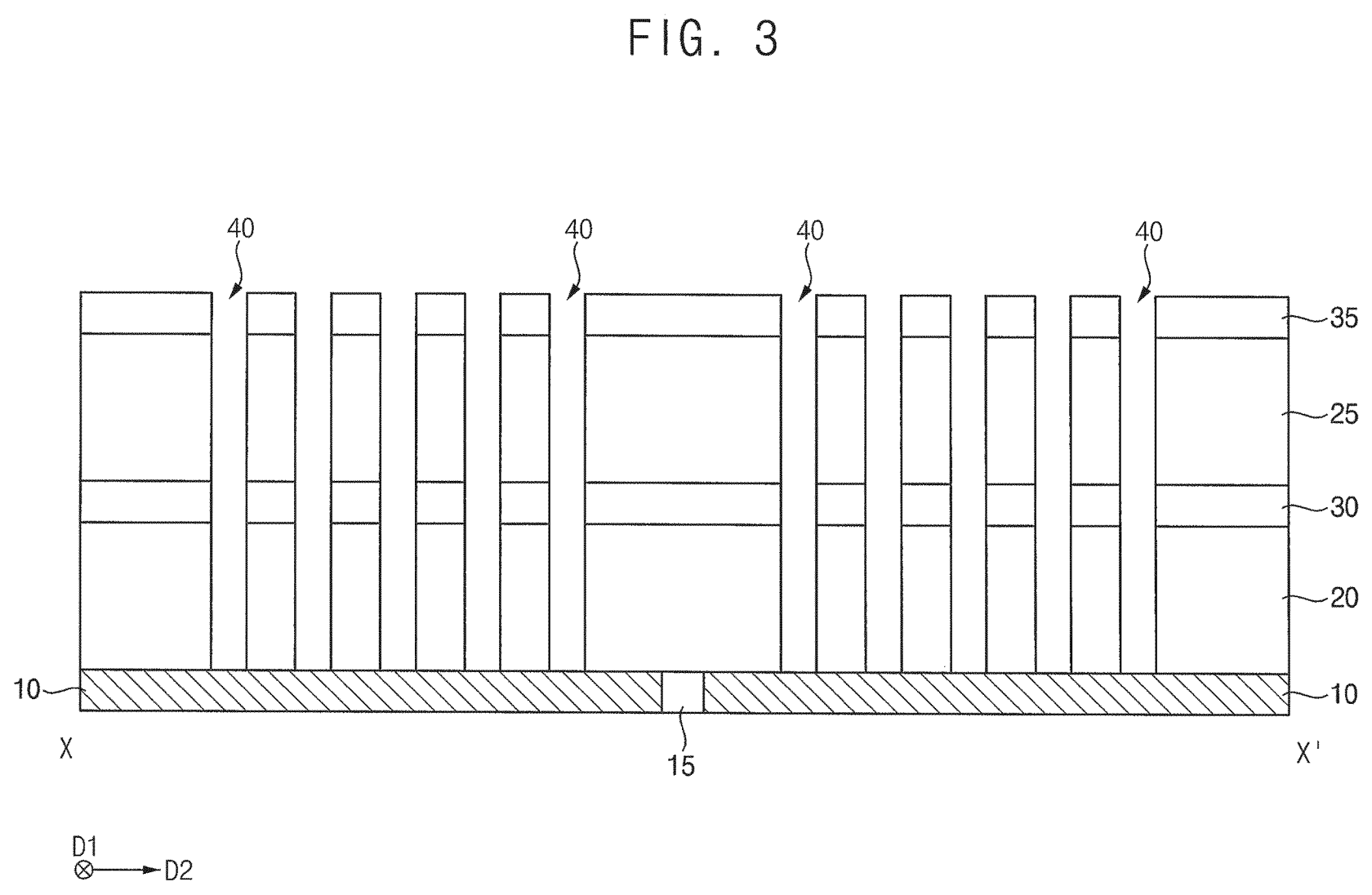

Referring to FIGS. 2 and 3, second and third openings 40 and 45 may be formed (or defined) through the first and second support layers 30 and 35 and the first and second mold layers 20 and 25 to expose an upper surface of the conductive pad 10.

In example embodiments, the second and third openings 40 and 45 may be arranged in a honeycomb pattern in a plan view. However, the inventive concept may not be limited thereto, and the second and third openings 40 and 45 may be arranged in other patterns, e.g., a rectangular lattice pattern in a plan view. FIG. 2 shows the second and third openings 40 and 45 are arranged in a 17 by 10 matrix, however, the inventive concept may not be limited thereto.

In example embodiments, the third openings 45 may be arranged in the first direction D1 in a column at an area adjacent to the insulating division pattern 15 on each conductive pad 10, and the second openings 40 may be spaced apart from the third openings 45 in the second direction D2.

The second and third openings 40 and 45 may be formed by forming a photoresist pattern on the second support layer 35 and performing an etching process using the photoresist pattern as an etching mask. Due to the loading effect during the etching process, ones of the second and third openings 40 and 45 at an edge area, that is, ones of the second openings 40 at edge areas in the first and second directions D1 and D2 and the third openings 45 may be relatively less etched so as not to expose the upper surface of the conductive pad 10. Thus, the ones of the second openings 40 at the edge areas in the first and second directions D1 and D2 and the third openings 45 may have relatively large widths so as to expose the upper surface of the conductive pad 10.

Figure 4:
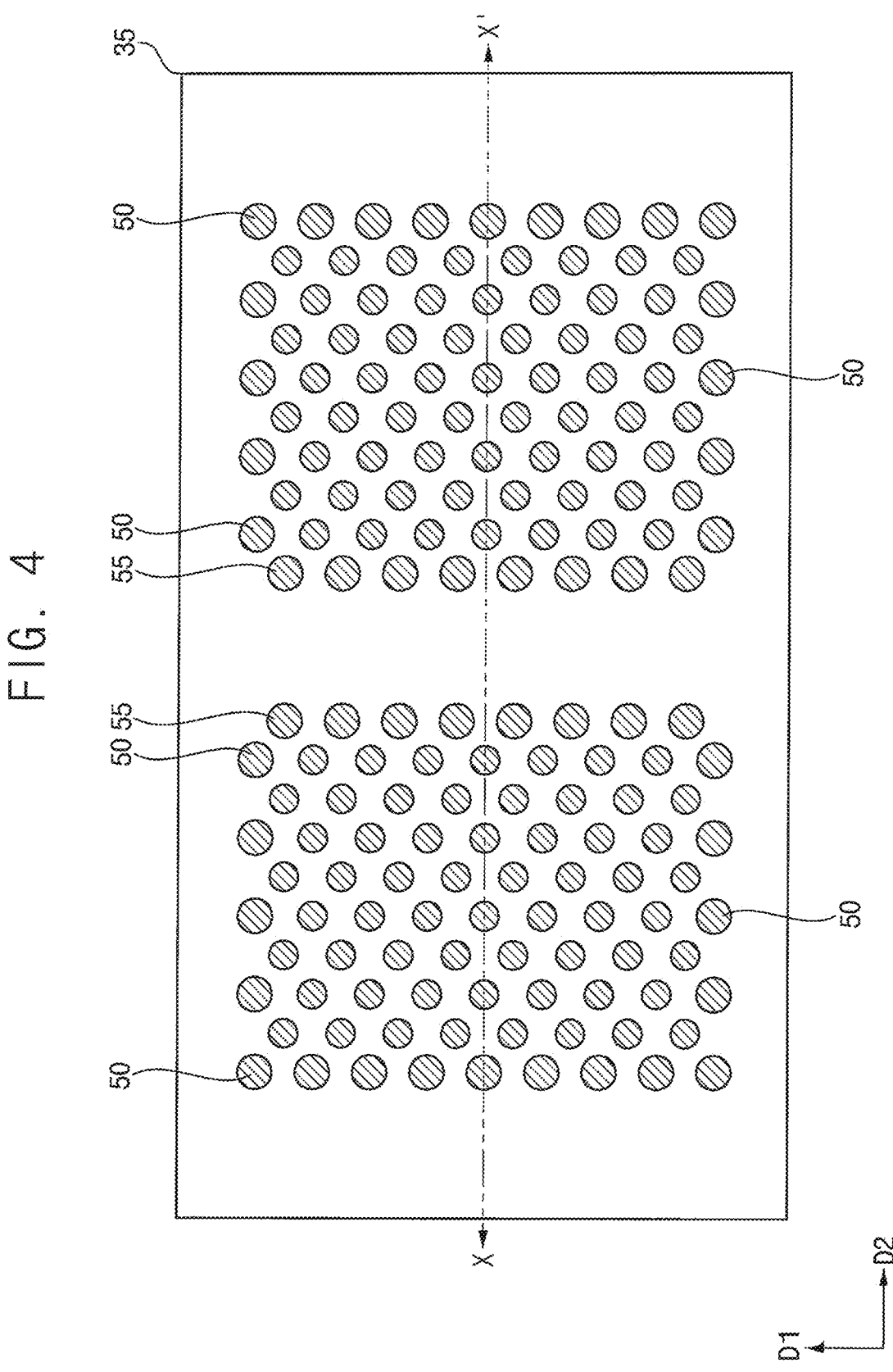
Figure 5:
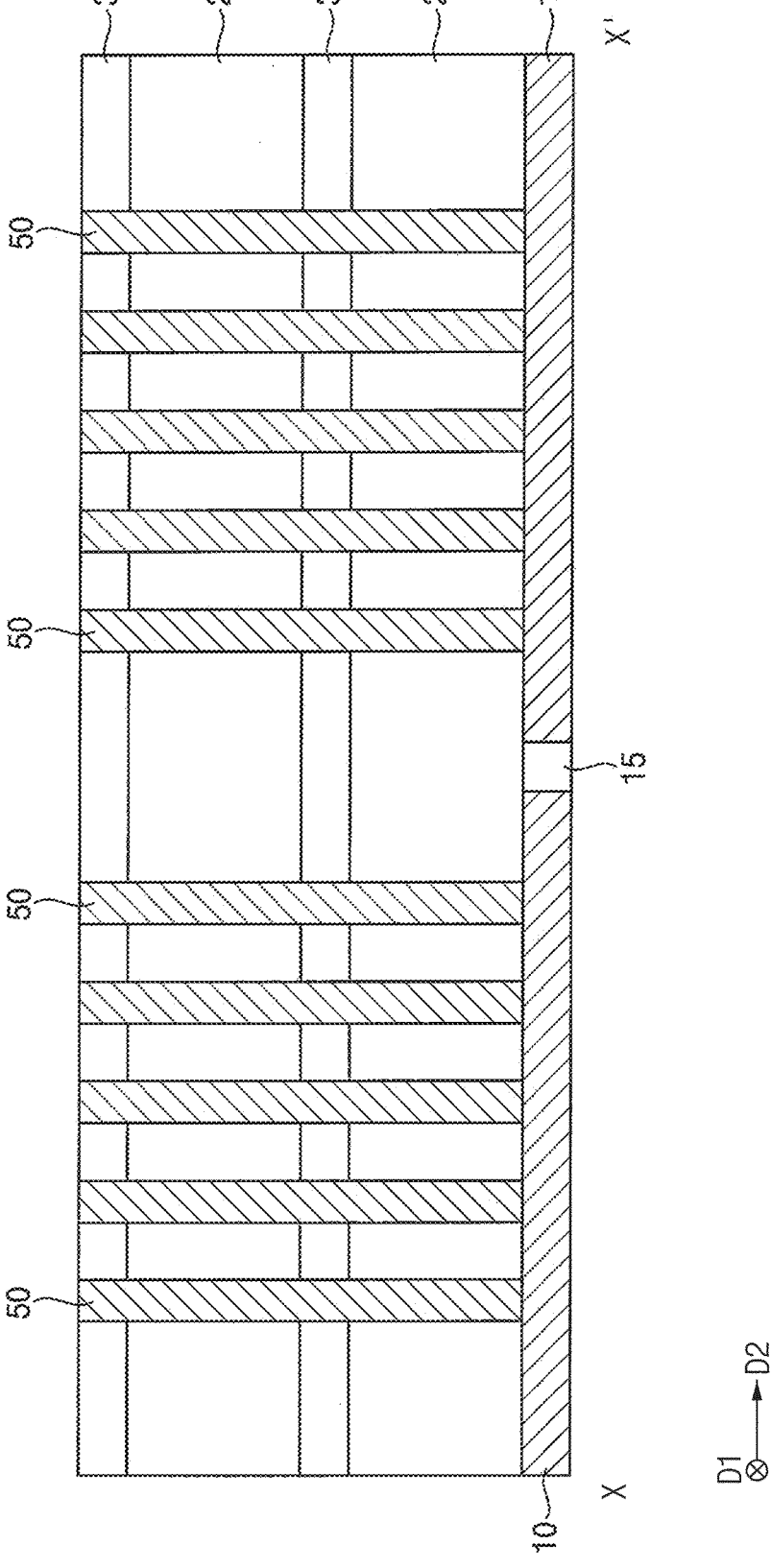

Referring to FIGS. 4 and 5, first and second lower electrodes 50 and 55 may be formed in the second and third openings 40 and 45, respectively.

Particularly, a lower electrode layer may be formed on the upper surface of the conductive pad 10 exposed by the second and third openings 40 and 45 to fill the second and third openings 40 and 45 and may be planarized until an upper surface of the second support layer 35 is exposed to form the first and second lower electrodes 50 and 55 in the second and third openings 40 and 45, respectively. The lower electrode layer may have a first set of lower electrodes (first lower electrode set) on the first conductive pads 10 and a second set of lower electrodes (second lower electrode set) on the second conductive pad 10.

Each of the first and second lower electrodes 50 and 55 may have a pillar shape extending in a vertical direction substantially perpendicular to the upper surface of the substrate, and may include a conductive material, e.g., doped polysilicon, a metal, a metal nitride, etc.

Figure 6:
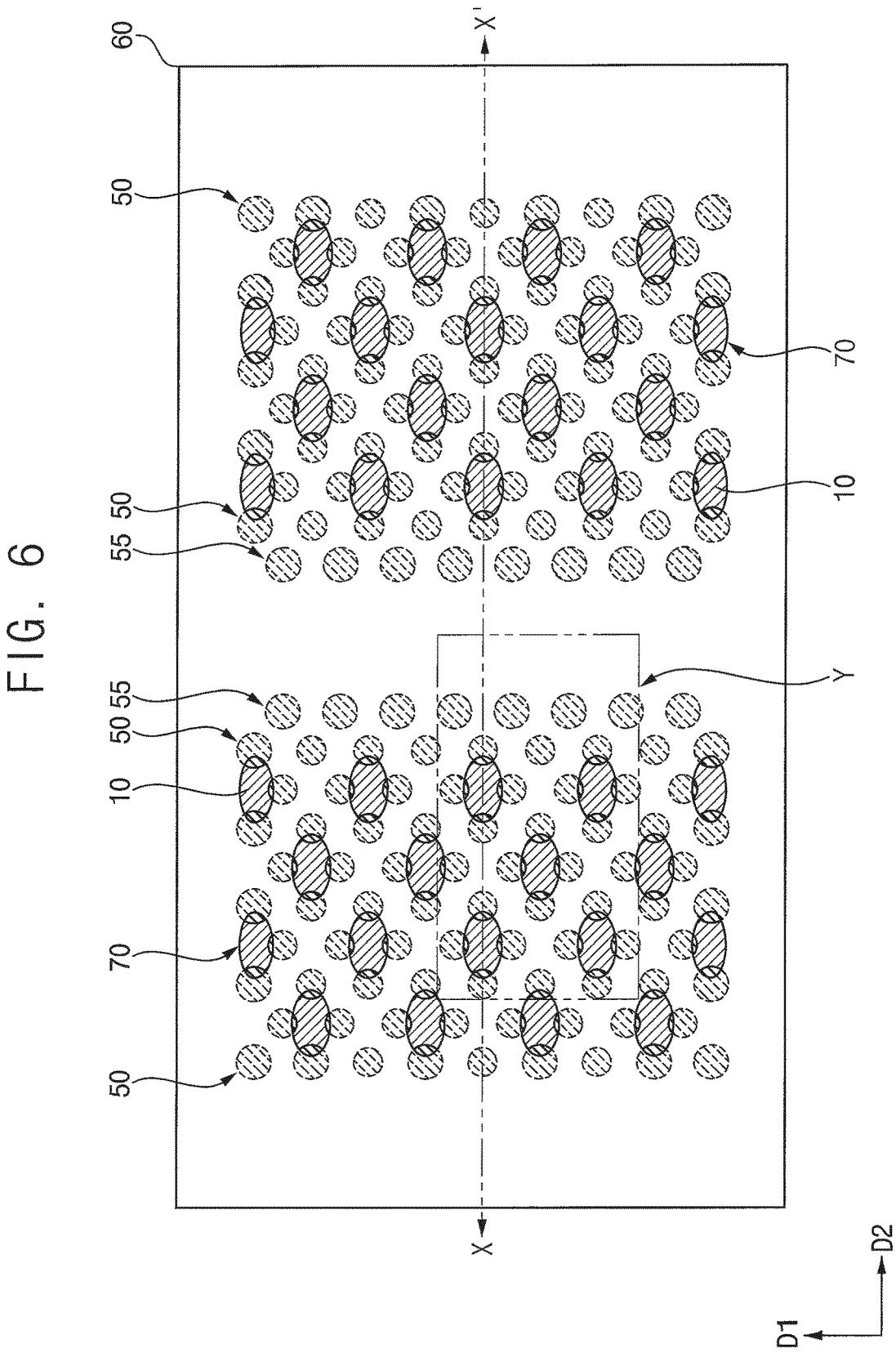
Figure 7:
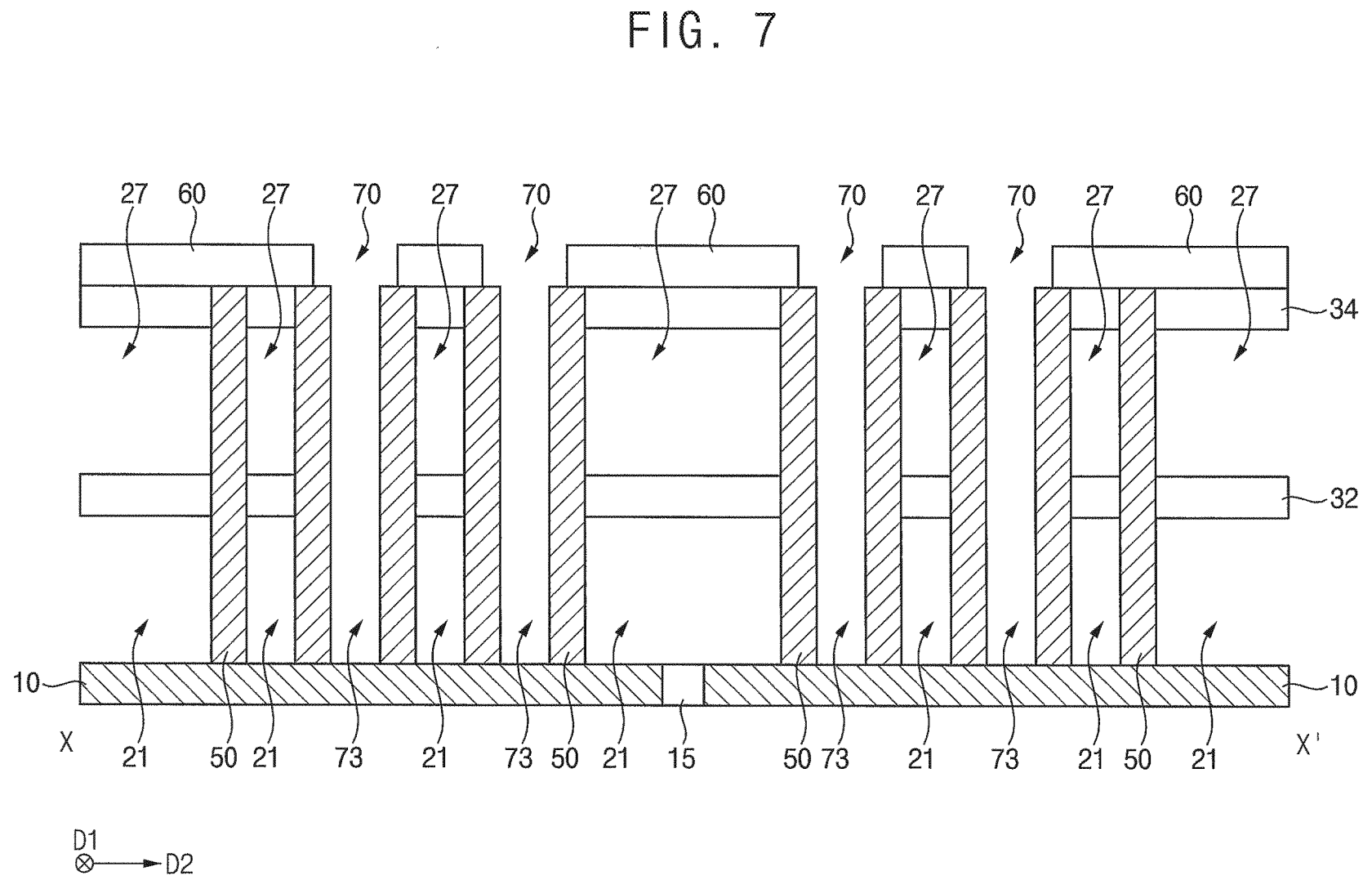

Referring to FIGS. 6 and 7, an etching mask 60 having a fourth opening 70 may be formed on the second support layer 35 and the first and second lower electrodes 50 and 55.

The etching mask 60 may be, e.g., a photoresist pattern, or a multi-layer including a hard mask and a photoresist pattern.

In example embodiments, the fourth opening 70 may expose portions of a plurality of first lower electrodes 50 neighboring in a horizontal direction substantially parallel to the upper surface of the substrate and a portion of the second support layer 35 therebetween. FIG. 6 shows that the fourth opening 70 exposes portions of 4 first lower electrodes 50 neighboring in the horizontal direction, or portions of 3 first lower electrodes 50 neighboring in the horizontal direction at an edge area of the conductive pad 10.

In example embodiments, a plurality of fourth openings 70 may be spaced apart from each other in the horizontal direction, and may be arranged in a given pattern, e.g., a honeycomb pattern, a rectangular lattice pattern, etc., in a plan view. In example embodiments, the fourth opening 70 may have a shape of an ellipse in a plan view, and FIG. 6 shows the fourth opening 70 has a shape of an ellipse with minor and major axes in the first and second directions D1 and D2, respectively.

Ones of the fourth openings 70 at edge areas in the first and second directions D1 and D2 on each conductive pad 10 may have widths greater than those of ones of the fourth openings 70 at a central area, as the second and third openings 40 and 45.

In example embodiments, the fourth opening 70 may not expose ones of the second lower electrodes 55 adjacent to the insulating division pattern 15.

A first dry etching process may be performed on the second support layer 35 using the etching mask 60 to form a second support pattern 34, and thus an upper surface of the second mold layer 25 may be partially exposed. Thus, the second support pattern 34 may have a shape of a plate in which portions between ones of the plurality of first lower electrodes 50 neighboring in the horizontal direction are removed.

A first wet etching process may be performed on the exposed second mold layer 25. The first wet etching process may be an isotropic etching process, and the second mold layer 25 may be entirely removed. Thus, a fifth opening 27 may be formed to expose an upper surface of the first support layer 30.

A second dry etching process may be performed on the first support layer 30 using the etching mask 60 to form a first support pattern 32, and thus an upper surface of the first mold layer 20 may be partially exposed. Thus, the first support pattern 32 may have a shape of a plate in which portions between ones of the plurality of first lower electrodes 50 neighboring in the horizontal direction are removed. That is, the first support pattern 32 may have a shape substantially the same as or similar to that of the second support pattern 34. The first and second support patterns 32 and 34 may form a support structure.

A second etching process may be performed on the exposed first mold layer 20. The second wet etching process may be an isotropic etching process, and the first mold layer 20 may be entirely removed. Thus, a sixth opening 27 may be formed to expose an upper surface of the conductive pad 10.

A space under and connected to the fourth opening 70, which may be formed by removing portions of the first and second mold layers 20 and 25 and the first and second support layers 30 and 35 between the ones of the plurality of first lower electrodes 50 neighboring in the horizontal direction, may be referred to as a seventh opening 73.

The etching mask 60 may be removed, and thus upper surfaces of the second support pattern 34 and the first and second lower electrodes 50 and 55 may be exposed. If the etching mask 60 is a photoresist pattern, the etching mask 60 may be removed by, e.g., an ashing process and/or a stripping process.

Figure 8:
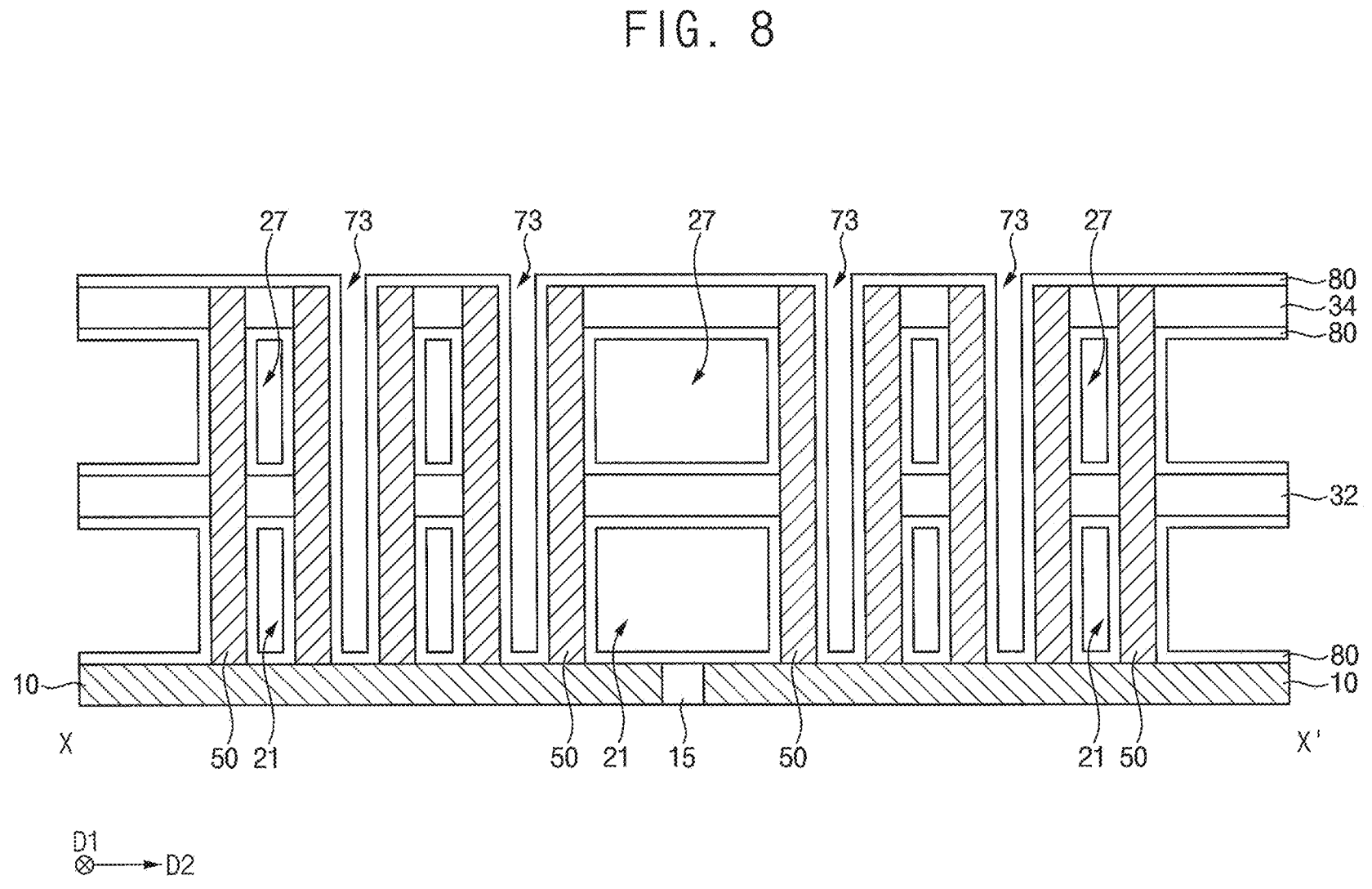

Referring to FIG. 8, a dielectric layer 80 may be formed on surfaces of the first and second lower electrodes 50 and 55 and the first and second support patterns 32 and 34 and the upper surfaces of the conductive pad 10 and the insulating division pattern 15.

Thus, the dielectric layer 80 may be partially fill the fifth to seventh openings 21, 27 and 73.

The dielectric layer 80 may include a high-k dielectric material, e.g., a metal oxide.

Figure 9:
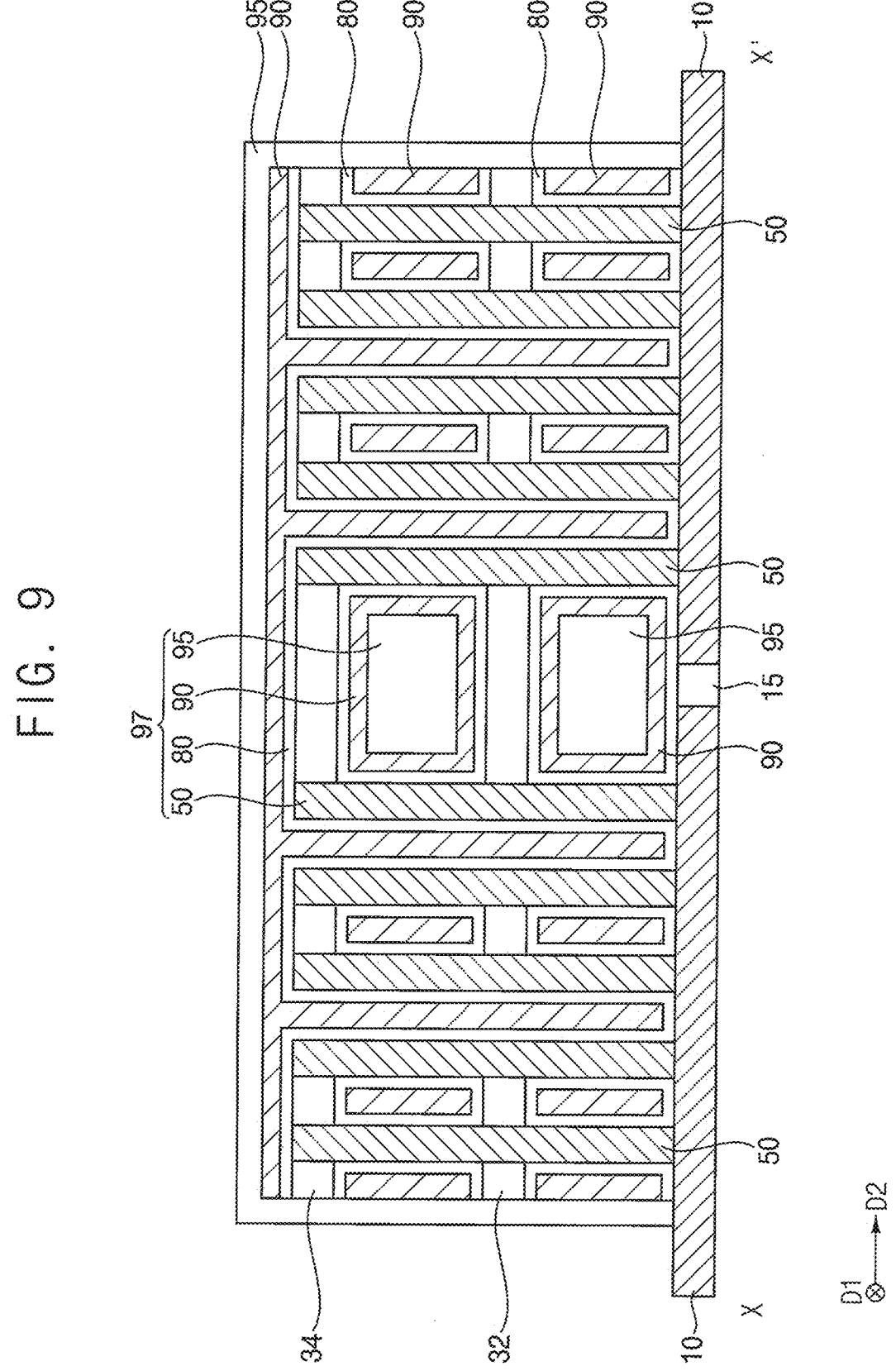

Referring to FIG. 9, a first upper electrode layer may be formed on a surface of the dielectric layer 80.

In example embodiments, the first upper electrode layer may partially fill the fifth and sixth openings 21 and 27 and may fill a remaining portion of the seventh opening 73.

The first upper electrode layer may include a metal nitride, e.g., titanium nitride, tantalum nitride, etc., or a metal, e.g., titanium, tantalum, etc.

The first upper electrode layer may be patterned to form a first upper electrode 90, and the dielectric layer 80 and the first and second support patterns 32 and 34 under the first upper electrode 90 may be partially removed to expose an upper surface of an edge portion of the conductive pad 10.

A second upper electrode layer may be formed on the conductive pad 10 to cover the first upper electrode 90, the dielectric layer 80 and the first and second support patterns 32 and 34, and a portion of the second upper electrode layer on the upper surface of the conductive pad 10 may be partially removed to form a second upper electrode 95. The second upper electrode 95 may fill remaining portions of the fifth and sixth openings 21 and 27.

The second upper electrode 95 may include, e.g., silicon-germanium doped with p-type impurities.

The first and second lower electrodes 50 and 55, the dielectric layer 80, the first and second upper electrodes 90 and 95 and the support structure on the conductive pad 10 may form a capacitor structure, and each of the plurality of first and second lower electrodes 50 and 55 arranged in the honeycomb pattern or the rectangular lattice pattern, and portions of the dielectric layer 80 and the first and second upper electrodes 90 and 95 corresponding thereto may be referred to as a capacitor 97.

Accordingly, the capacitor structure may include a plurality of capacitors 97 arranged in the first and second directions D1 and D2 on each conductive pad 10, and the capacitors 97 on each conductive pad 10 may share the dielectric layer 80 and the first and second upper electrodes 90 and 95.

Further, the capacitor structures on a pair of conductive pads 10, respectively, neighboring in the second direction D2 may share the dielectric layer 80 and the first and second upper electrodes 90 and 95.

Likewise, the capacitor structures including the plurality of capacitors 97 on the pair of conductive pads 10 and the support structure may form a decoupling capacitor structure.

The first and second support patterns 32 and 34 included in the support structure may be formed on a central sidewall and an upper sidewall of the first and second lower electrodes 50 and 55 on each conductive pad 10, which may have a shape of a plate except for the seventh opening 73. In example embodiments, the support structure may connect the capacitor structures on the conductive pads 10 neighboring in the second direction D2.

The support structure may include both of the first and second support patterns 32 and 34, however, the inventive concept may not be limited thereto, and may include only one of the first and second support patterns 32 and 34.

Figure 11:
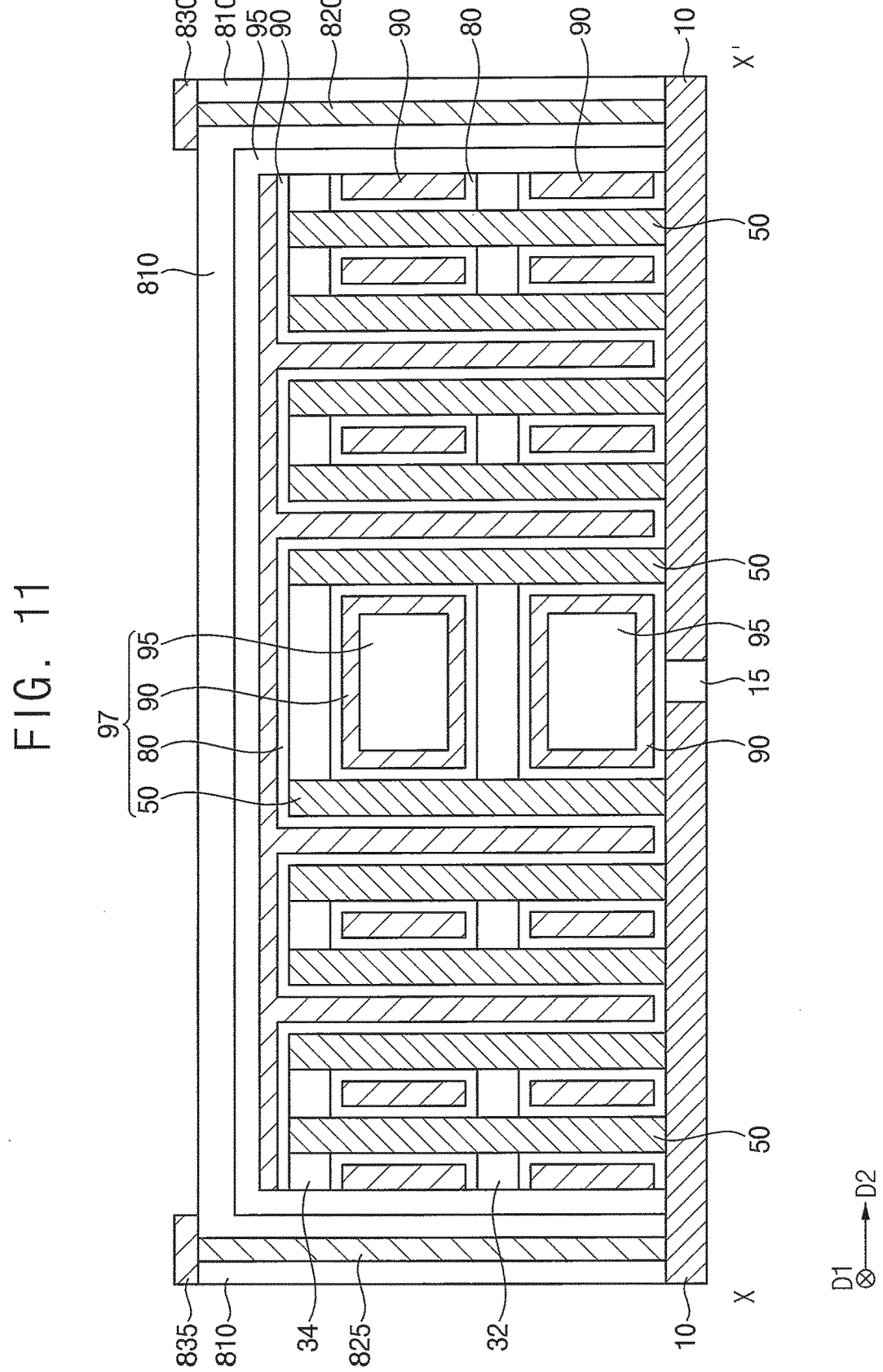

Referring to FIG. 11, an insulating interlayer 810 may be formed on the conductive pads 10 and the second upper electrode 95, first and second contact plugs 820 and 825 may be formed through the insulating interlayer 810 to contact upper surfaces of the pair of conductive pads 10, respectively, and first and second wirings 830 and 835 may be formed to contact upper surfaces of the first and second contact plugs 820 and 825, respectively.

The insulating interlayer 810 may include an oxide, e.g., silicon oxide or a low-k dielectric material, and the first and second contact plugs 820 and 825 and the first and second wirings 830 and 835 may include, e.g., a metal, a metal nitride, a metal silicide, etc.

In example embodiments, source voltage and a ground voltage may be applied to the first and second wirings 830 and 835, respectively.

Upper insulating interlayers and upper wirings may be further formed on the insulating interlayer 810 and the first and second wirings 830 and 835.

The decoupling capacitor structure may include the support structure contacting the sidewalls of the first and second lower electrodes 50 and 55 and connecting the first and second lower electrodes 50 and 55 to each other, which may be strong against external impact. Thus, the decoupling capacitor structure including the support structure may have a stable structure.

The decoupling capacitor structure may have following structural characteristics.

The decoupling capacitor structure may include the insulating division pattern 15 extending in the first direction D1 on the substrate; the conductive pads (first conductive pad and second conductive pad) 10 at opposite sides, respectively, of the insulating division pattern 15 in the second direction D2 on the substrate; the lower electrodes 50 and 55 spaced apart from each other in the horizontal direction on each conductive pad 10; the support structure 32 and 34 contacting the sidewalls of the lower electrodes 50 and 55 and connecting the lower electrodes 50 and 55 to each other; the dielectric layer 80 on the surfaces of the lower electrodes 50 and 55 and the support structure 32 and 34; and the upper electrode structure 90 and 95 on the surface of the dielectric layer 80.

In example embodiments, the lower electrodes 50 and 55 may include the second lower electrodes 55 arranged in the first direction D1 adjacent to the insulating division pattern

15, and the first lower electrodes 50 spaced apart from the second lower electrodes 55 in the horizontal direction.

In example embodiments, the support structure 32 and 34 may have the seventh opening 73, which may be formed (or defined) between ones of the first lower electrodes 50 neighboring in the horizontal direction and may be formed neither between the second lower electrodes 55 nor between each of the second lower electrodes 55 and one of the first lower electrodes 50 adjacent thereto.

In example embodiments, the second width W2 of each of the second lower electrodes 55 may be greater than the first width W1 of at least one of the first lower electrodes 50, e.g., one of the first lower electrodes 50 that is disposed on a central portion of the conductive pad 10.

In example embodiments, the seventh opening 73 may be disposed between three or four first lower electrodes 50 neighboring in the horizontal direction.

In example embodiments, a plurality of seventh openings 73 may be spaced apart from each other in the horizontal direction, and first ones of the seventh openings 73 that are adjacent to the second lower electrodes 55 have widths greater than those of second ones of the seventh openings 73 that are spaced apart from the first ones of the seventh openings 73.

In example embodiments, the seventh opening 73 may have a shape of a portion of an ellipse in a plan view, and the ellipse may have minor and major axes in the first and second directions D1 and D2, respectively.

In example embodiments, the support structure 32 and 34 may include the first support pattern 32 contacting the central sidewalls of the first and second lower electrodes 50 and 55 and the second support pattern 34 contacting the upper sidewalls of the first and second lower electrodes 50 and 55.

In example embodiments, the dielectric layer 80 and the upper electrode structure 90 and 95 may be formed in the seventh opening 73.

In example embodiments, the upper electrode structure 90 and 95 may include the first upper electrode 90 on the surface of the dielectric layer 80 and a second upper electrode 95 on the surface of the first upper electrode 90.

In example embodiments, the support structure 32 and 34 may commonly contacts the sidewalls of the first and second lower electrodes 50 and 55 on the conductive pads 10 and may connect the first and second lower electrodes 50 and 55 on the conductive pads 10 to each other.

In example embodiments, the first and second wirings 830 and 835 may be formed on and electrically connected to the conductive pads 10, respectively, and a source voltage and a ground voltage may be applied to the first and second wirings 830 and 835, respectively.

Figure 12:
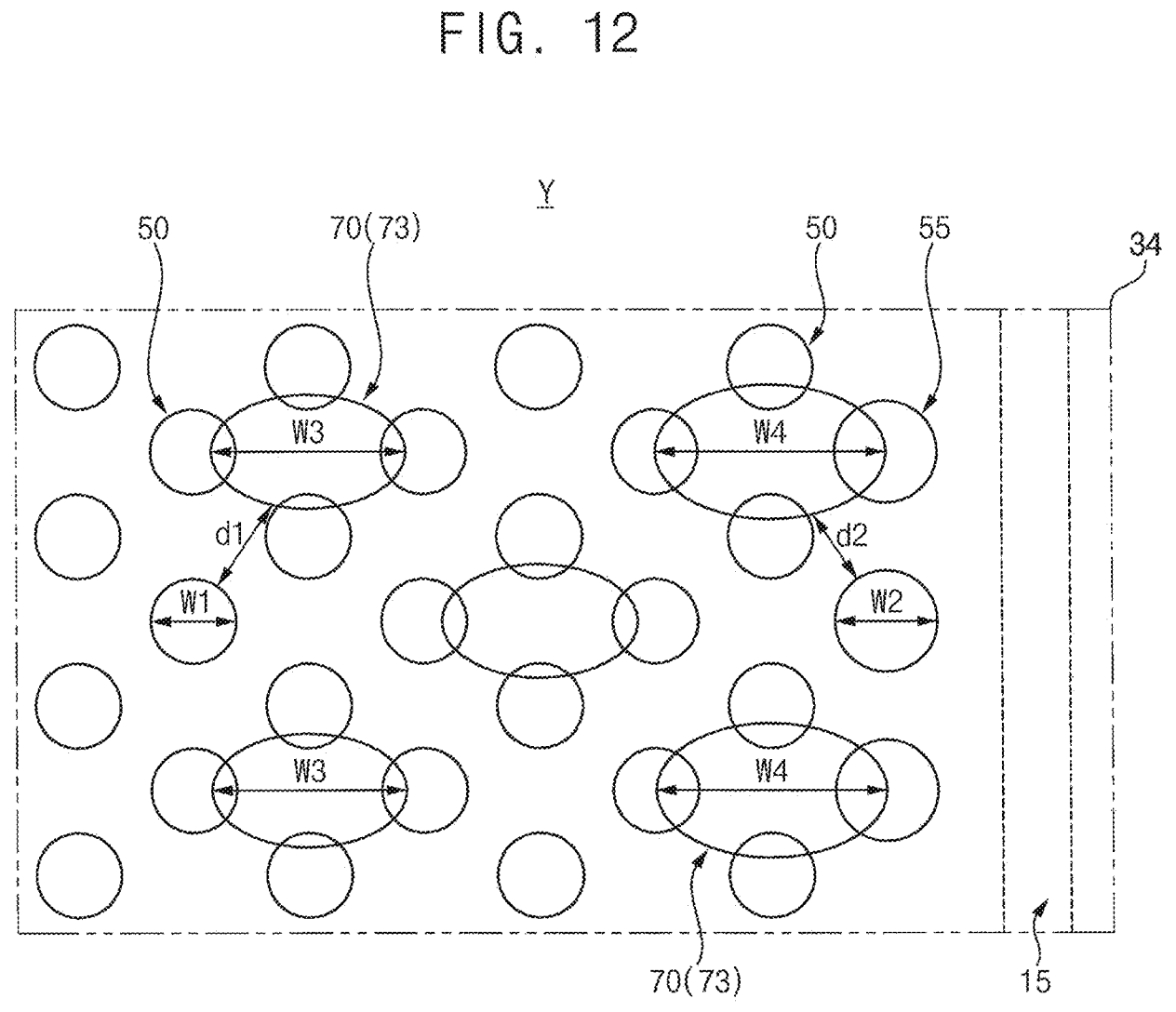
Figure 13:
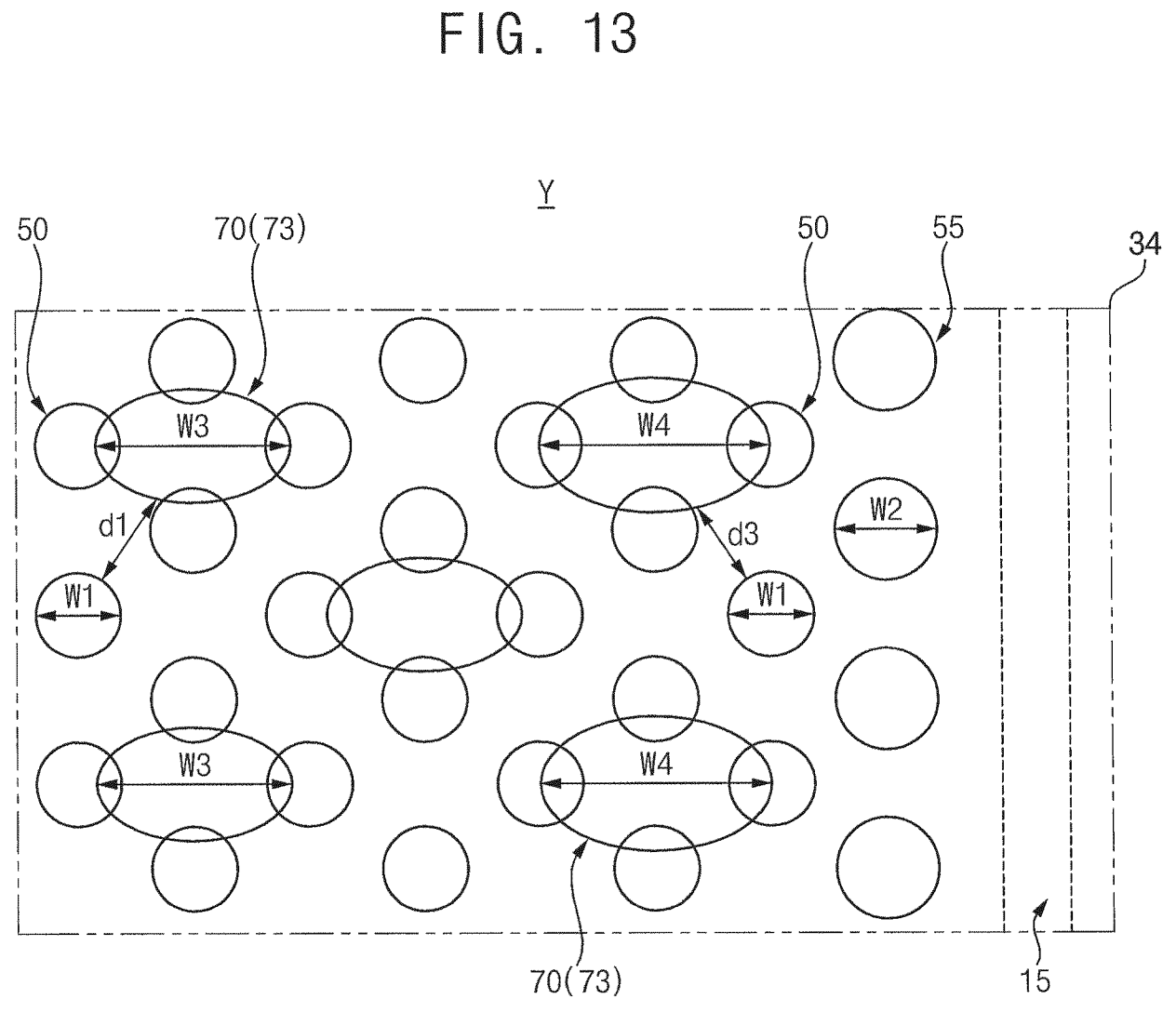

FIGS. 12 and 13 are plan views illustrating a support structure of a decoupling capacitor structure in a comparative embodiment and the support structure of the decoupling capacitor structure in accordance with example embodiments.

FIGS. 12 and 13 are drawings of region Yin FIG. 6, and show only the first and second lower electrodes 50 and 55, the second support pattern 34, the fourth and seventh openings 70 and 73 and the insulating division pattern 15.

Referring to FIGS. 12 and 13, the support structure including the first and second support patterns 32 and 34 may be formed in order to prevent the first and second lower electrodes 50 and 55 included in the decoupling capacitor structure from collapsing. The first and second support patterns 32 and 34 may be formed by forming the first and second support layers 30 and 35 and partially removing the first and second support layers 30 and 35 by an etching process using the etching mask 60 having the fourth opening 70 therein.

The second width W2 of ones of the second lower electrodes 55 on an edge portion of the conductive pad 10 may be greater than the first width W1 of ones of the second lower electrodes 55 on a central portion of the conductive pad 10, and likewise, a fourth width W4 of ones of the fourth openings 70 on the edge portion of the conductive pad 10 may be greater than a third width W3 of ones of the fourth openings 70 on the central portion of the conductive pad 10.

Referring to FIG. 12, in the decoupling capacitor structure in the comparative embodiment, the fourth openings 70 may partially expose some of the second lower electrodes 55 on the edge portion of the conductive pad 10, and a second distance d2 between a first one of the fourth openings 70 or the seventh openings 73 on the edge portion of the conductive pad 10 and one of the second lower electrodes 55 that is not exposed by the fourth and seventh openings 70 and 73 and is adjacent to the first one of the fourth openings 70 or the seventh openings 73 may be less than a first distance d1 between a second one of the fourth openings 70 or the seventh openings 73 on the central portion of the conductive pad 10 and one of the second lower electrodes 55 that is not exposed by the fourth and seventh openings 70 and 73 and is adjacent to the second one of the fourth openings 70 or the seventh openings 73. Thus, if the support structure is attacked from the outside, cracks may be generated between the first one of the fourth openings 70 or the seventh openings 73 on the edge portion of the conductive pad 10 and the one of the second lower electrodes 55 adjacent thereto.

However, referring to FIG. 13, in the decoupling capacitor structure in example embodiments, the fourth openings 70 may not expose ones of the second lower electrodes 55 on the edge portion of the conductive pad 10, and may partially expose ones of the second lower electrodes 55 on the central portion of the conductive pad 10.

Thus, even though a third distance d3 between a third one of the fourth openings 70 or the seventh openings 73 on the edge portion of the conductive pad 10 and one of the second lower electrodes 55 that is not exposed by the fourth and seventh openings 70 and 73 and is adjacent to the third one of the fourth openings 70 or the seventh openings 73 is less than the first distance d1 between the second one of the fourth openings 70 or the seventh openings 73 on the central portion of the conductive pad 10 and one of the second lower electrodes 55 that is not exposed by the fourth and seventh openings 70 and 73 and is adjacent to the second one of the fourth openings 70 or the seventh openings 73, the third distance d3 may be greater than the second distance d2 shown in FIG. 12. Thus, even if the support structure is attacked from the outside, the cracks generated between the third one of the fourth openings 70 or the seventh openings 73 on the edge portion of the conductive pad 10 and the one of the second lower electrodes 55 adjacent thereto may decrease.

FIGS. 14 to 18 are plan views illustrating layouts of the second lower electrodes and the fourth openings 70 for forming and the support structure included in the decoupling capacitor structure in accordance with example embodiments, which may correspond to FIG. 6.

Figure 14:
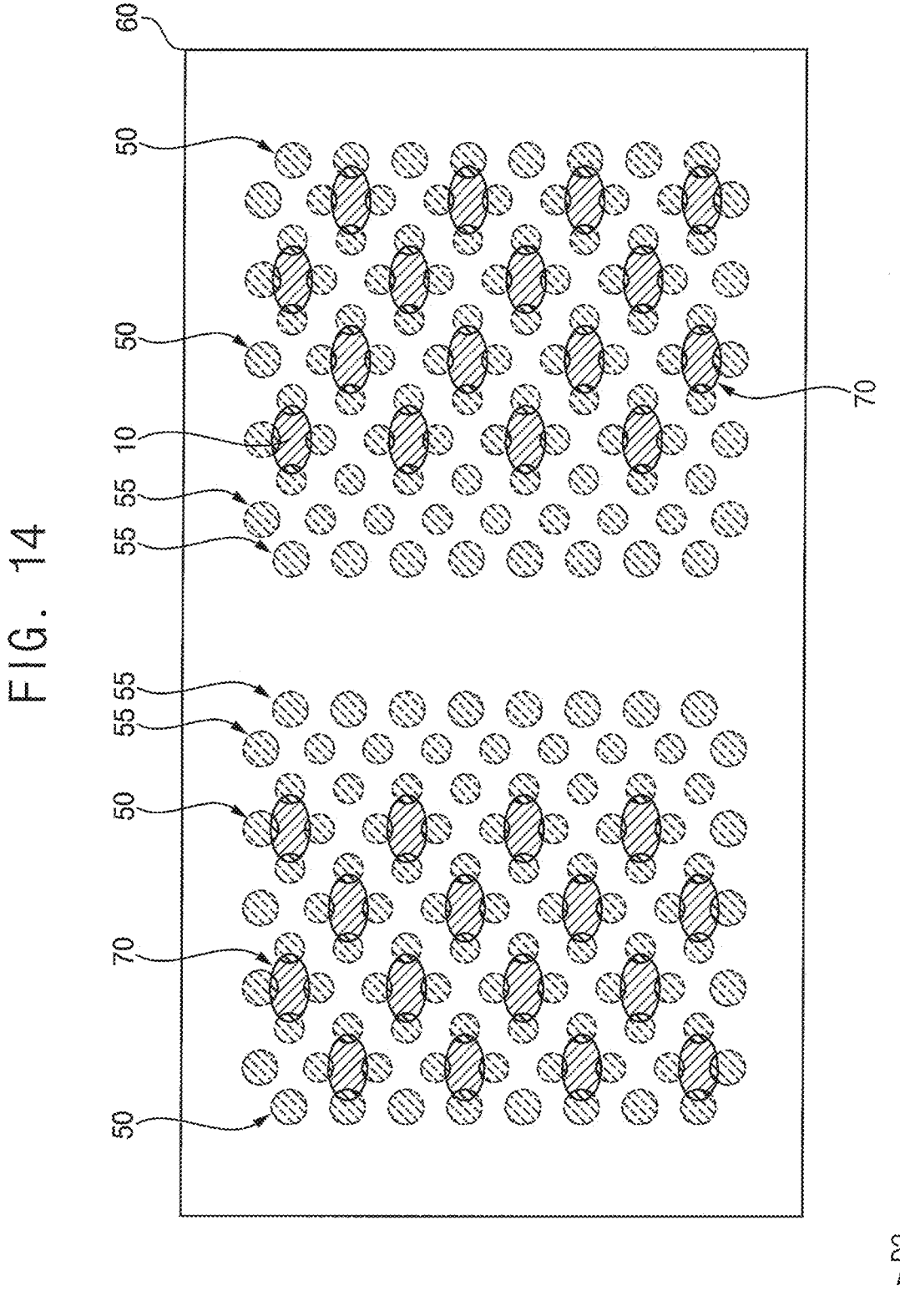
FIGS. 14 to 18 are plan views illustrating layouts of the second lower electrodes and the fourth openings 70 for forming and the support structure included in the decoupling capacitor structure in accordance with example embodiments, which may correspond to FIG. 6.

Referring to FIG. 14, the second lower electrodes 55 may be arranged in two columns spaced apart from each other in the second direction D2 at an area adjacent to the insulating division pattern 15 on the conductive pad 10, and the second lower electrodes 55 may be spaced apart from each other in the first direction D1 in each column. The second lower electrodes 55 in the two columns may form first and second groups, respectively.

When compared to the second lower electrodes 55 shown in FIG. 6, one more column including the second lower electrode 55 is added on the area adjacent to the insulating division pattern 15. Thus, the fourth openings 70 for forming the support structure may be closer to the central portion of the conductive pad 10 than the fourth openings 70 is in FIG. 6, so that the cracks of the support structure may decrease.

Figure 15:
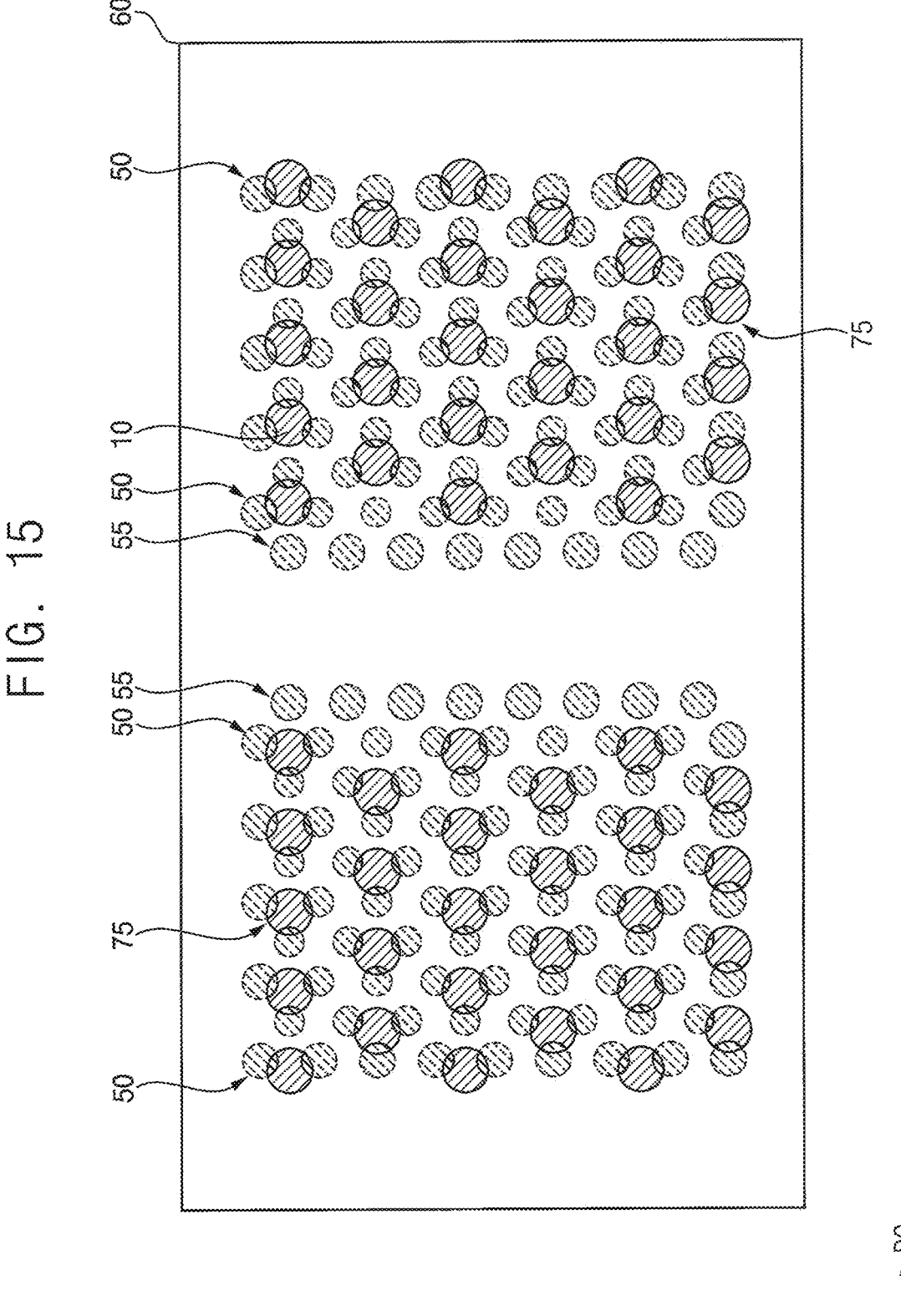

Referring to FIG. 15, the fourth opening 70 may partially expose 3 first lower electrodes 50 neighboring in the horizontal direction, or 2 first lower electrodes 50 neighboring in the horizontal direction on the edge portion of the conductive pad 10. In example embodiments, the fourth opening 70 may have a shape of a circle in a plan view.

Figure 16:
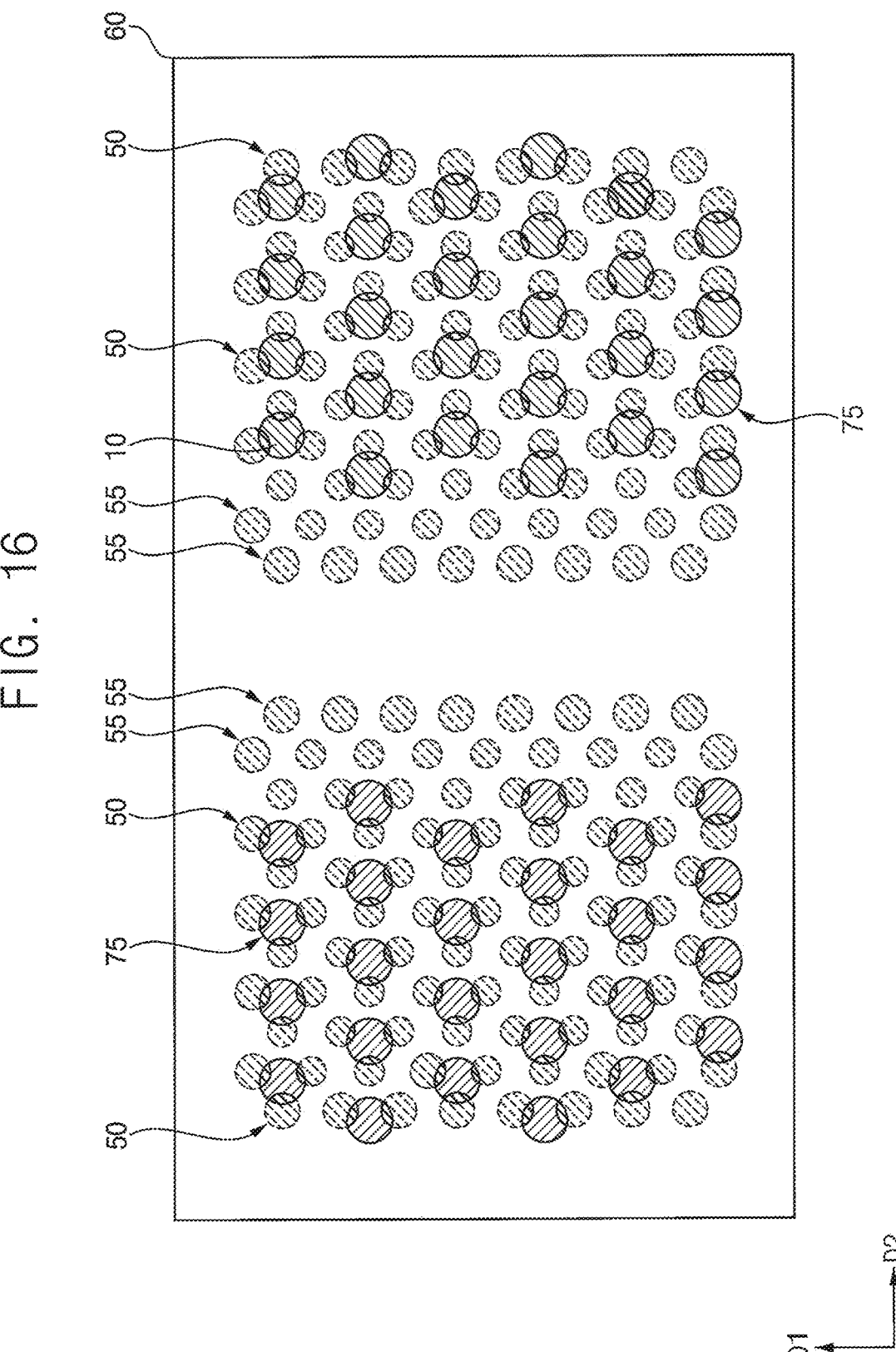

Referring to FIG. 16, when compared to the second lower electrodes 55 shown in FIG. 15, one more column including the second lower electrode 55 is added on the area adjacent to the insulating division pattern 15.

Figure 17:
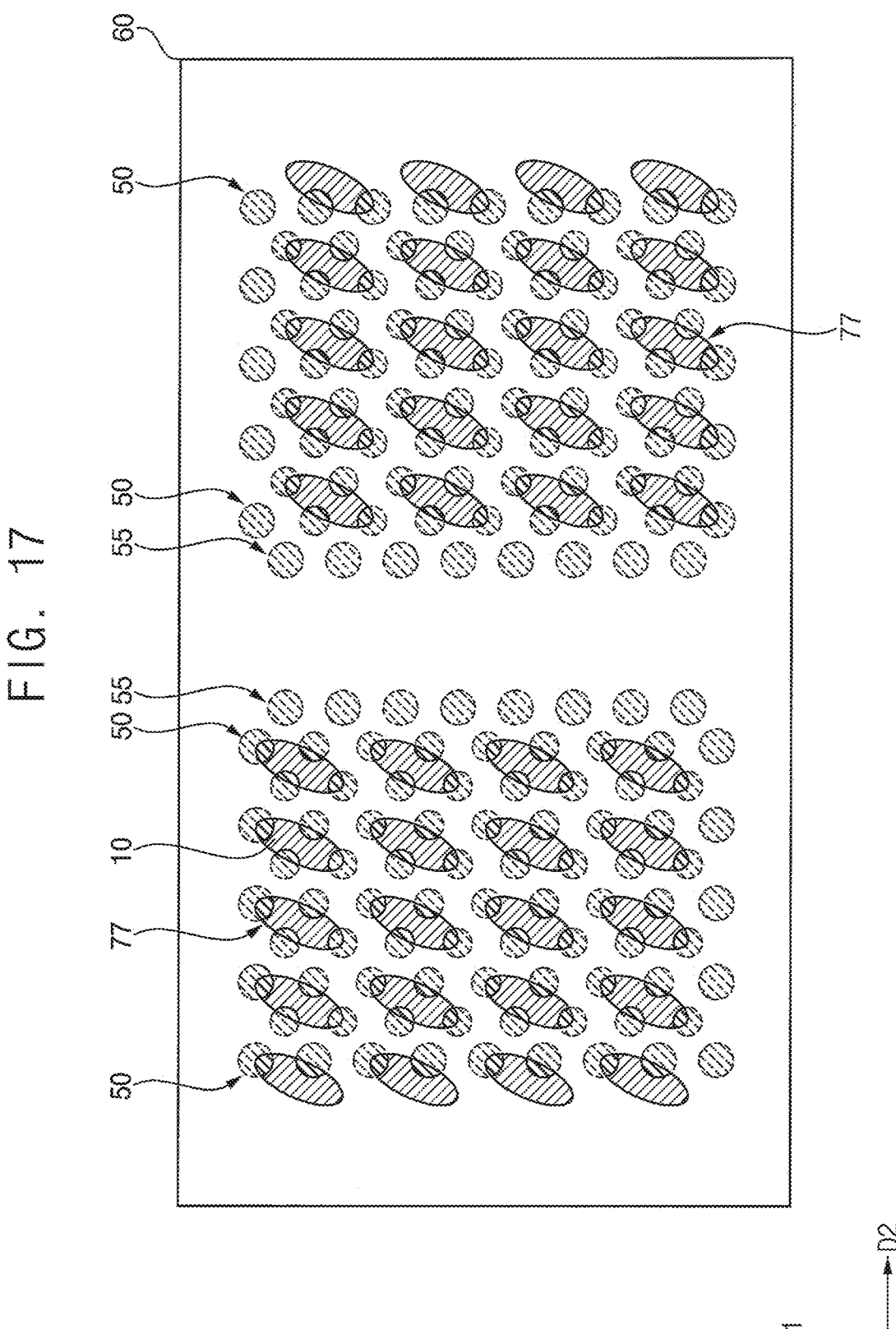

Referring to FIG. 17, the fourth opening 70 may partially expose 4 first lower electrodes 50 neighboring in the horizontal direction, or two first lower electrodes 50 neighboring in the horizontal direction on the edge portion of the conductive pad 10.

In example embodiments, the fourth opening 70 may have a shape of an ellipse in a plan view and may have minor and major axes in two directions, respectively, having acute angles with respect to the first and second directions D1 and D2, respectively.

Figure 18:
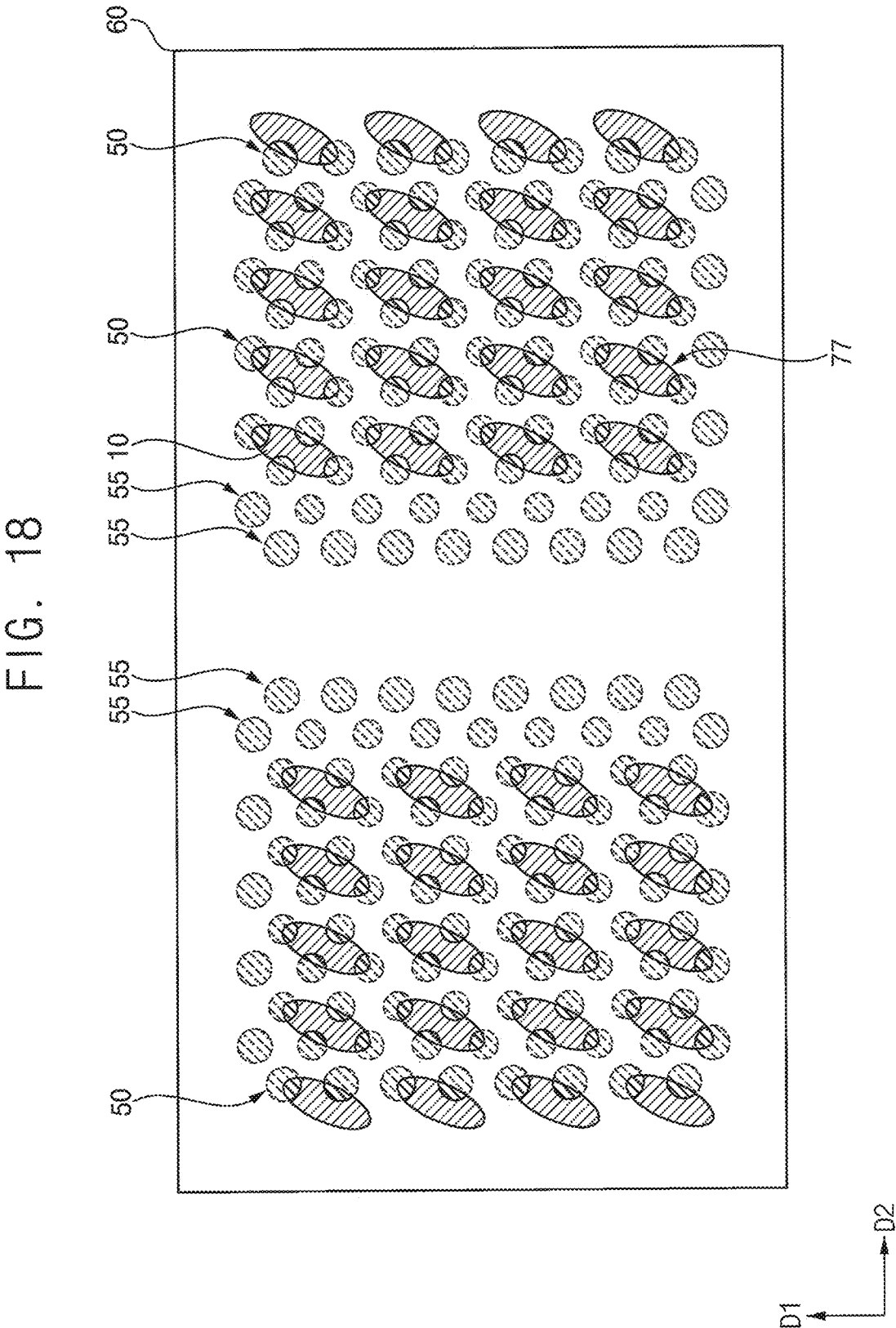

Referring to FIG. 18, when compared to the second lower electrodes 55 shown in FIG. 17, one more column including the second lower electrode 55 is added on the area adjacent to the insulating division pattern 15.

In some embodiments, the fourth opening 70 may have the minor and major axes in the first and second directions D1 and D2, respectively.

Figure 19:
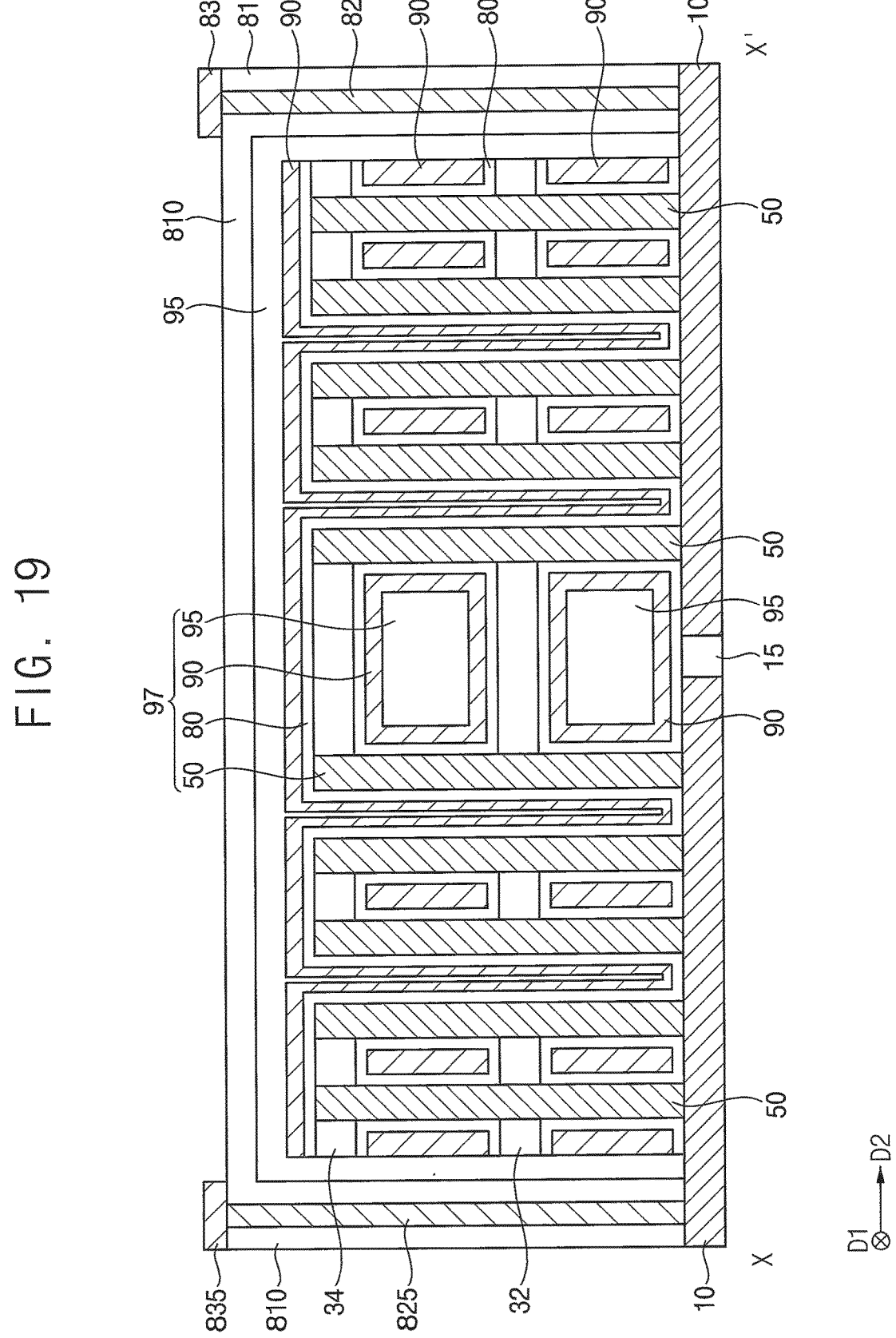
FIGS. 19 and 20 are cross-sectional views illustrating decoupling capacitor structures in accordance with example embodiments.
Figure 20:
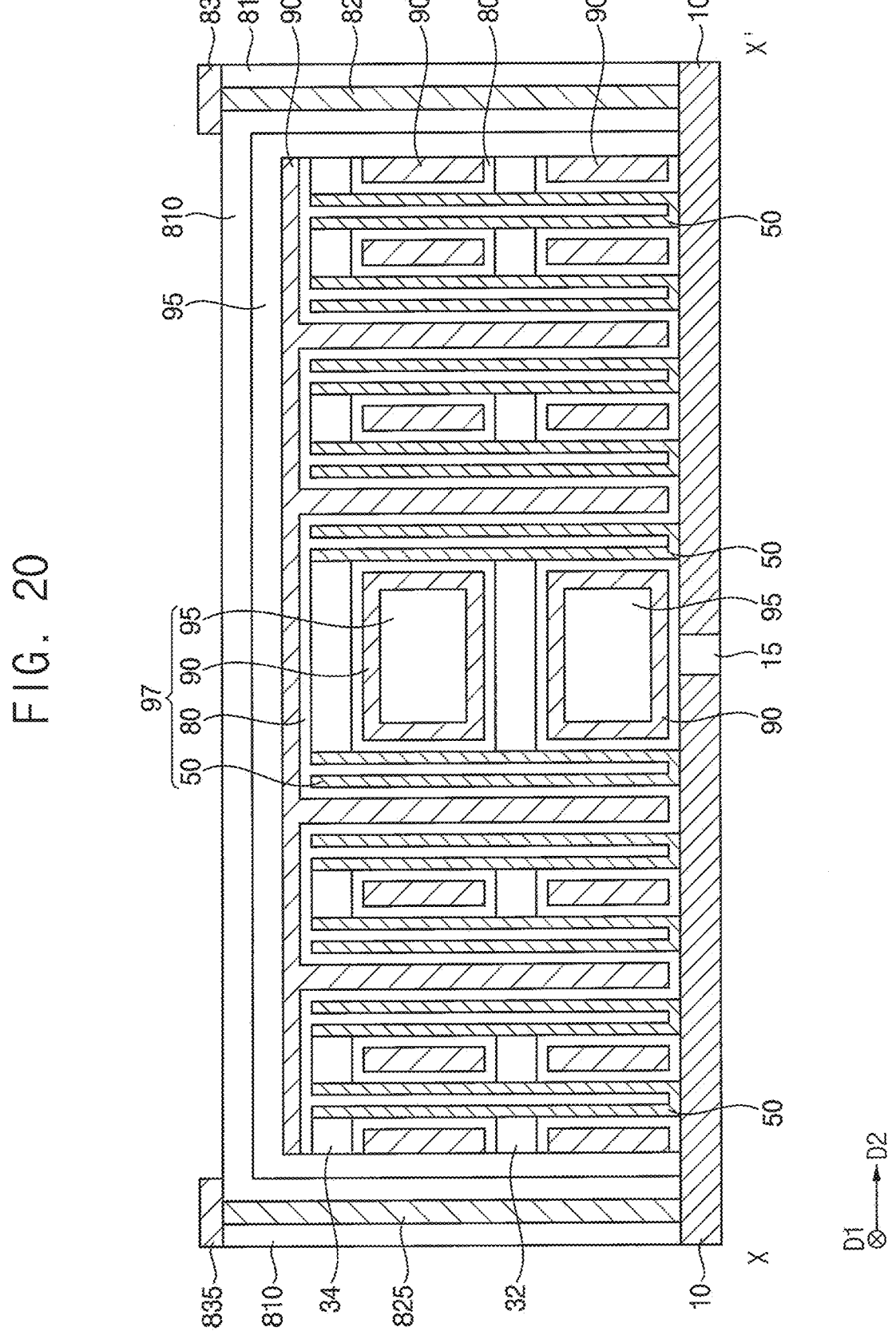

FIGS. 19 and 20 are cross-sectional views illustrating decoupling capacitor structures in accordance with example embodiments.

Referring to FIG. 19, not only the dielectric layer 80 and the first upper electrode 90 but also the second upper electrode 95 may be formed in the seventh opening 73.

Referring to FIG. 20, each of the first and second lower electrodes 50 and 55 may have a shape of a hollow cylinder with a closed bottom, or a cup shape.

Thus, the dielectric layer 80 may be formed not only on upper surfaces and outer sidewalls of the first and second lower electrodes 50 and 55 but also on inner sidewalls thereof.

FIGS. 21 to 60 are plan views and cross-sectional views illustrating a method of manufacturing a semiconductor device according to example embodiments. Specifically, FIGS. 21, 24, 29, 33, 40, 44, 49 and 55 are the plan views, FIGS. 22, 25, 27, 30, 32, 34, 36, 38, 41, 45-46, 50 and 56 are cross-sectional views taken along lines A-A' of corresponding plan views, respectively, each of FIGS. 23, 26, 28, 31, 35, 37, 39, 42-43, 47, 51, 53, 57 and 59 includes cross-sections taken along lines B-B' and C-C' of a corresponding plan view, and FIGS. 48, 52, 54, 58 and 60 are cross-sectional views taken along lines D-D' of corresponding plan views, respectively.

This method is the application of the method of forming the decoupling capacitor structure illustrated with reference to FIGS. 1 to 20 to a DRAM device. Thus, repeated explanations of the formation of the decoupling capacitor structure are omitted herein.

Hereinafter, in the specification (and not necessarily in the claims), two directions substantially parallel to an upper surface of a substrate 100 and substantially perpendicular to each other may be referred to as first and second directions D1 and D2, respectively, and a direction substantially parallel to the upper surface of the substrate 100 and having an acute angle with respect to the first and second directions D1 and D2 may be referred to as a third direction D3.

Figure 21:
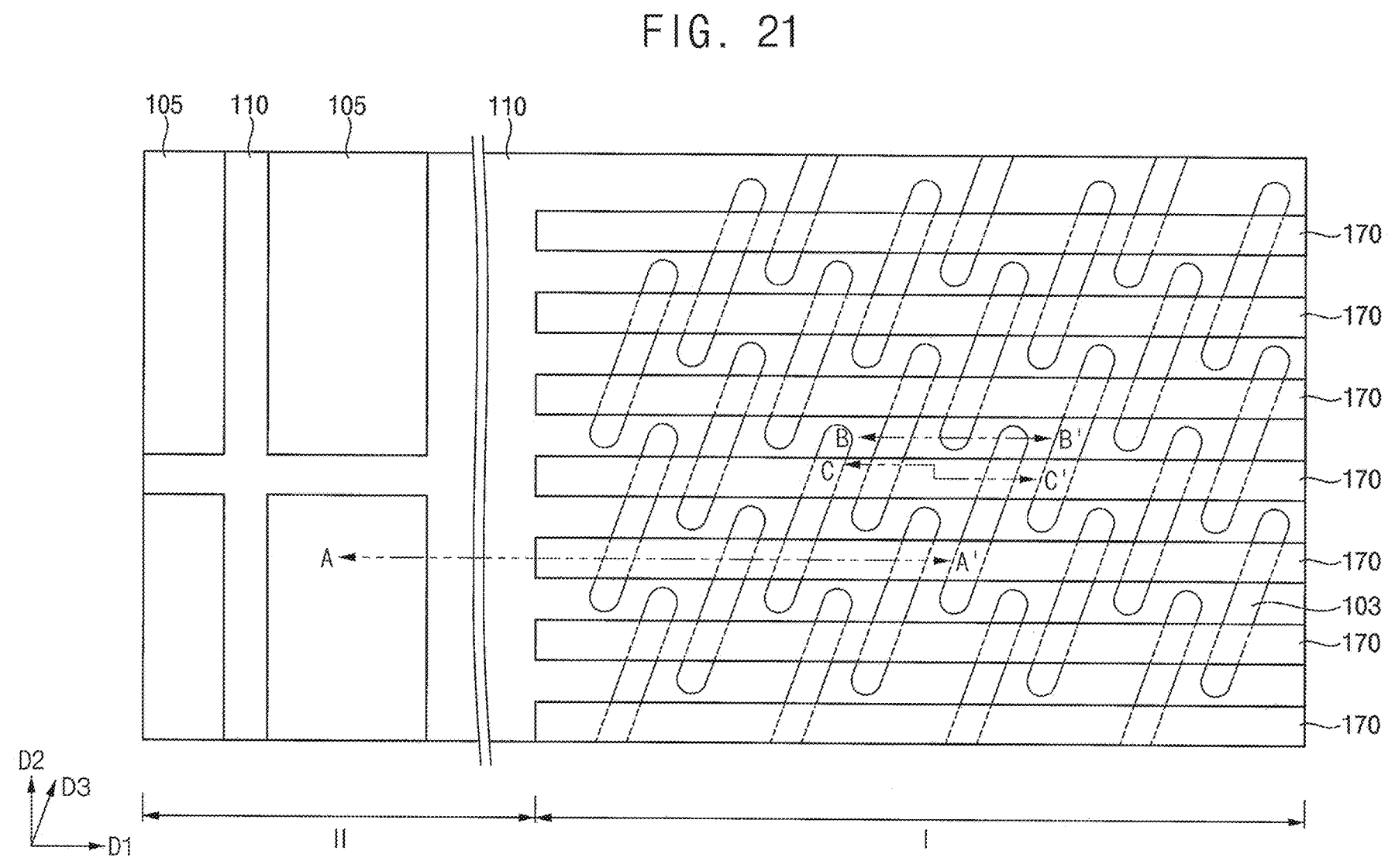
Figure 22:
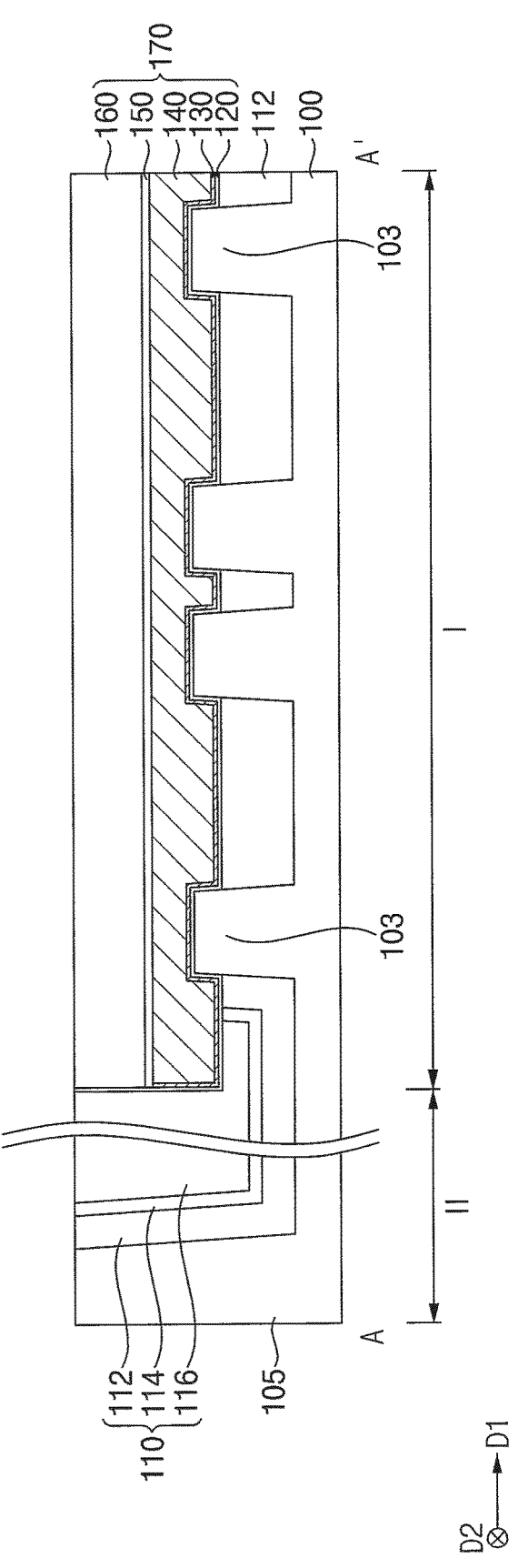
Figure 23:
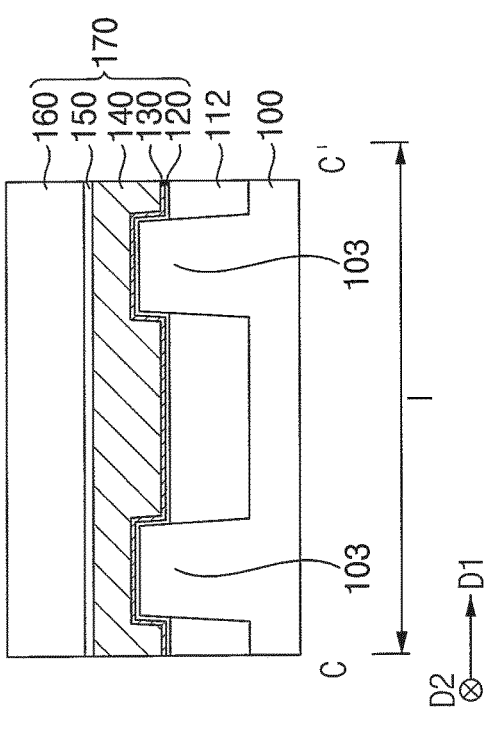
Figure 23:
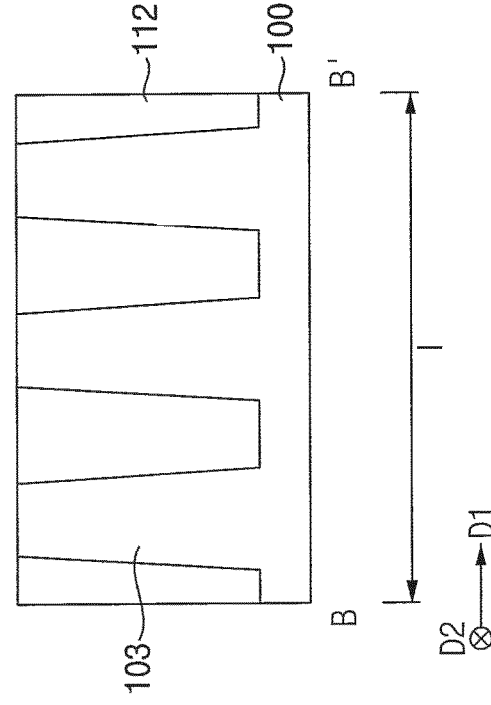

Referring to FIGS. 21 to 23, first and second active patterns 103 and 105 may be formed on the substrate 100 including first and second regions I and II, and an isolation pattern structure 110 may be formed to cover sidewalls of the first and second active patterns 103 and 105.

The substrate 100 may include silicon, germanium, silicon-germanium, or a III-V group compound semiconductor, such as GaP, GaAs, or GaSb. In example embodiments, the substrate 100 may be a silicon-on-insulator (SOI) substrate or a germanium-on-insulator (GOI) substrate.

The first region I of the substrate 100 may be a cell region on which memory cells are formed, and the second region II of the substrate 100 surrounding the first region I of the substrate 100 may be a peripheral circuit region on which peripheral circuit patterns for driving the memory cells are formed.

The first and second active patterns 103 and 105 may be formed by removing an upper portion of the substrate 100 to form a first recess. The first active pattern 103 may extend in the third direction D3, and a plurality of first active patterns 103 may be spaced apart from each other in each of the first and second directions D1 and D2. Additionally, a plurality of second active patterns 105 may be spaced apart from each other in each of the first and second directions D1 and D2, and FIG. 1 shows some of the second active patterns 105.

The isolation pattern structure 110 may include first to third isolation patterns 112, 114 and 116 sequentially stacked on an inner wall of the first recess. A portion of the first recess in the first region I of the substrate 100 may have a relatively small width, and thus only the first isolation pattern 112 may be formed in the portion of the first recess. However, a portion of the first recess in the second region II or between the first and second regions I and II of the substrate 100 may have a relatively large width, and thus all of the first to third isolation patterns 112, 114 and 116 may be formed in the portion of the first recess.

The first and third isolation patterns 112 and 116 may have an oxide, e.g., silicon oxide, and the second isolation pattern 114 may include a nitride, e.g., silicon nitride.

The first active pattern 103 and the isolation pattern structure 110 in the first region I of the substrate 100 may be partially removed to form a second recess extending in the first direction D1.

A first gate structure 170 may be formed in the second recess. The first gate structure 170 may include a first gate insulation pattern 120 on a bottom and a sidewall of the second recess, a first barrier pattern 130 on a portion of the first gate insulation pattern 120 on the bottom and a lower sidewall of the second recess, a first conductive pattern 140 on the first barrier pattern 130 and filling a lower portion of the second recess, a second conductive pattern 150 on the first barrier pattern 130 and the first conductive pattern 140, and a first gate mask 160 on an upper surface of the second conductive pattern 150 and an upper inner sidewall of the first gate insulation pattern 120 and filling an upper portion of the second recess. The first barrier pattern 130, the first conductive pattern 140 and the second conductive pattern 150 may form a first gate electrode.

The first gate insulation pattern 120 may include an oxide, e.g., silicon oxide, the first barrier pattern 130 may include a metal nitride, e.g., titanium nitride, tantalum nitride, etc., the first conductive pattern 140 may include a metal, a metal nitride, a metal silicide, doped polysilicon, etc., the second conductive pattern 150 may include doped polysilicon, and the first gate mask 160 may include a nitride, e.g., silicon nitride.

Alternatively, the first gate structure 170 may not include the first barrier pattern 130, but may include the first gate insulation pattern 120, the first conductive pattern 140, the second conductive pattern 150 and the first gate mask 160. In this case, the first conductive pattern 140 may include a metal nitride, e.g., titanium nitride.

In example embodiments, the first gate structure 170 may extend in the first direction D1 on the first region I of the substrate 100, and a plurality of first gate structures 170 may be spaced apart from each other in the second direction D2. End portions in the first direction D1 of the first gate structures 170 may be aligned with each other in the second direction D2.

Figure 24:
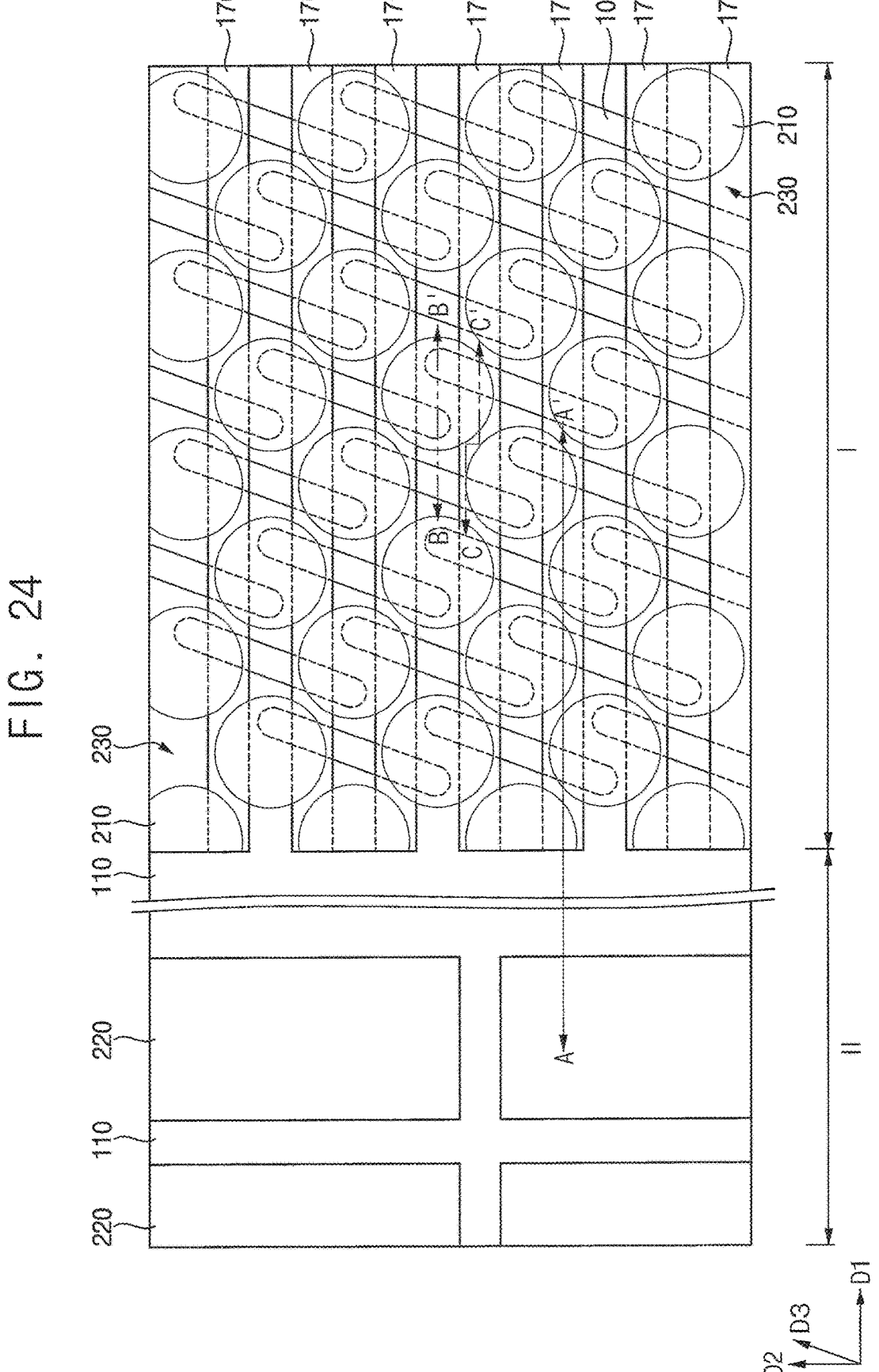
Figure 25:
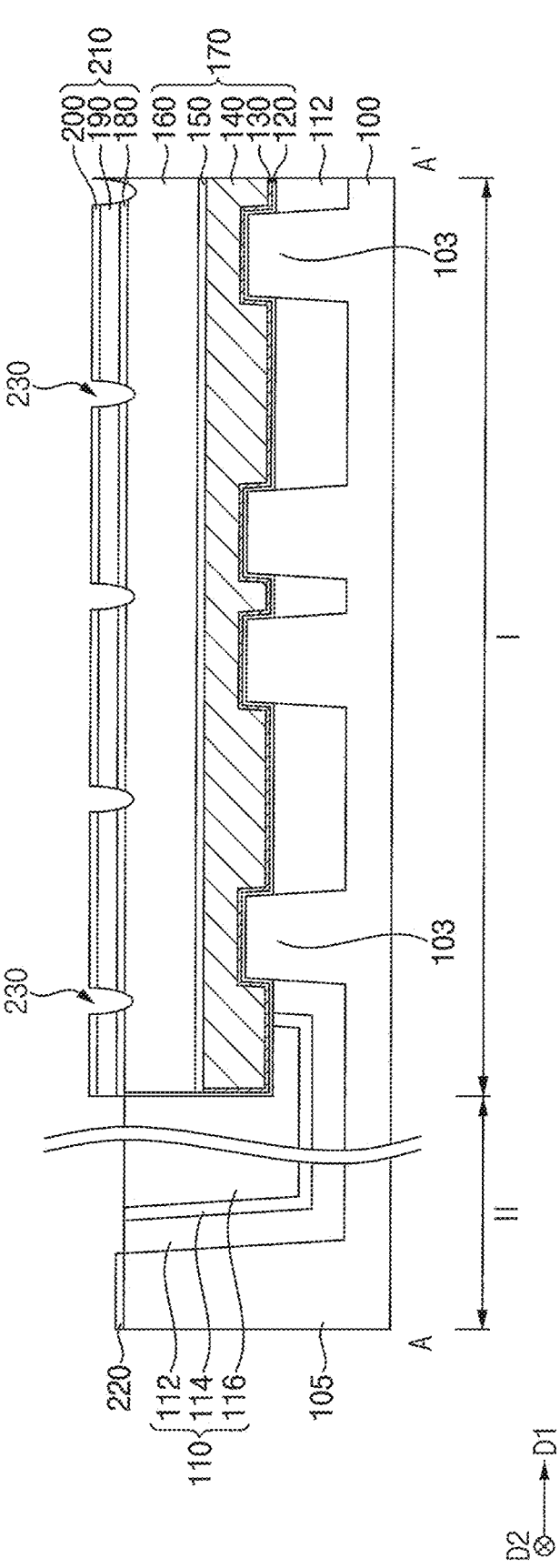
Figure 26:
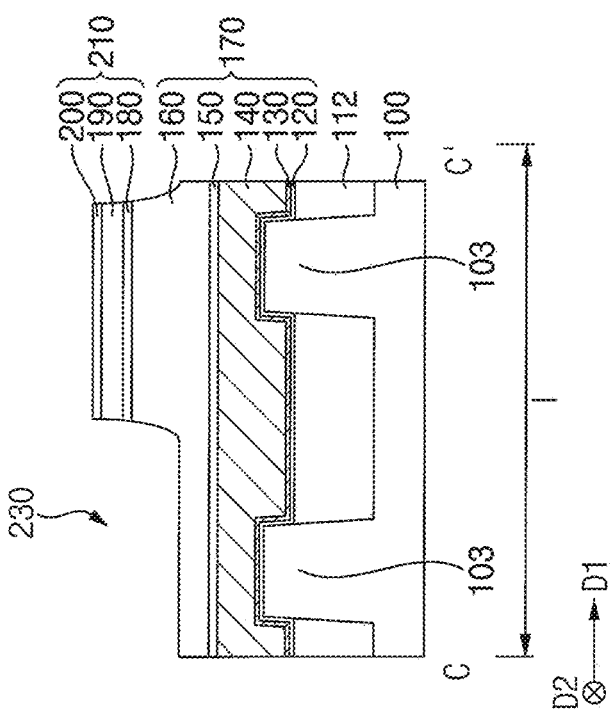
Figure 26:
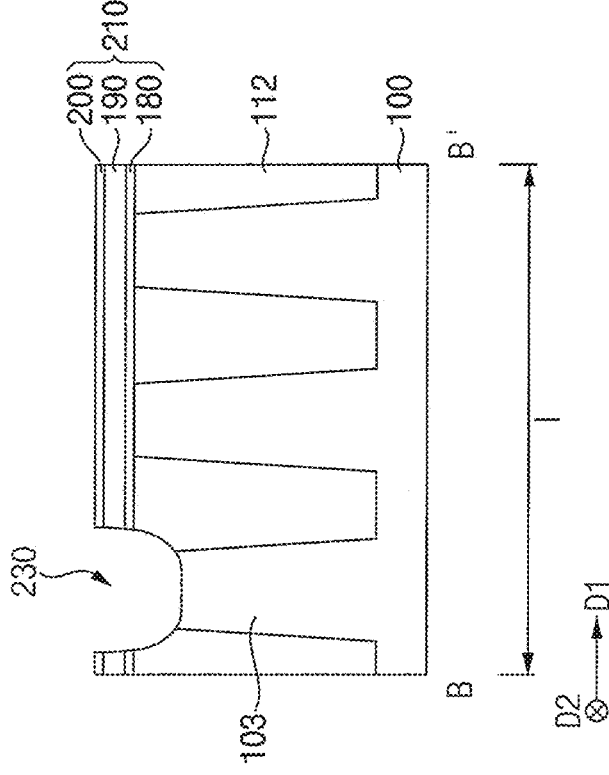

Referring to FIGS. 24 to 26, an insulation layer structure 210 may be formed on the first and second regions I and II of the substrate 100, a portion of the insulation layer structure 210 on the second region II of the substrate 100 may be removed, and, e.g., a thermal oxidation process may be performed on the second active pattern 105 on the second region II of the substrate 100 to form a second gate insulation layer 220.

The insulation layer structure 210 may include first to third insulation layers 180, 190 and 200 sequentially stacked. The first and third insulation layers 180 and 200 may include an oxide, e.g., silicon oxide, and the second insulation layer 190 may include a nitride, e.g., silicon nitride.

Alternatively, the second and third insulation layers 190 and 200 on the second region II of the substrate 100 among the insulation layer structure 210 may be removed, and the first insulation layer 180 remaining on the second region II of the substrate 100 may serve as a second gate insulation layer 220. In this case, the second gate insulation layer 220 may be formed not only on the second active pattern 105 but also on the isolation pattern structure 110 on the second region II of the substrate 100.

The insulation layer structure 210 may be patterned, and the first active pattern 103, the isolation pattern structure 110, and the first gate mask 160 of the first gate structure 170 may be partially etched using the patterned insulation layer structure 210 as an etching mask to form an eighth opening 230. In example embodiments, the patterned insulation layer structure 210 may have a shape of a circle or an ellipse in a plan view, and a plurality of insulation layer structures 210 may be spaced apart from each other in the first and second directions D1 and D2 on the first region I of the substrate 100. Each of the insulation layer structures 210 may overlap opposite end portions in the third direction D3 of the first active patterns 103 in a vertical direction substantially perpendicular to the upper surface of the substrate 100.

Figure 27:
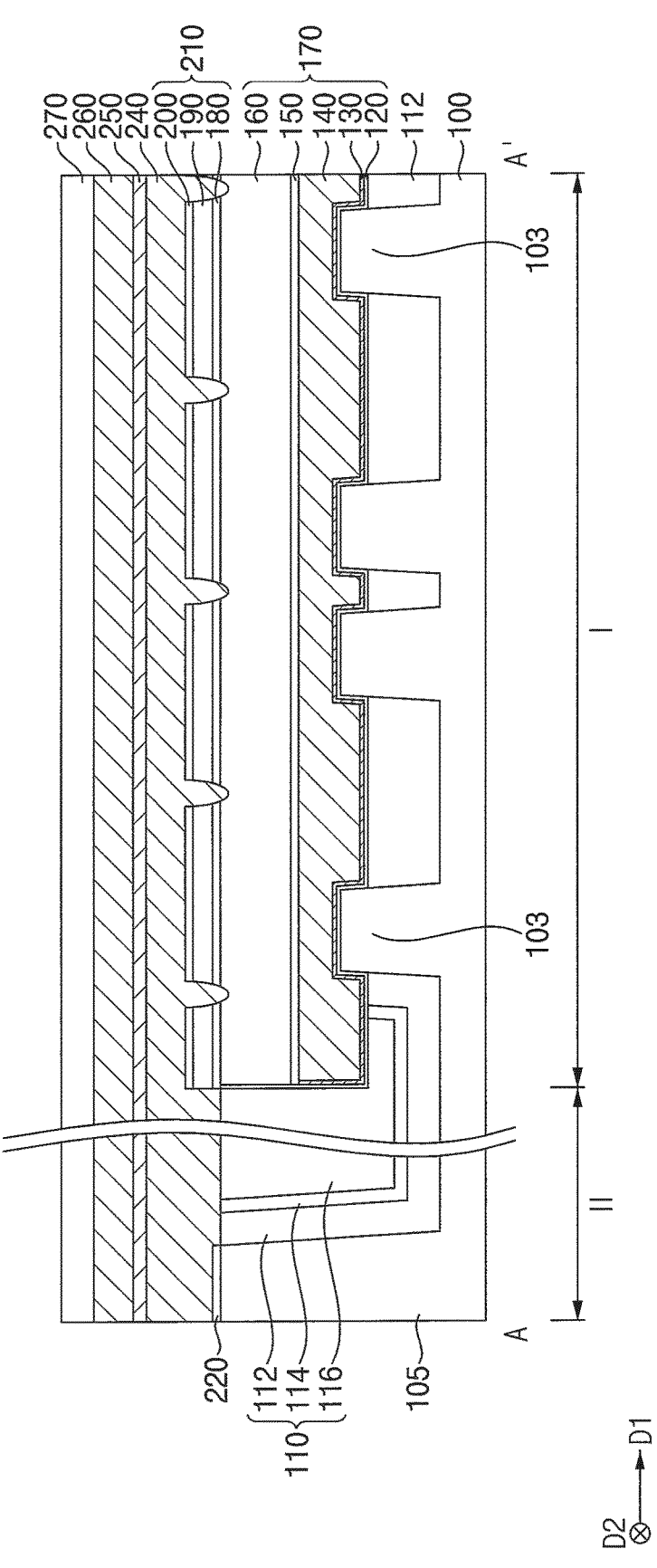
Figure 28:
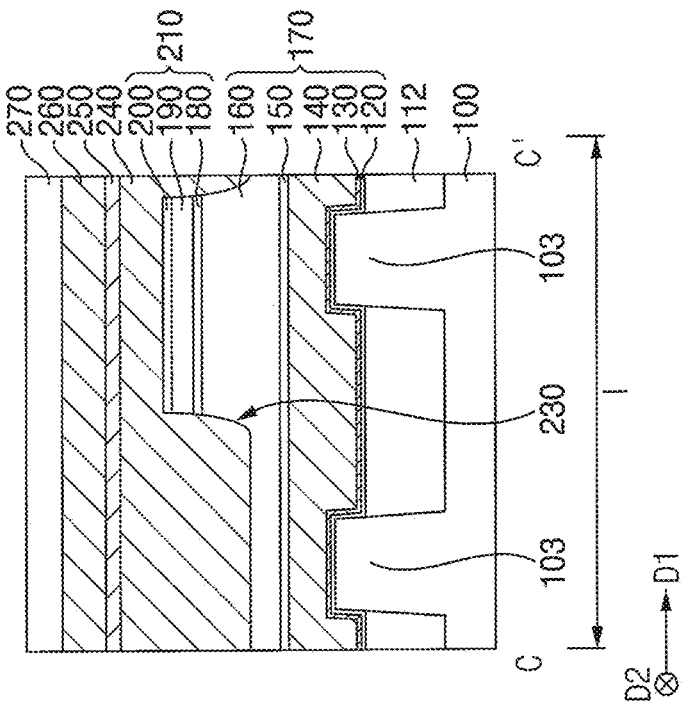
Figure 28:
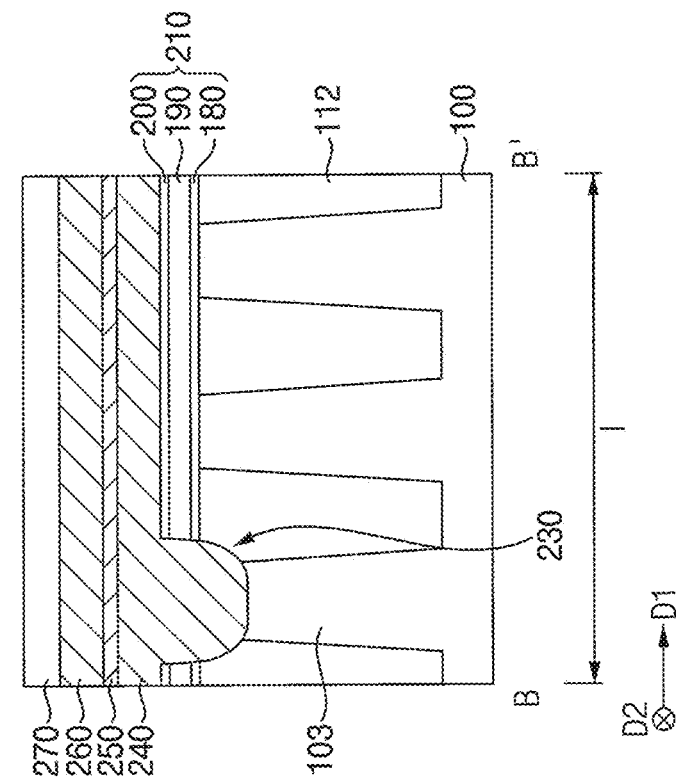

Referring to FIGS. 27 and 28, a third conductive layer 240, a second barrier layer 250, a fourth conductive layer 260 and a first mask layer 270 may be sequentially stacked on the insulation layer structure 210, the first active pattern 103 exposed by the eighth opening 230, the isolation pattern structure 110 and the first gate structure 170 on the first region I of the substrate 100, and the second gate insulation layer 220 and the isolation pattern structure 110 on the second region II of the substrate 100, which may form a conductive structure layer. The third conductive layer 240 may fill the eighth opening 230.

The third conductive layer 240 may include doped poly-silicon, the second barrier layer 250 may include a metal silicon nitride, e.g., titanium silicon nitride, the fourth conductive layer 260 may include a metal, e.g., tungsten, and the first mask layer 270 may include a nitride, e.g., silicon nitride.

Figure 29:
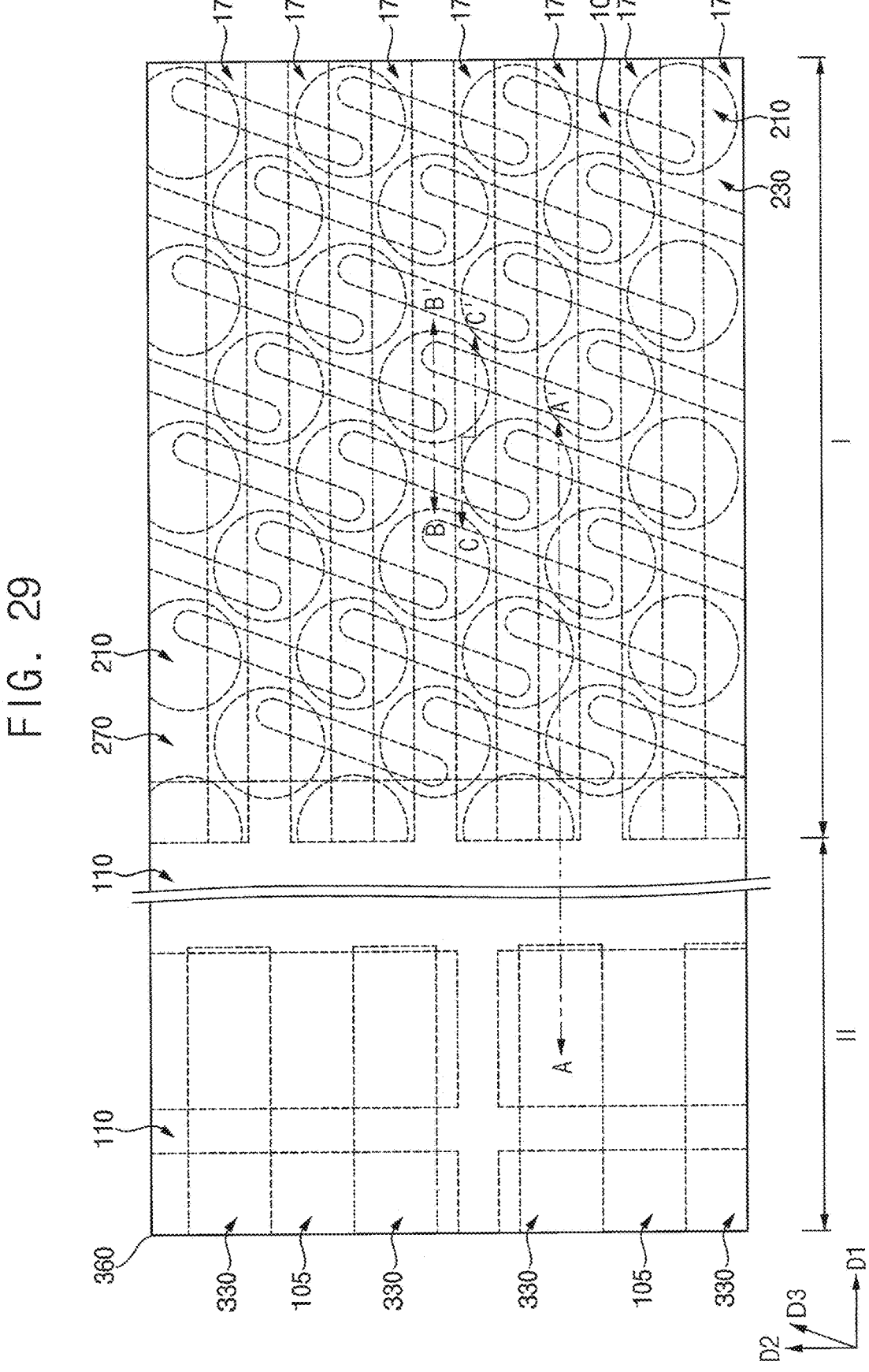
Figure 30:
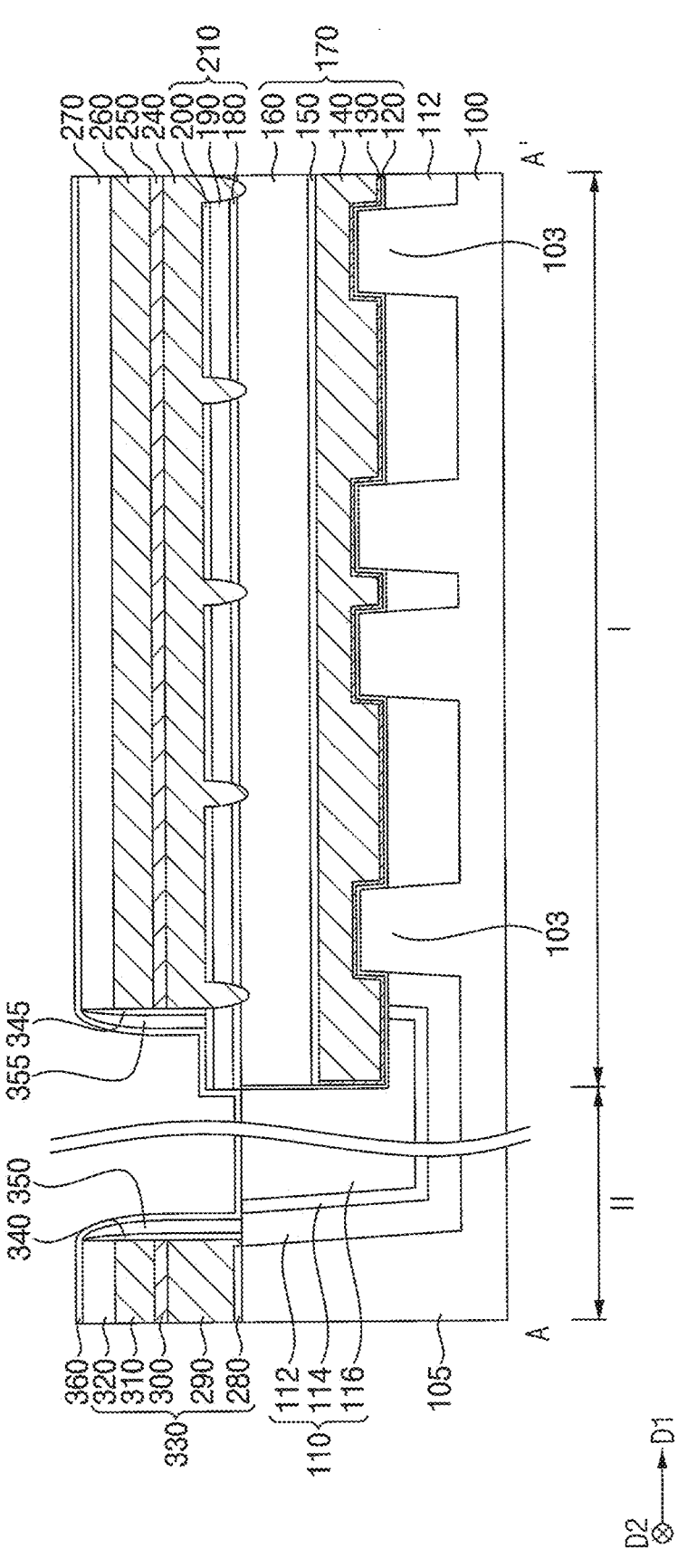
Figure 31:
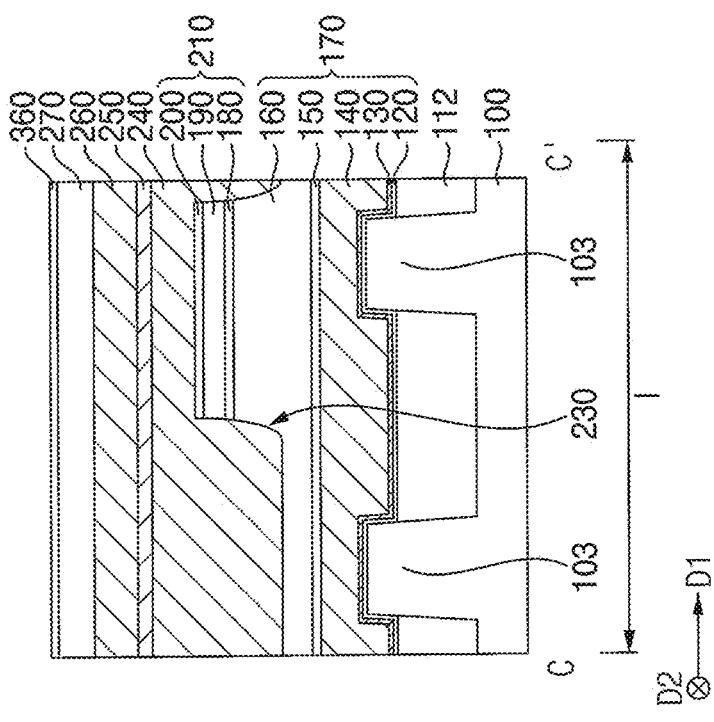
Figure 31:
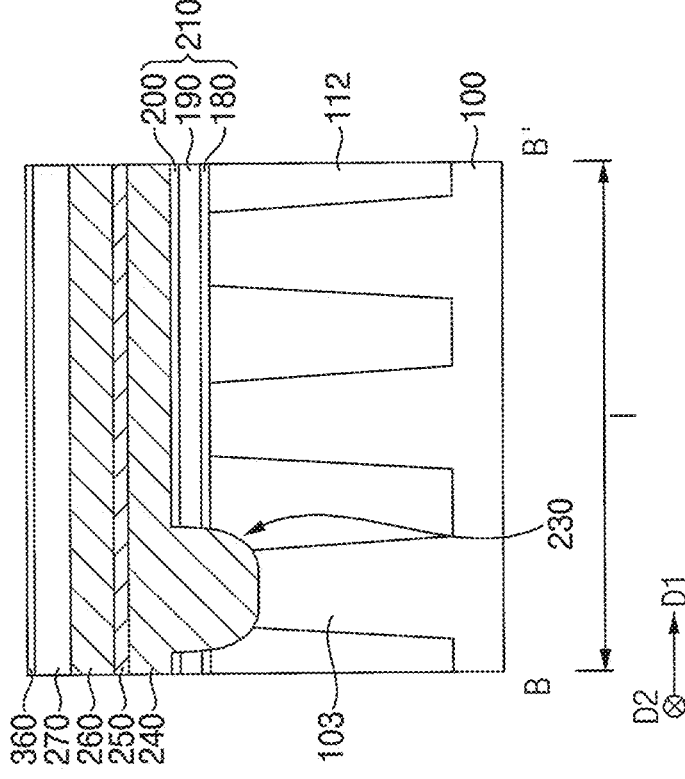

Referring to FIGS. 29 to 31, the conductive structure layer and the second gate insulation layer 220 may be patterned to form a second gate structure 330 on the second region II of the substrate 100.

The second gate structure 330 may include a second gate insulation pattern 280, a third conductive pattern 290, a second barrier pattern 300, a fourth conductive pattern 310 and a second gate mask 320 sequentially stacked in a vertical direction substantially perpendicular to an upper surface of the substrate 100, and the third conductive pattern 290, the second barrier pattern 300 and the fourth conductive pattern 310 may form a second gate electrode.

The second gate structure 330 may partially overlap the second active pattern 105 in the vertical direction on the second region II of the substrate 100. FIG. 29 shows 4 second gate structures 330, each of which may extend in the first direction D1, spaced apart from each other in the second direction D2, however, the inventive concept may not be limited thereto.

A portion of the conductive structure layer on an edge portion of the first region I of the substrate 100 adjacent to the second region II of the substrate 100 may also be removed, and thus the insulation layer structure 210, and upper surfaces of the first active pattern 103, the isolation pattern structure 110 and the first gate structure 170 exposed by the eighth opening 230 may also be partially exposed.

A first spacer structure may be formed on a sidewall of the second gate structure 330, and a second spacer structure may be formed on a sidewall of the conductive structure layer remaining on the first region I of the substrate 100. The first spacer structure may include first and third spacers 340 and 350 stacked on the sidewall of the second gate structure 330 in a horizontal direction substantially parallel to the upper surface of the substrate 100, and the second spacer structure may include second and fourth spacers 345 and 355 stacked on the sidewall of the conductive structure layer in the horizontal direction.

The first and second spacers 340 and 345 may be formed by forming a first spacer layer on the substrate 100 to cover the conductive structure layer and the second gate structure 330 and anisotropically etching the first spacer layer. The third and fourth spacers 350 and 355 may be formed by forming a second spacer layer on the substrate 100 to cover the conductive structure layer, the second gate structure 330 and the first and second spacers 340 and 345 and anisotropically etching the second spacer layer.

The first and second spacers 340 and 345 may include a nitride, e.g., silicon nitride, and the third and fourth spacers 350 and 355 may include an oxide, e.g., silicon oxide.

However, the structure of the first and second spacer structures may not be limited thereto, and each of the first and second spacer structures may include a single spacer or more than two spacers sequentially stacked.

In example embodiments, impurities may be implanted into upper portions of the second active pattern 105 adjacent to the second gate structure 330 to form source/drain layers, and the second gate structure 330 and the source/drain layers may form a transistor. However, impurities may not be implanted into an upper portion of the second active pattern

105 adjacent to one or ones of the second gate structures 330, which may be a dummy gate structure not serving as a gate of a transistor. FIG. 29 shows only the dummy gate structure.

A first etch stop layer 360 may be formed on the substrate 100 to cover the conductive structure layer, the second gate structure 330, the first and second spacer structures, and the isolation pattern structure 110. The first etch stop layer 360 may include a nitride, e.g., silicon nitride.

Figure 32:
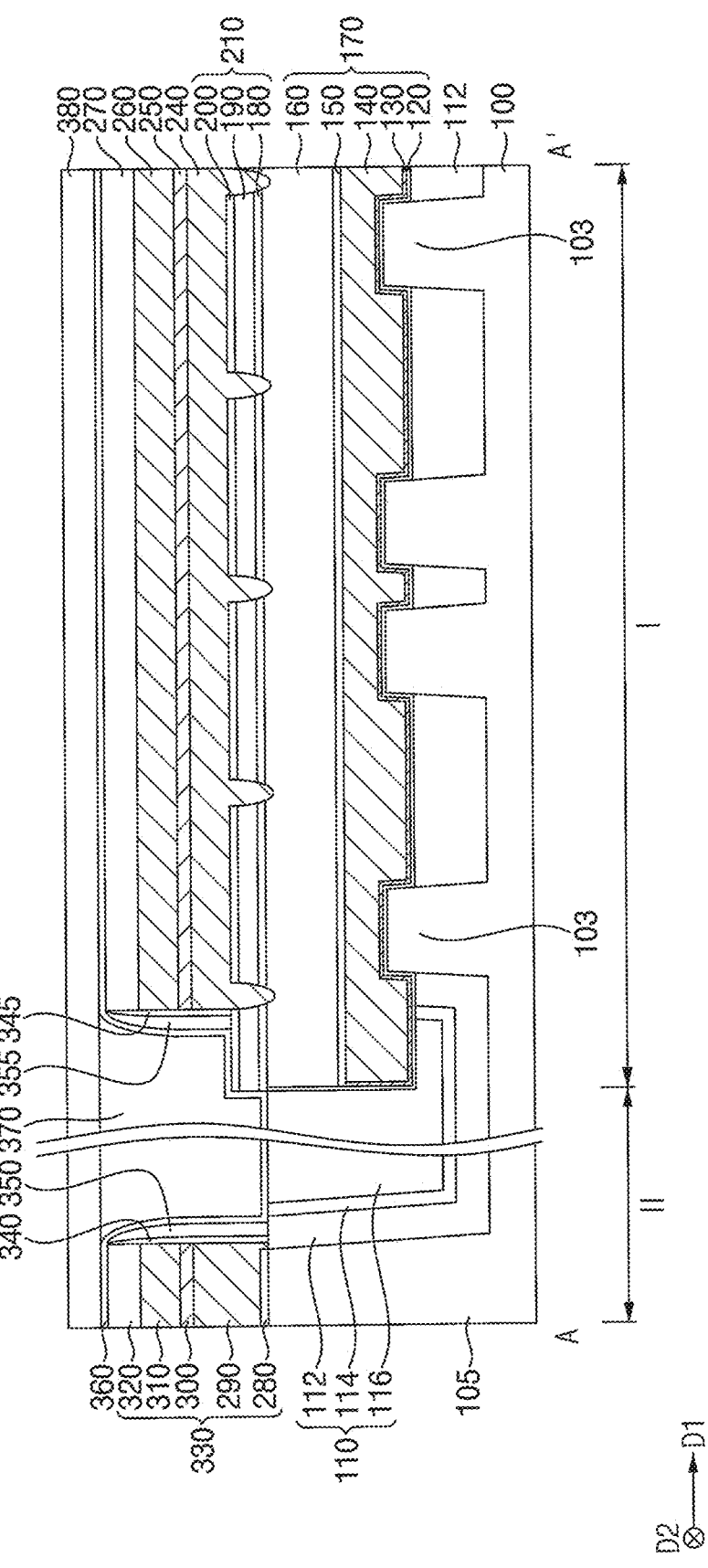

Referring to FIG. 32, a first insulating interlayer 370 may be formed on the first etch stop layer 360 to a sufficient height, and may be planarized until an upper surface of the second gate structure 330 and an upper surface of a portion of the first etch stop layer 360 on the conductive structure layer are exposed.

Thus, the first insulating interlayer 370 may fill a space between the first spacer structures on the sidewall of the second gate structures 330, and a space between the first spacer structure on the sidewall of the second gate structure 330 and the second spacer structure on the sidewall of the conductive structure layer.

The first insulating interlayer 370 may include an oxide, e.g., silicon oxide, and the first capping layer 380 may include a nitride, e.g., silicon nitride.

Figure 33:
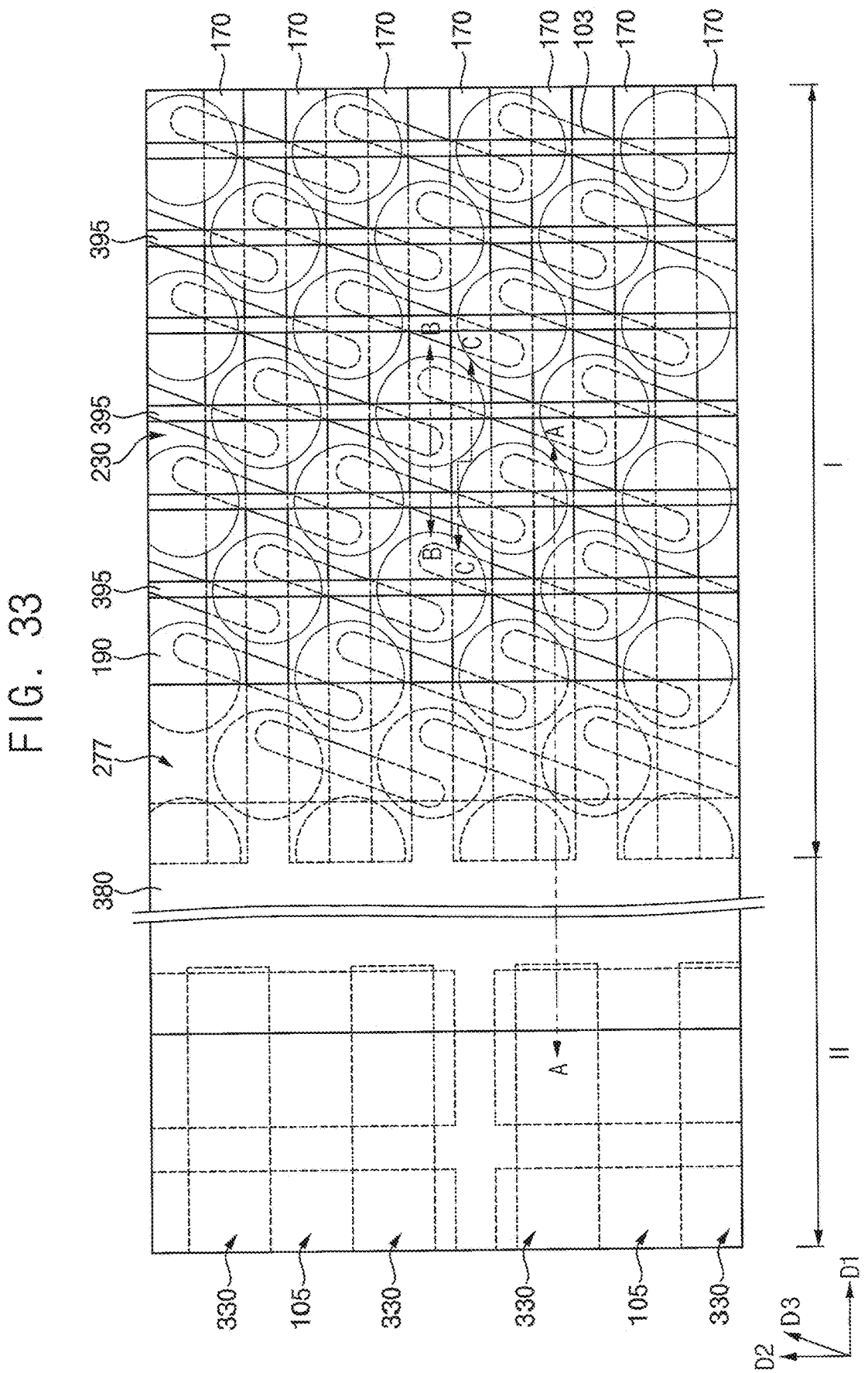
Figure 34:
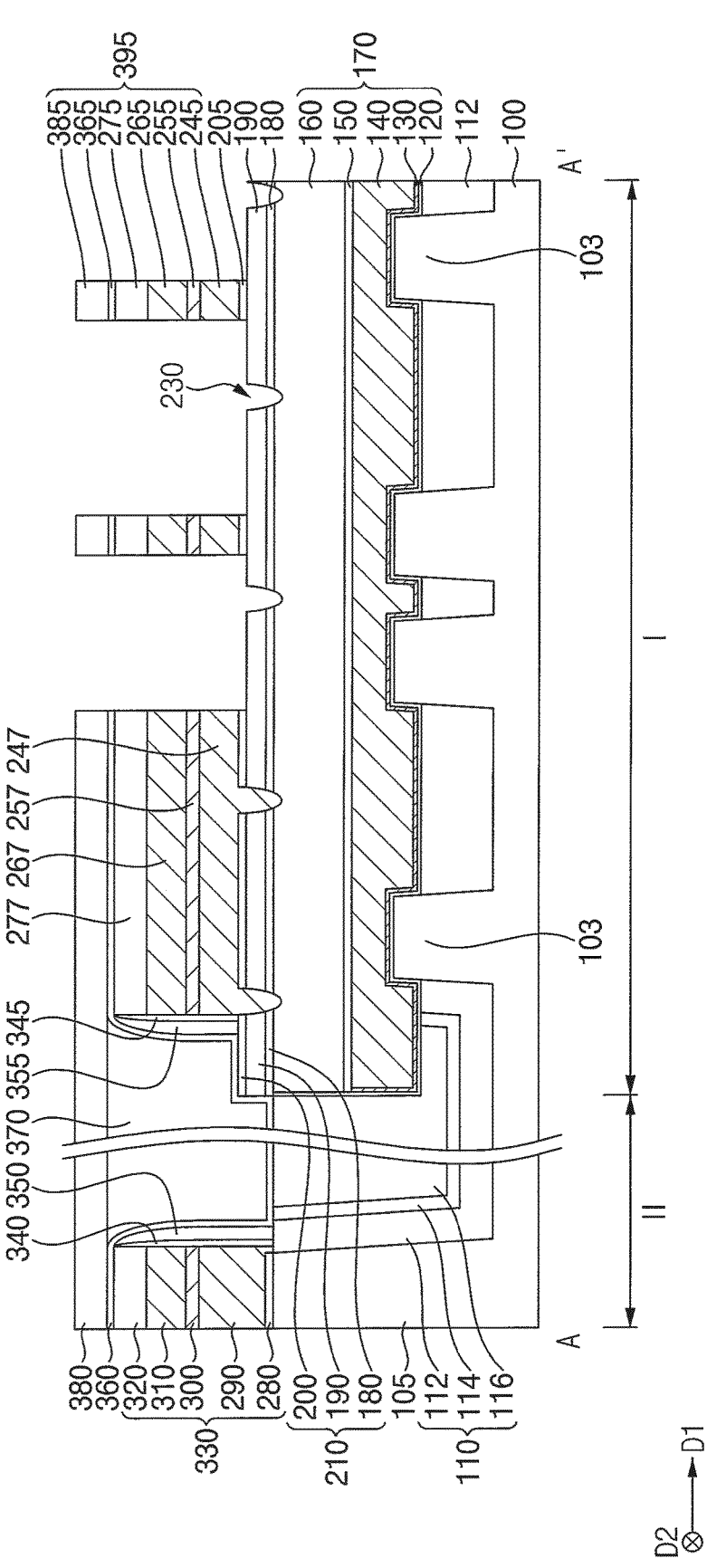
Figure 35:
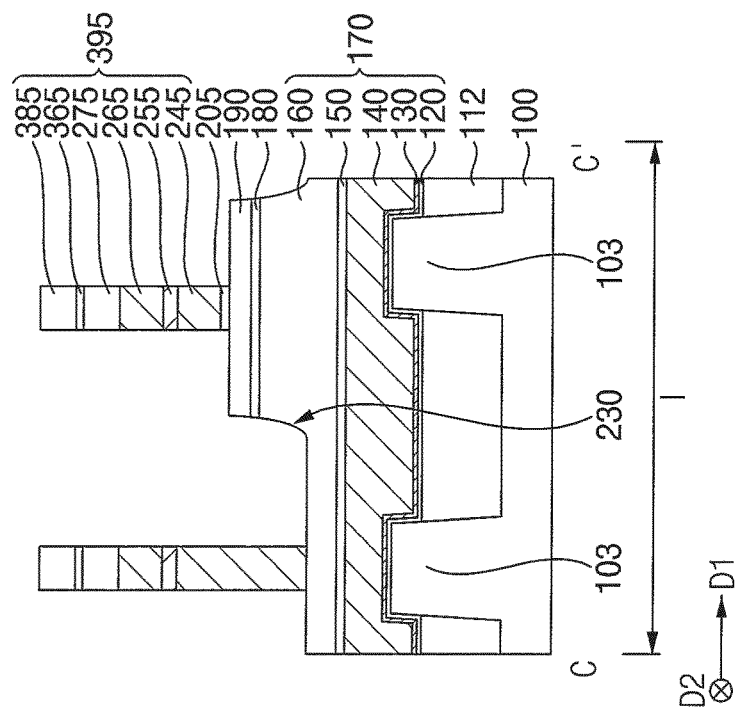
Figure 35:
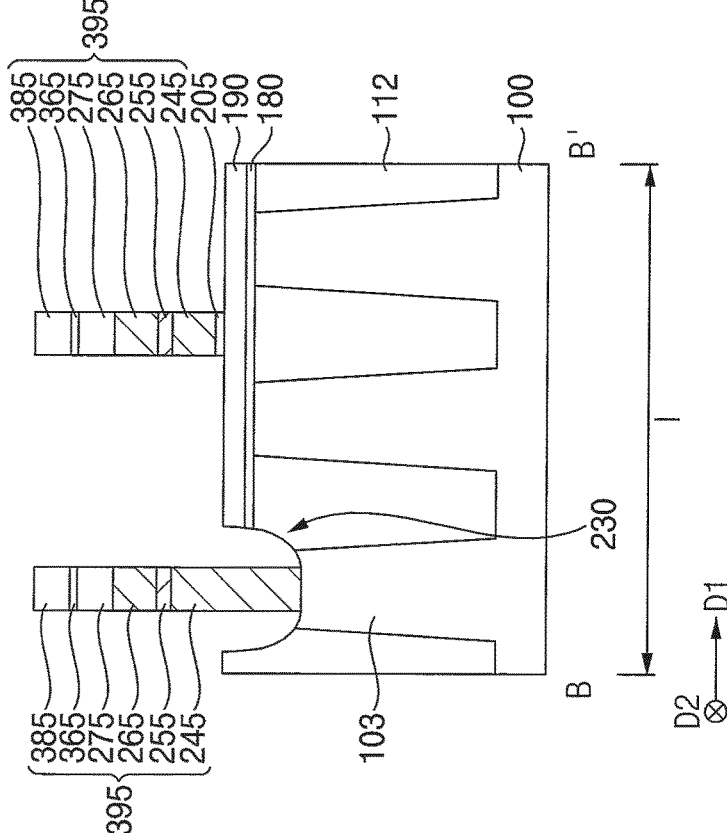

Referring to FIGS. 33 to 35, a portion of the first capping layer 380 on the first region I of the substrate 100 may be etched to form a first capping pattern 385, and the first etch stop layer 360, the first mask layer 270, the fourth conductive layer 260, the second barrier layer 250 and the third conductive layer 240 may be sequentially etched using the first capping pattern 385 as an etching mask.

In example embodiments, the first capping pattern 385 may extend in the second direction D2 on the first region I of the substrate 100, and a plurality of first capping patterns 385 may be formed to be spaced apart from each other in the first direction D1. The first capping layer 380 may remain on the second region II of the substrate 100.

By the etching process, on the first region I of the substrate 100, a fifth conductive pattern 245, a third barrier pattern 255, a sixth conductive pattern 265, a first mask 275, a first etch stop pattern 365 and the first capping pattern 385 may be sequentially stacked on the eighth opening 230, and a third insulation pattern 205, the fifth conductive pattern 245, the third barrier pattern 255, the sixth conductive pattern 265, the first mask 275, the first etch stop pattern 365 and the first capping pattern 385 may be sequentially stacked on the second insulation layer 190 of the insulation layer structure 210 at an outside of the eighth opening 230.

Hereinafter, the fifth conductive pattern 245, the third barrier pattern 255, the sixth conductive pattern 265, the first mask 275, the first etch stop pattern 365 and the first capping pattern 385 sequentially stacked may be referred to as a bit line structure 395. In example embodiments, the bit line structure 395 may extend in the second direction D2 on the first region I of the substrate 100, and a plurality of bit line structures 395 may be spaced apart from each other in the first direction D1.

A dummy bit line structure including a seventh conductive pattern 247, a fourth barrier pattern 257, an eighth conductive pattern 267 and a second mask 277 sequentially stacked and extending in the second direction D2 may be formed on a portion of the first region I of the substrate 100 adjacent to the second region II of the substrate 100 in the first direction D1, and the first etch stop layer 360 may remain on the second gate structure 330, the dummy bit line structure, the first and second spacer structures, a portion of the insulation layer structure 210, and the isolation pattern structure 110. Additionally, the first capping layer 380 may remain on portions of the first etch stop layer 360 on upper surfaces of the second gate structure 330 and the dummy bit line structure and the first insulating interlayer 370.

Figure 36:
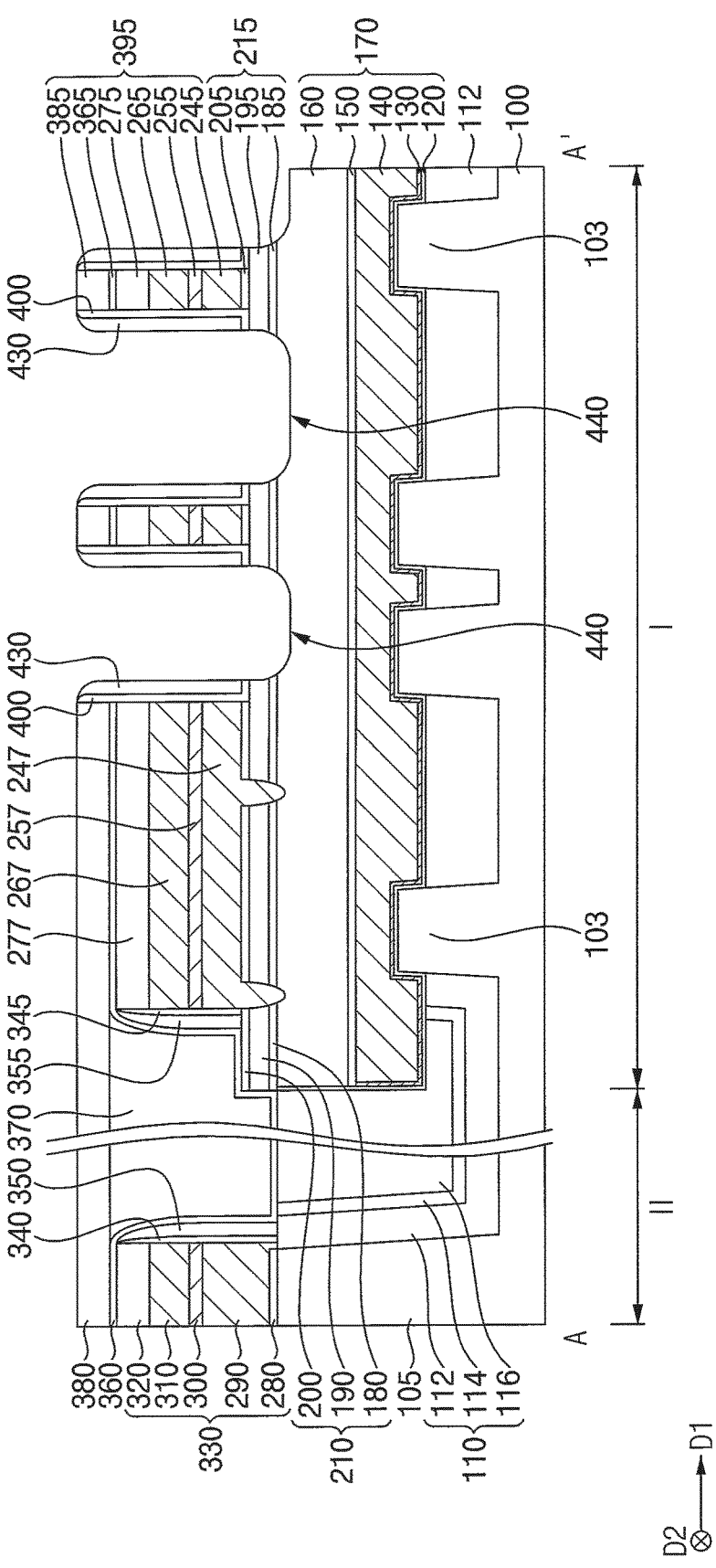
Figure 37:
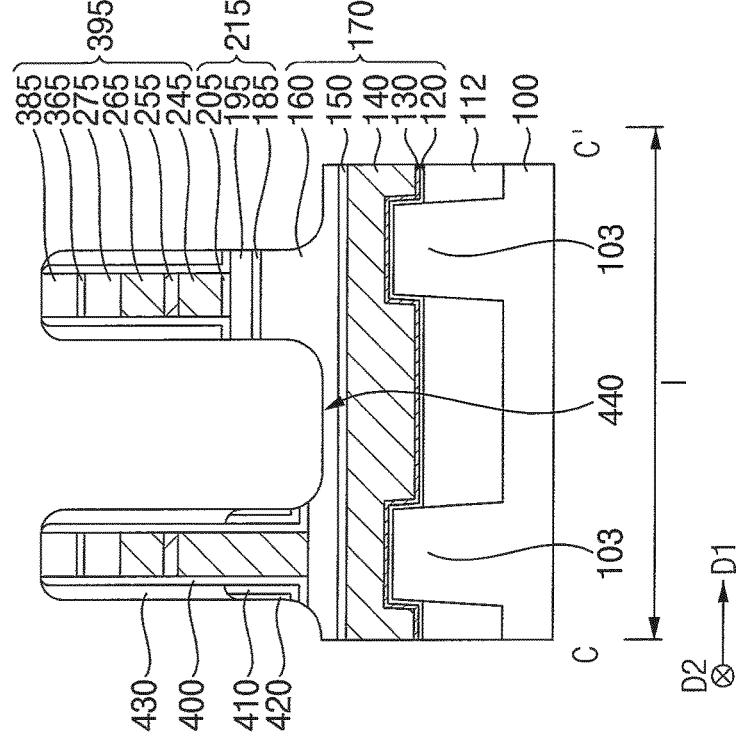
Figure 37:
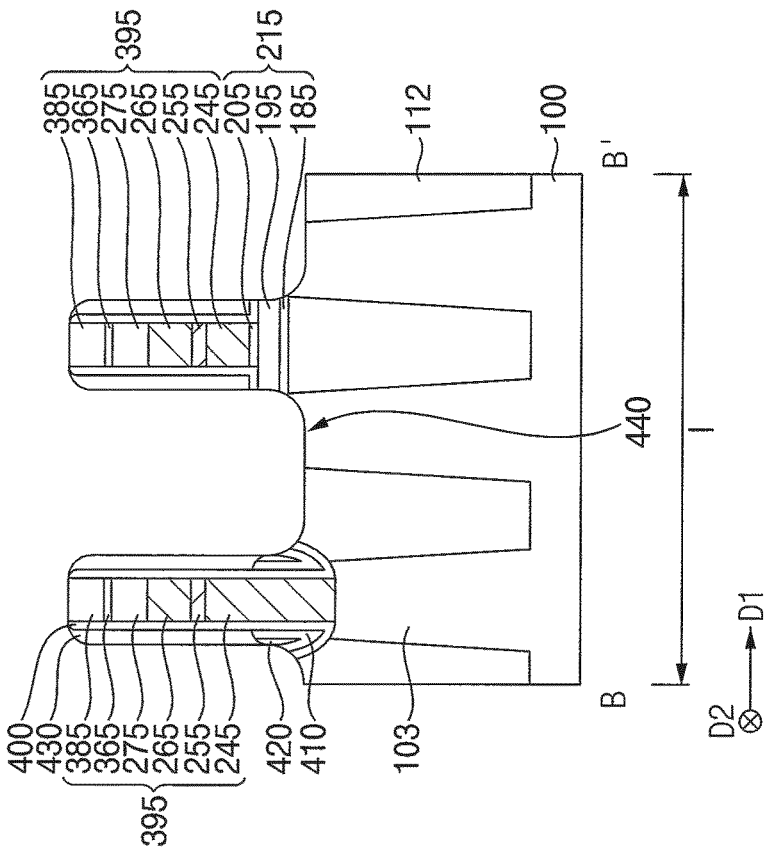

Referring to FIGS. 36 and 37, a fifth spacer layer may be formed on the substrate 100 to cover the bit line structure 395, the dummy bit line structure and the first capping layer 380, and fourth and fifth insulation layers may be sequentially formed on the fifth spacer layer.

The fifth spacer layer may also cover a sidewall of the third insulation pattern 205 between the second insulation layer 190 and the bit line structure 395, and the fifth insulation layer may fill the eighth opening 230.

The fifth spacer layer may include a nitride, e.g., silicon nitride, the fourth insulation layer may include an oxide, e.g., silicon oxide, and the fifth insulation layer may include a nitride, e.g., silicon nitride.

The fourth and fifth insulation layers may be etched by an etching process. In example embodiments, the etching process may be performed by a wet etch process using an etching solution including phosphorous acid ($H_3PO_4$), SC1, hydrogen fluoride (HF), and other portions of the fourth and fifth insulation layers except for a portion in the eighth opening 230 may be removed. Thus, most of an entire surface of the fifth spacer layer, that is, an entire surface except for a portion thereof in the eighth opening 230 may be exposed, and portions of the fourth and fifth insulation layers remaining in the eighth opening 230 may form fourth and fifth insulation patterns 410 and 420, respectively.

A sixth spacer layer may be formed on the exposed surface of the fifth spacer layer and the fourth and fifth insulation patterns 410 and 420 in the eighth opening 230 and may be anisotropically etched to form a sixth spacer 430 on the surface of the fifth spacer layer and the fourth and fifth insulation patterns 410 and 420 to cover a sidewall of the bit line structure 395. The sixth spacer layer may also be formed on a sidewall of the dummy bit line structure. The sixth spacer layer may include an oxide, e.g., silicon oxide.

A dry etching process may be performed using the first capping pattern 385 and the fourth spacer 430 as an etching mask to form a ninth opening 440 exposing the upper surface of the first active pattern 103. An upper surface of the first isolation pattern 112 of the isolation pattern structure 110 and an upper surface of the first gate mask 160 may also be exposed by the ninth opening 440.

By the dry etching process, portions of the fifth spacer layer on upper surfaces of the first capping pattern 385, the second insulation layer 190 and the first capping layer may be removed, and thus a fifth spacer 400 covering the sidewall of the bit line structure 395 may be formed. The fifth spacer 400 may also cover the sidewall of the dummy bit line structure.

Additionally, during the dry etching process, the first and second insulation layers 180 and 190 may be partially removed, such that first and second insulation patterns 185 and 195 may remain under the bit line structure 395. The first to third insulation patterns 185, 195 and 205 that are sequentially stacked under the bit line structure 395 may form an insulation pattern structure 215.

Figure 38:
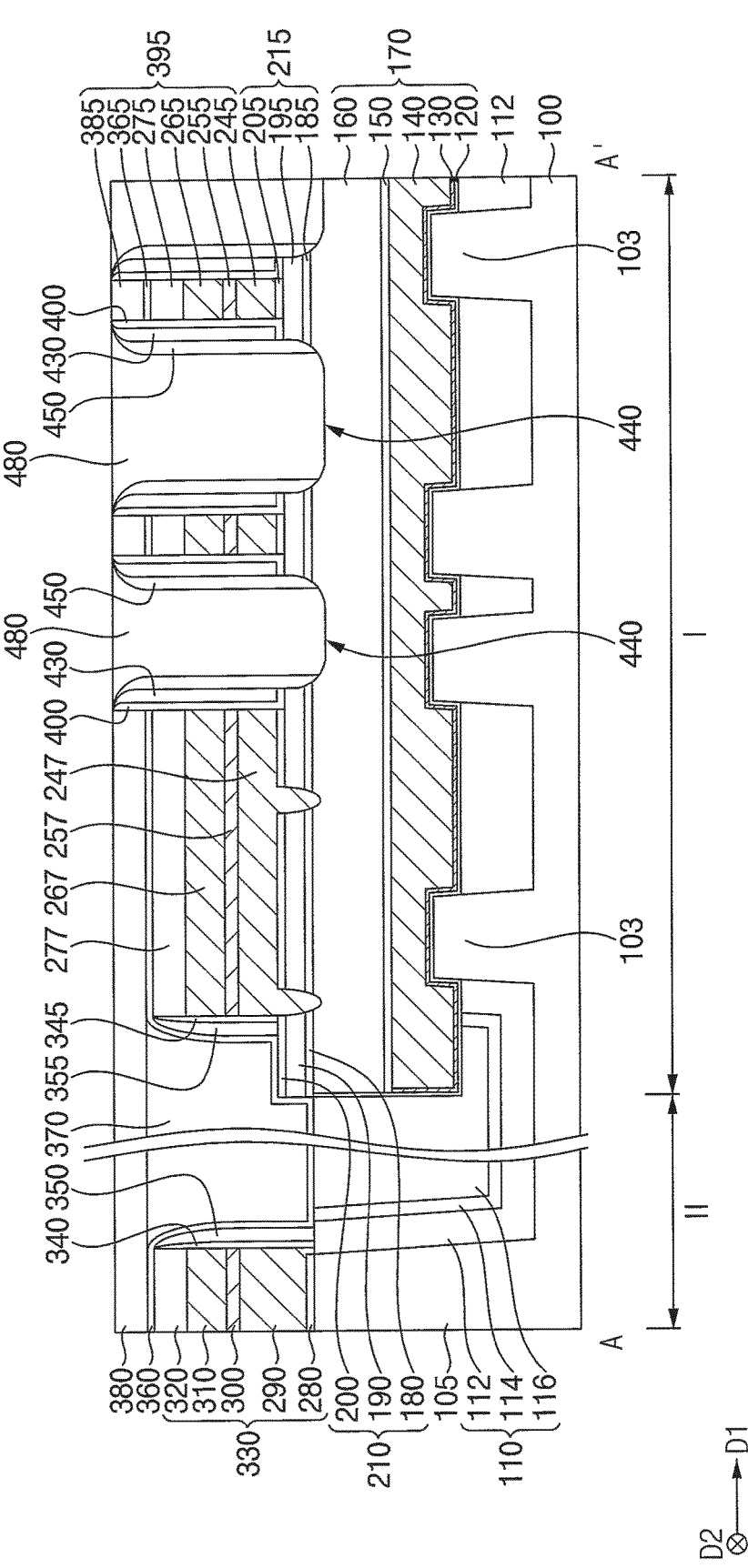
Figure 39:
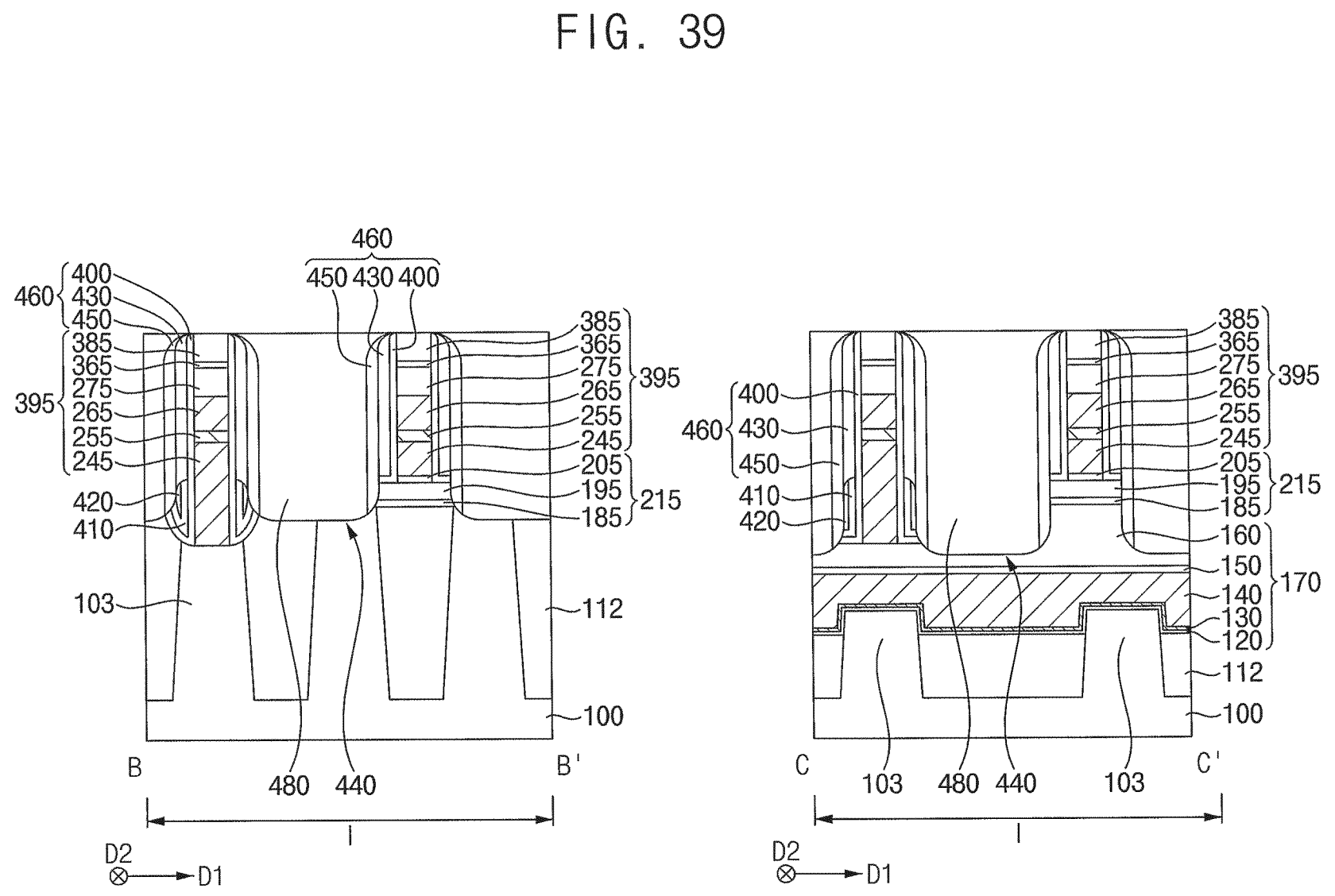

Referring to FIGS. 38 and 39, a seventh spacer layer may be formed on the upper surface of the first capping pattern 385, the upper surface of the first capping layer 380, an outer sidewall of the sixth spacer 430, portions of upper surfaces of the fourth and fifth insulation patterns 410 and 420, and the upper surfaces of the first active pattern 103, the first isolation pattern 112 and the first gate mask 160 exposed by the ninth opening 440, and may be anisotropically etched to form a seventh spacer 450 covering the sidewall of the bit line structure 395. The seventh spacer layer may include a nitride, e.g., silicon nitride.

The fifth to seventh spacers 400, 430 and 450 sequentially stacked in the horizontal direction from the sidewall of the bit line structure 395 on the first region I of the substrate 100 may be referred to as a third spacer structure 460.

A lower contact plug layer may be formed on the first region I of the substrate 100 to fill the ninth opening 440, and may be planarized until the upper surfaces of the first capping pattern 385 and the first capping layer 380 are exposed.

In example embodiments, the lower contact plug layer may extend in the second direction D2, and a plurality of lower contact plug layers may be spaced apart from each other in the first direction D1 by the bit line structures 395. The lower contact plug layer may include, e.g., doped polysilicon.

Figure 40:
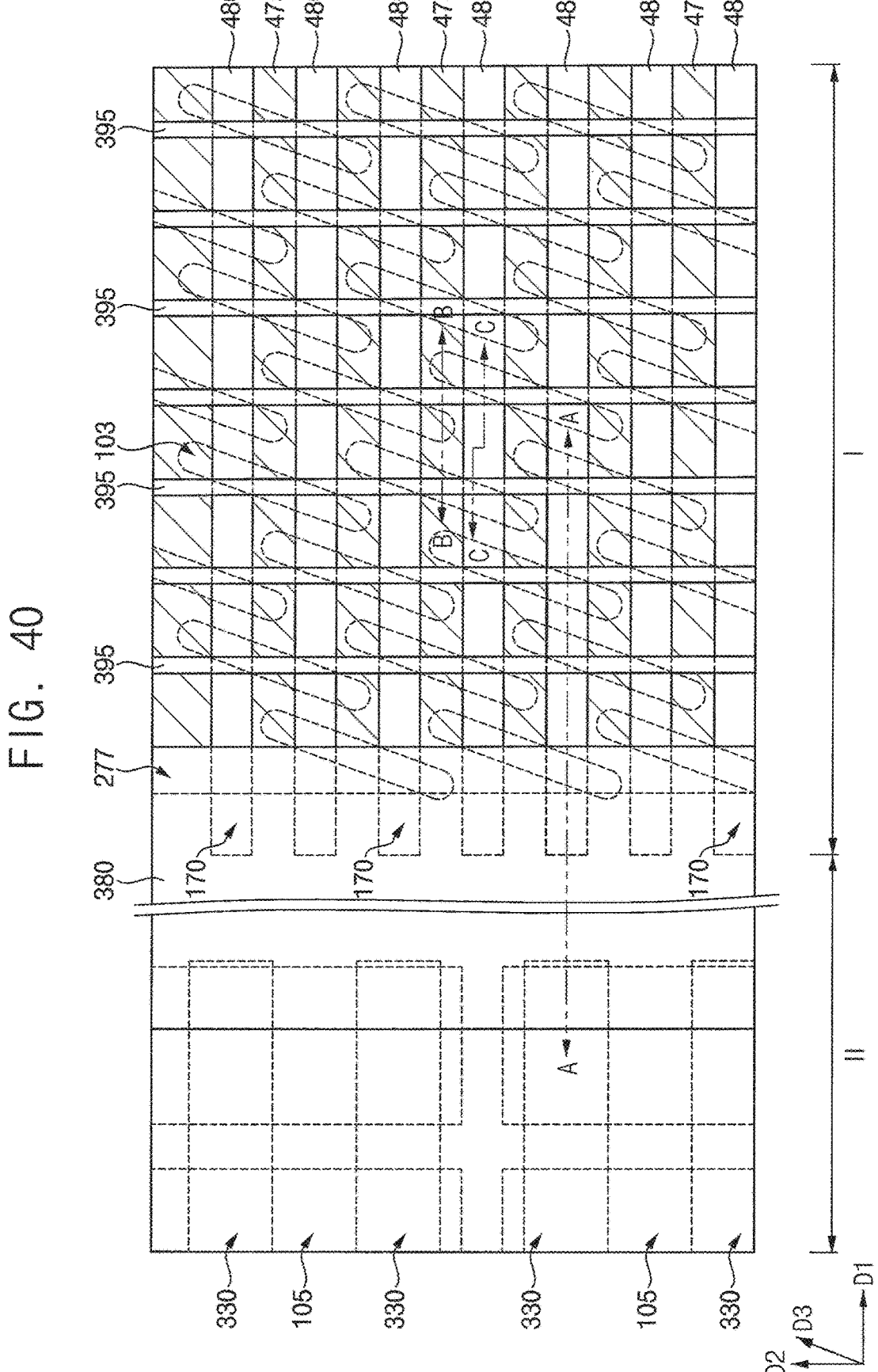
Figure 41:
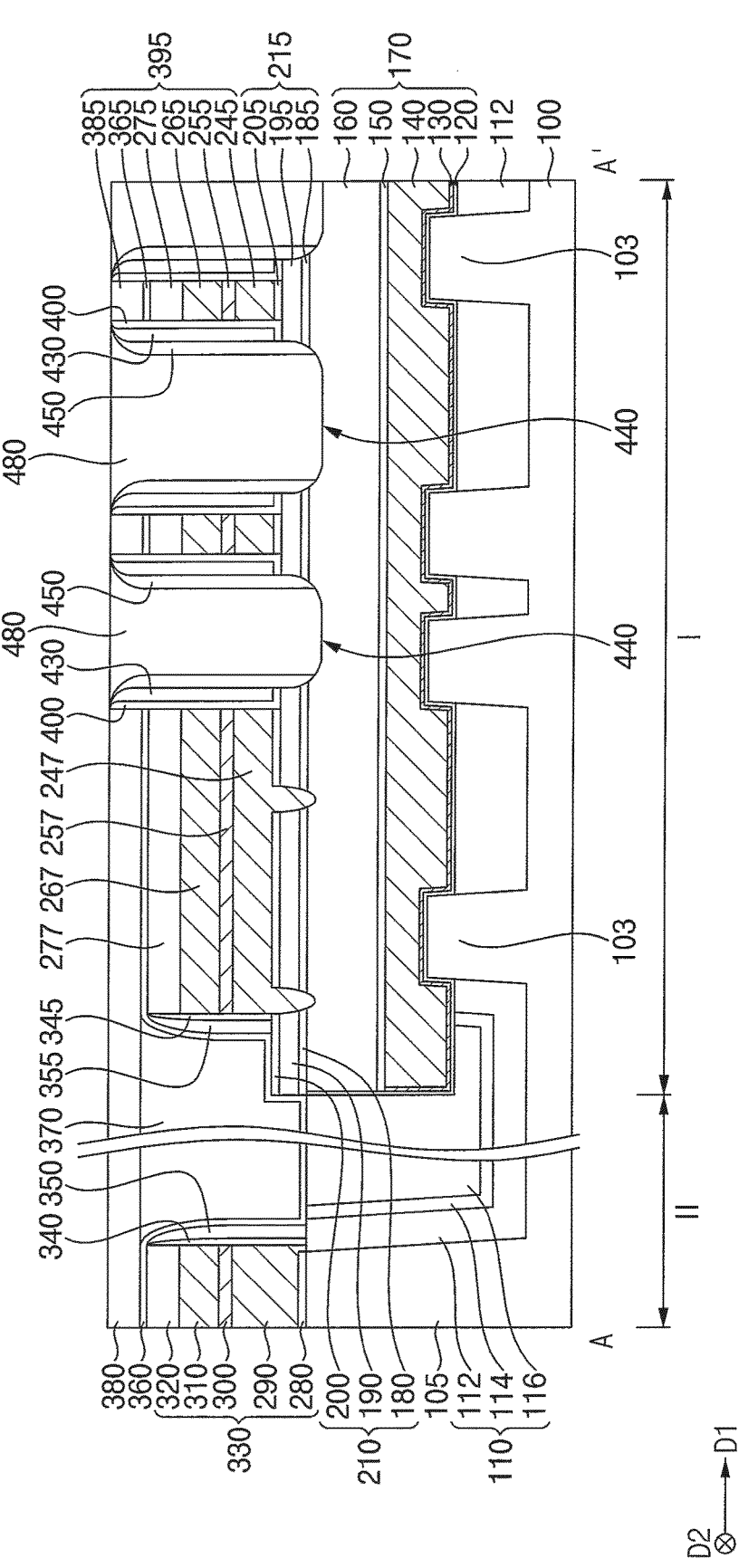
Figure 42:
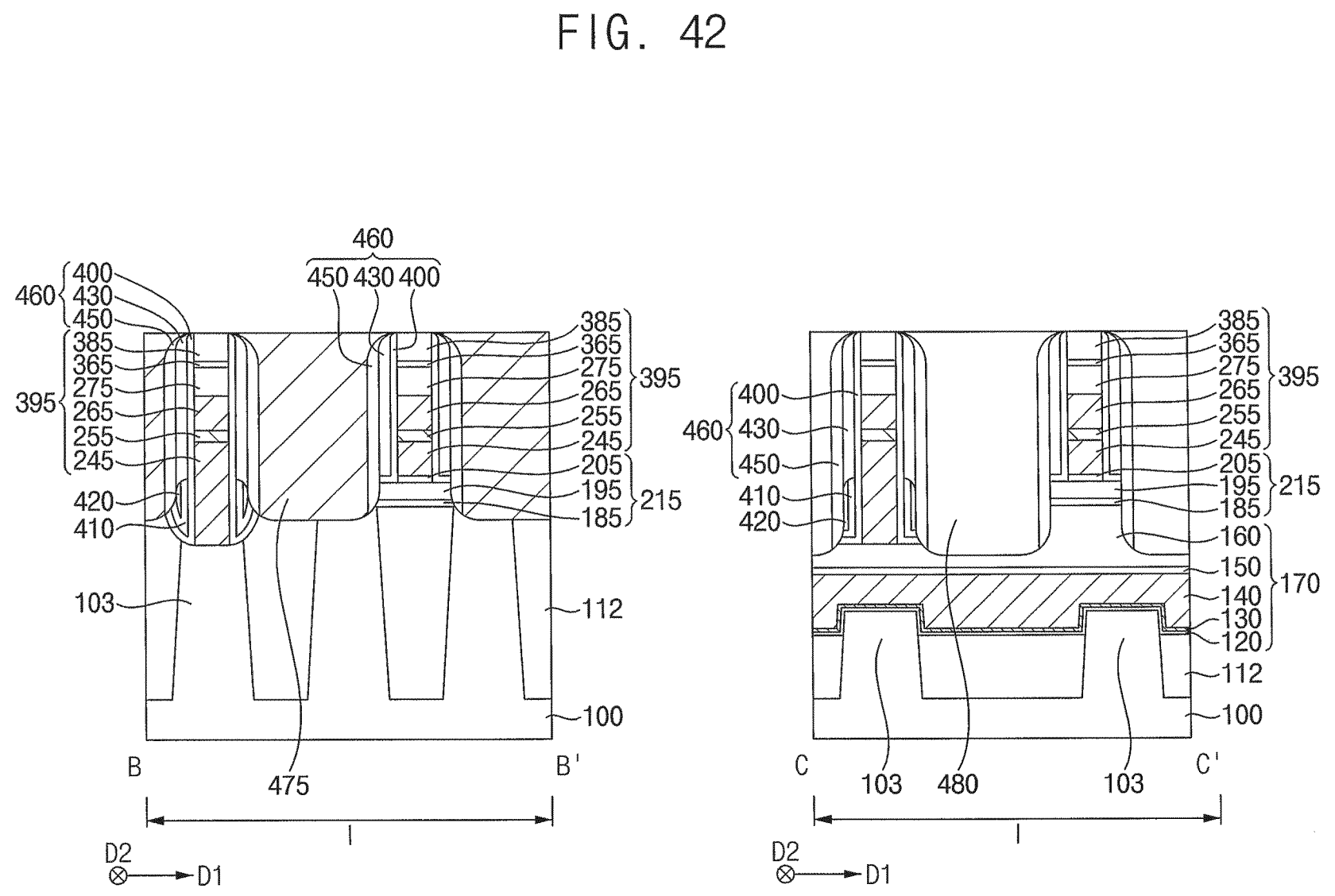

Referring to FIGS. 40 to 42, a third mask having tenth openings, each of which may extend in the first direction D1 on the first region I of the substrate 100, spaced apart from each other in the second direction D2 may be formed on the first capping pattern 385, the first capping layer 380 and the lower contact plug layer, and an etching process may be performed on the lower contact plug layer using the third mask as an etching mask.

In example embodiments, each of the tenth openings may overlap the first gate structure 170 on the first region I of the substrate 100 in the vertical direction. As the etching process is performed, an eleventh opening may be formed to expose an upper surface of the first gate mask 160 of the first gate structure 170 between the bit line structures 395 on the first region I of the substrate 100.

After removing the third mask, a second capping pattern 480 may be formed on the first region I of the substrate 100 to fill the fourth opening. The second capping pattern 480 may include a nitride, e.g., silicon nitride. In example embodiments, the second capping pattern 480 may extend in the first direction D1 between the bit line structures 395, and a plurality of second capping patterns 480 may be spaced apart from each other in the second direction D2.

Thus, the lower contact plug layer 470 extending in the second direction D2 between the bit line structures 395 on the first region I of the substrate 100 may be divided into a plurality of lower contact plugs 475 spaced apart from each other in the second direction D2 by the second capping patterns 480.

Figure 43:
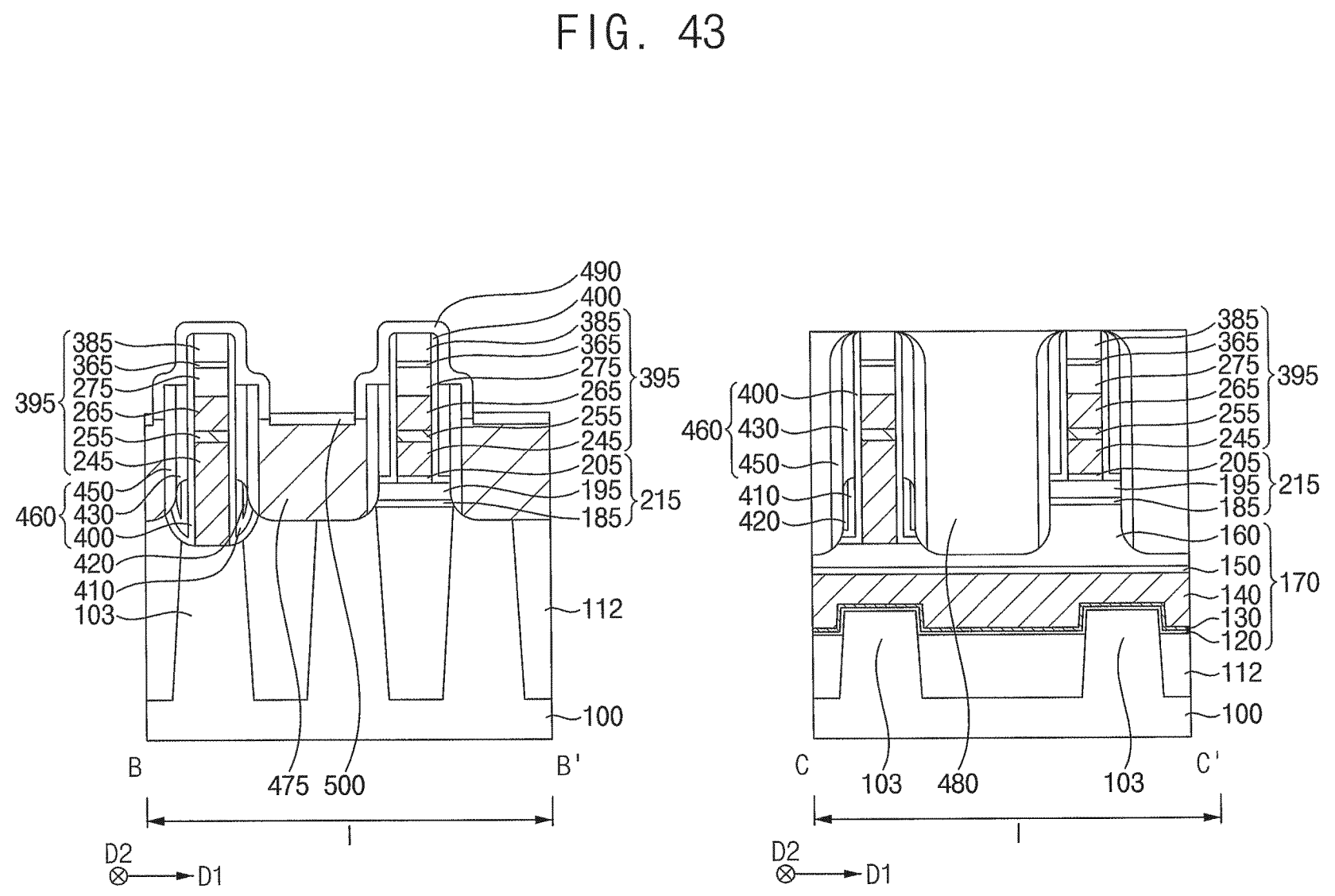

Referring to FIG. 43, an upper portion of the lower contact plug 475 may be removed to expose an upper portion of the third spacer structure 460 on the sidewall of the bit line structure 395, and upper portions of the sixth and seventh spacers 430 and 450 of the exposed third spacer structure 460 may be removed.

An etch back process may be further performed to remove an upper portion of the lower contact plug 475. Thus, an upper surface of the lower contact plug 475 may be lower than uppermost surfaces of the sixth and seventh spacers 439 and 450.

An eighth spacer layer may be formed on the bit line structure 395, the third spacer structure 460, the second capping pattern 480, the first capping layer 380, and the lower contact plug 475, and may be anisotropically etched so that an eighth spacer 490 may be formed to cover the third spacer structure 460 on each of opposite sidewalls of the bit line structure 395 in the first direction D1 and that an upper surface of the lower contact plug 475 may not be covered by the eighth spacer 490 but be exposed.

A metal silicide pattern 500 may be formed on the exposed upper surface of the lower contact plug 475. In example embodiments, the metal silicide patterns 500 may be formed by forming a metal layer on the first and second capping patterns 385 and 480, the first capping layer 380, the eighth spacer 490, and the lower contact plug 475, thermally treating the metal layer, and removing an unreacted portion of the metal layer. The metal silicide patterns 500 may include, e.g., cobalt silicide, nickel silicide, titanium silicide, etc.

Figure 45:
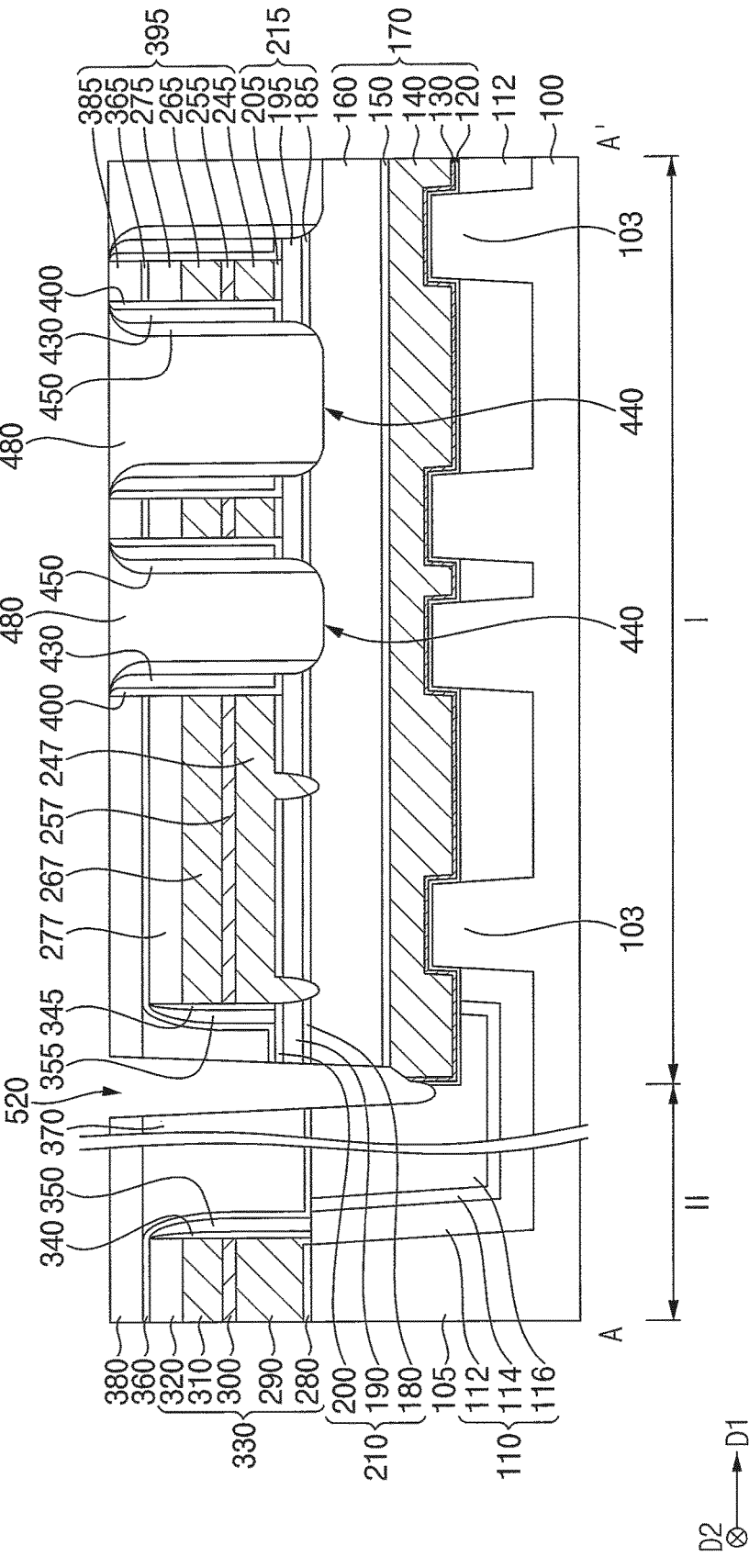

Referring to FIGS. 44 and 45, a first sacrificial layer may be formed on the first and second capping patterns 385 and 480, the eighth spacer 490, the metal silicide pattern 500 and the lower contact plug 475, and an upper portion of the first sacrificial layer may be planarized until upper surfaces of the first and second capping patterns 385 and 480 and the first capping layer 380 are exposed.

The first sacrificial layer may include, e.g., SOH, ACL, etc.

A twelfth opening 520 may be formed to extend through a portion of the first capping layer 380 on a boundary between the first and second regions I and II of the substrate 100, and the first insulating interlayer 370, the first etch stop layer 360, the insulation layer structure 210, the first gate mask 160, the second conductive pattern 150 and the isolation pattern structure 110 under the portion of the first capping layer 380 to expose the first conductive pattern 140. The twelfth opening 520 may also expose the first barrier pattern 130 and the first gate insulation pattern 120 on the sidewall of the first conductive pattern 140.

Additionally, a thirteenth opening (not shown) may also be formed to extend through a portion of the first capping layer 380 on the second region II of the substrate 100, and the first insulating interlayer 370 under the portion of the first capping layer 380, and the first etch stop layer 360 to expose an upper surface of the second active pattern 105 between the second gate structures 330. However, the thirteenth opening may expose an upper surface of the source/drain layer at an upper portion of the second active pattern 105 between the second gate structures 330 serving as a gate of a transistor and may not be formed between the second gate structures 330 that are dummy gate structures.

Figure 46:
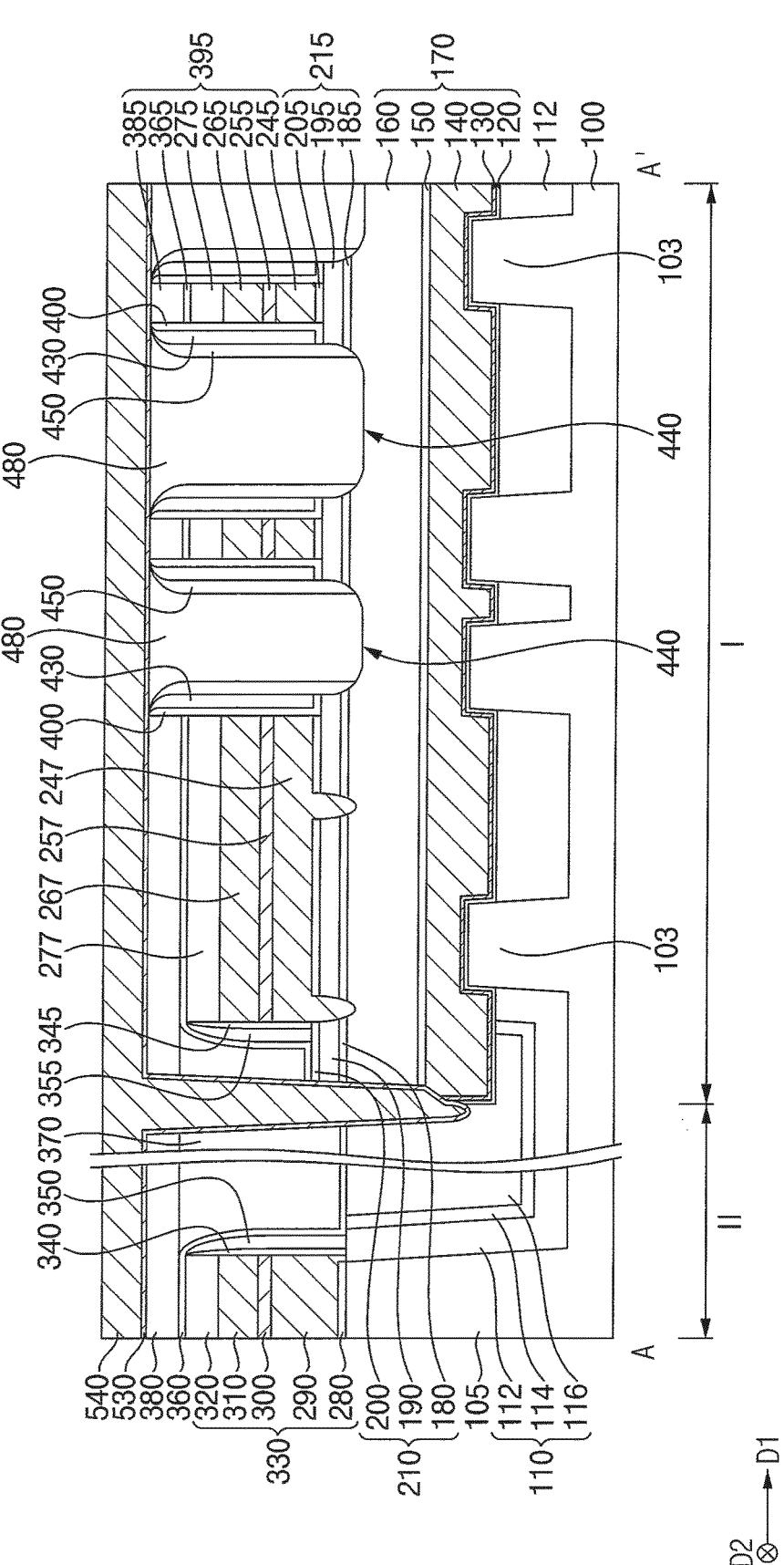
Figure 47:
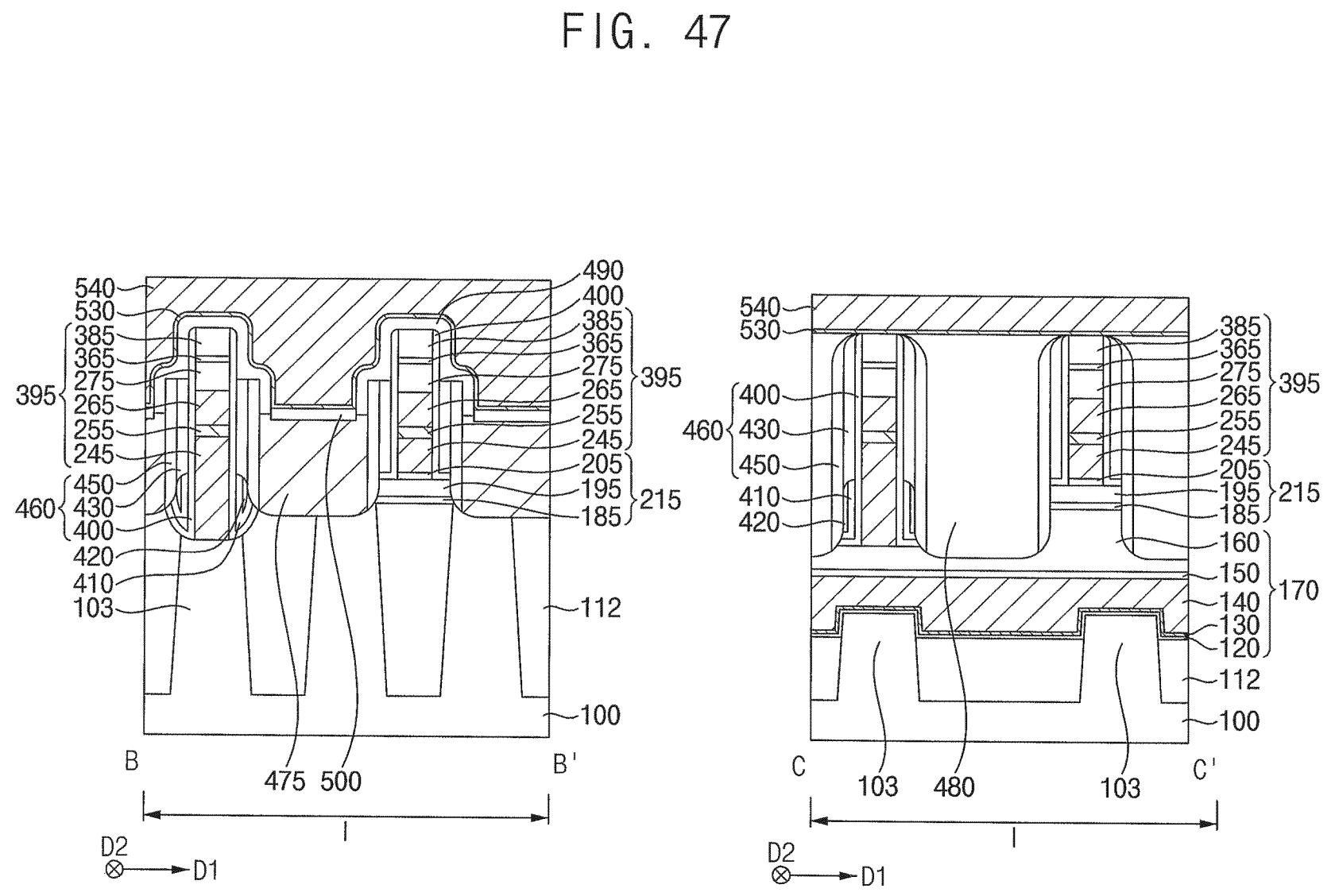
Figure 48:
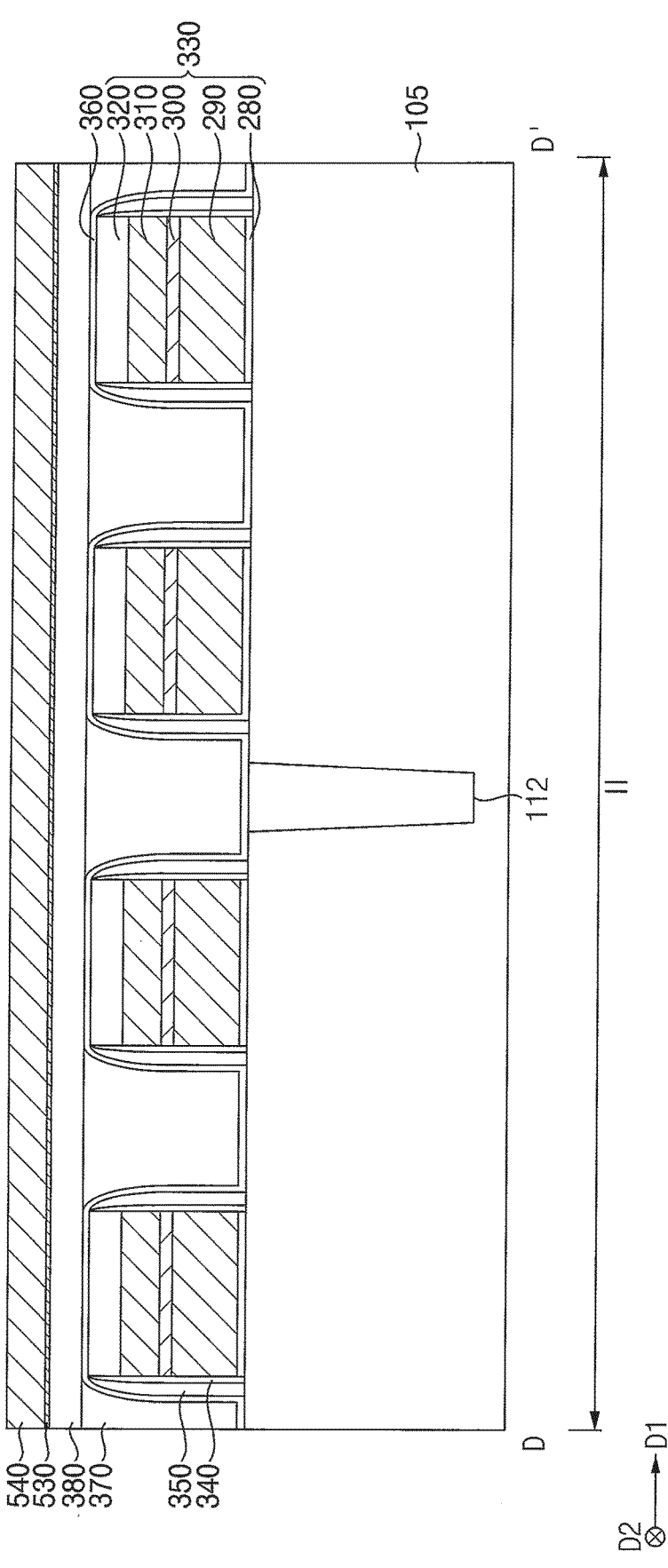
Figure 49:
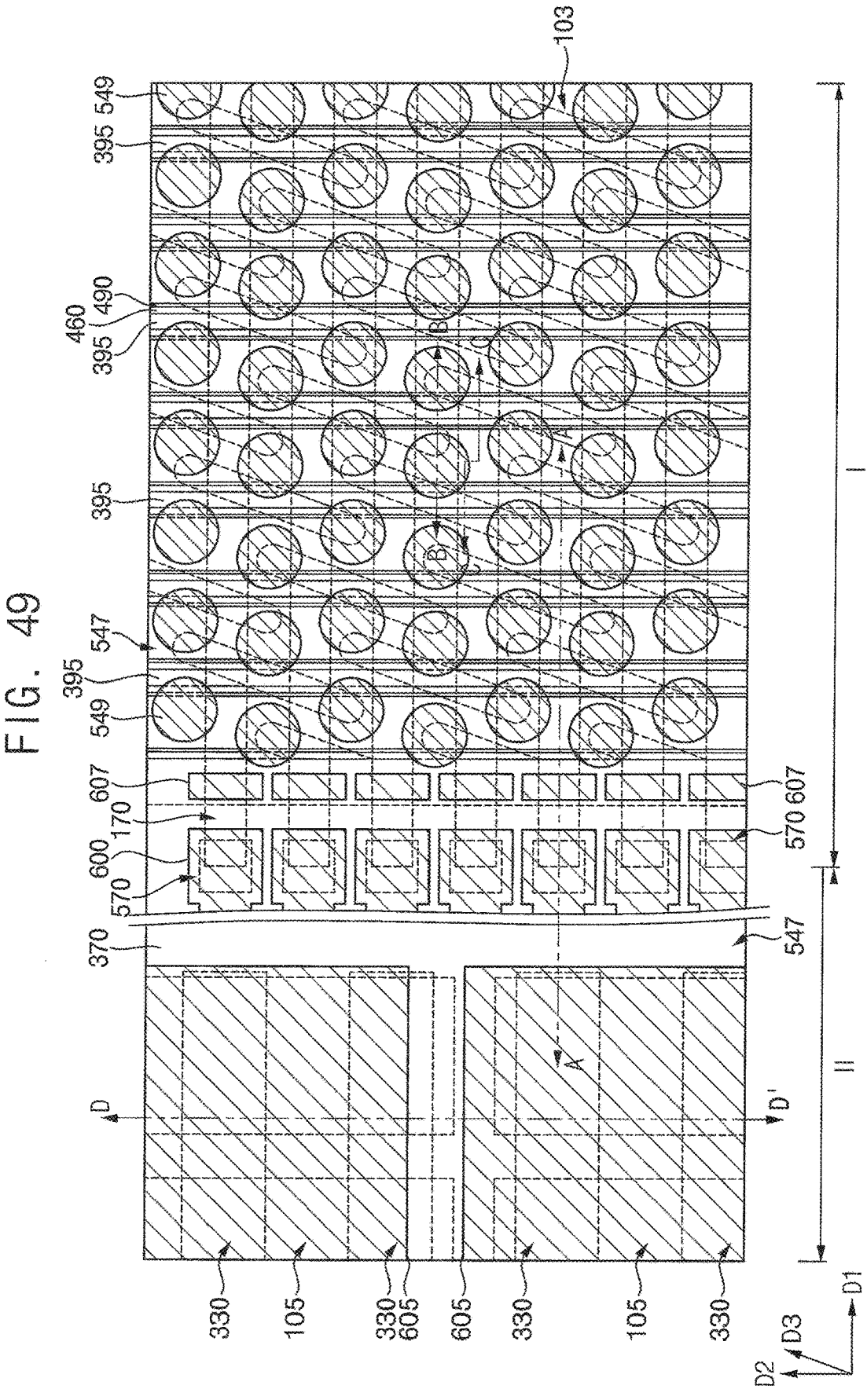
Figure 50:
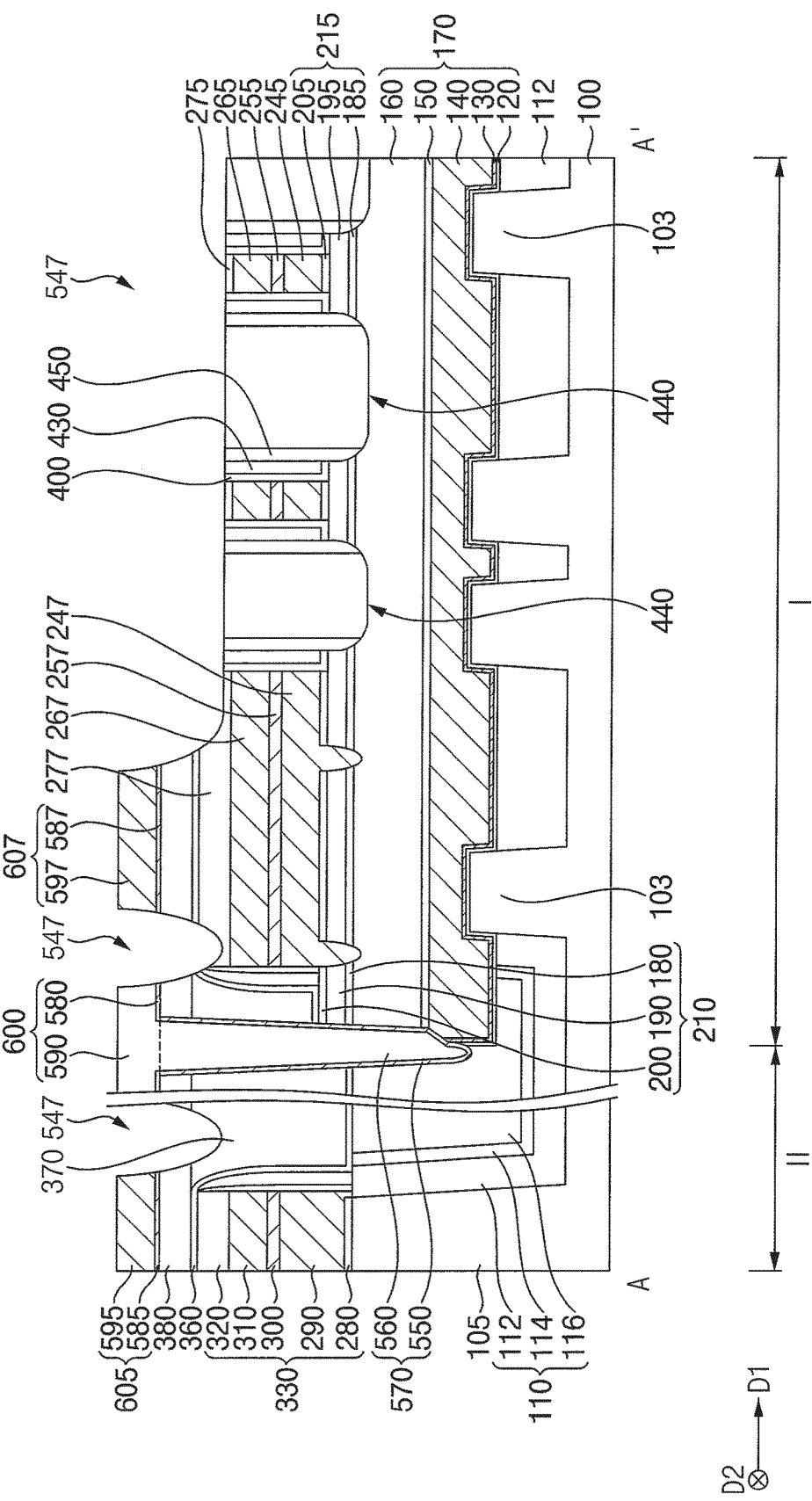

Referring to FIGS. 46 to 48, the first sacrificial layer may be removed by, e.g., an ashing process and/or a stripping process, and a fifth barrier layer 530 may be formed on the first and second capping patterns 385 and 480, the eighth spacer 490, the metal silicide pattern 500 and the lower contact plug 475 on the first region I of the substrate 100, and the first capping layer 380, a sidewall of the twelfth opening 520, and the first conductive pattern 140, the first barrier pattern 130, the first gate insulation pattern 120 and the isolation pattern structure 110 exposed by the twelfth opening 520, and the source/drain layer exposed by the thirteenth opening. A second metal layer 540 may be formed on the fifth barrier layer 530 to fill a space between the bit line structures 395, the twelfth opening 520 and the thirteenth opening.

The fifth barrier layer 530 may include a metal nitride, e.g., titanium nitride, tantalum nitride, etc., and the second metal layer 540 may include a metal, e.g., tungsten.

A planarization process may be further performed on an upper portion of the second metal layer 540. The planarization process may include a CMP process and/or an etch back process.

Referring to FIGS. 49 to 52, the second metal layer 540 and the fifth barrier layer 530 may be patterned.

Thus, an upper contact plug 549 may be formed on the first region I of the substrate 100, a third wiring 600 may be formed on the boundary between the first and second regions I and II of the substrate 100, a first conductive pad 605 may be formed on the second region II of the substrate 100, and a second conductive pad 607 may be formed on a portion of the first region I adjacent to the second region II of the substrate 100 in the first direction D1. A fourteenth opening 547 may be formed between the upper contact plug 549, the first wiring 600, and the first and second conductive pads 605 and 607.

The fourteenth opening 547 may be formed by removing not only the second metal layer 540 and the fifth barrier layer 530 but also the first and second capping patterns 385 and 480, the first capping layer 380, the third spacer structure 460, the eighth spacer 490, the first etch stop layer 360, the first etch stop pattern 365, the first mask 275, the second gate mask 320, and the first and second spacer structures.

As the fourteenth opening 547 is formed, the second metal layer 540 and the fifth barrier layer 530 may be transformed into a first metal pattern 545 and a fifth barrier pattern 535, respectively, covering a lower surface of the first metal pattern 545, which may form an upper contact plug 549. In example embodiments, a plurality of upper contact plugs 549 may be formed to be spaced apart from each other in each of the first and second directions D1 and D2 and may be arranged in a honeycomb pattern or a lattice pattern in a plan view. Each of the upper contact plugs 549 may have a shape of a circle, an ellipse, or a polygon in a plan view.

The lower contact plug 475, the metal silicide pattern 500 and the upper contact plug 549 sequentially stacked on the first region I of the substrate 100 may form a contact plug structure.

The third wiring 600 may include a fourth metal pattern 590 and an eighth barrier pattern 580 covering a lower surface of the fourth metal pattern 590, and the first conductive pad 605 may include a fifth metal pattern 595 and a ninth barrier pattern 585 covering a lower surface of the fifth metal pattern 595. A third contact plug 570 including a second metal pattern 560 and a sixth barrier pattern 550 may be formed in the twelfth opening 520, and a fourth contact plug including a third metal pattern and a seventh barrier pattern may be formed in the thirteenth opening. The second conductive pad 607 may include a sixth metal pattern 597 and a tenth barrier pattern 587 covering a lower surface of the sixth metal pattern 597.

In example embodiments, the third wiring 600 may extend from the boundary between the first and second regions I and II of the substrate 100 toward the second region II of the substrate 100 in the first direction D1, and a plurality of third wirings 600 may be spaced apart from each other in the second direction D2. In example embodiments, the third wiring 600 may overlap the twelfth opening 520 in the vertical direction, and at least one of the first wirings 600 may overlap the thirteenth opening in the vertical direction.

Thus, the third wiring 600 may be connected with the first conductive pattern 140 through the third contact plug 570 and may apply electrical signals to the first gate structure 170. Additionally, the third wiring 600 may be connected with the source/drain layer at the upper portion of the second active pattern 105 through the fourth contact plug and may apply electrical signals to the source/drain layer.

In example embodiments, neighboring two of the first conductive pads 605 on a portion of the second region II of the substrate 100 may form a pair of first conductive pads 605, and a plurality of pairs of first conductive pads 605 may be spaced apart from each other in each of the first and second directions D1 and D2.

Figure 52:
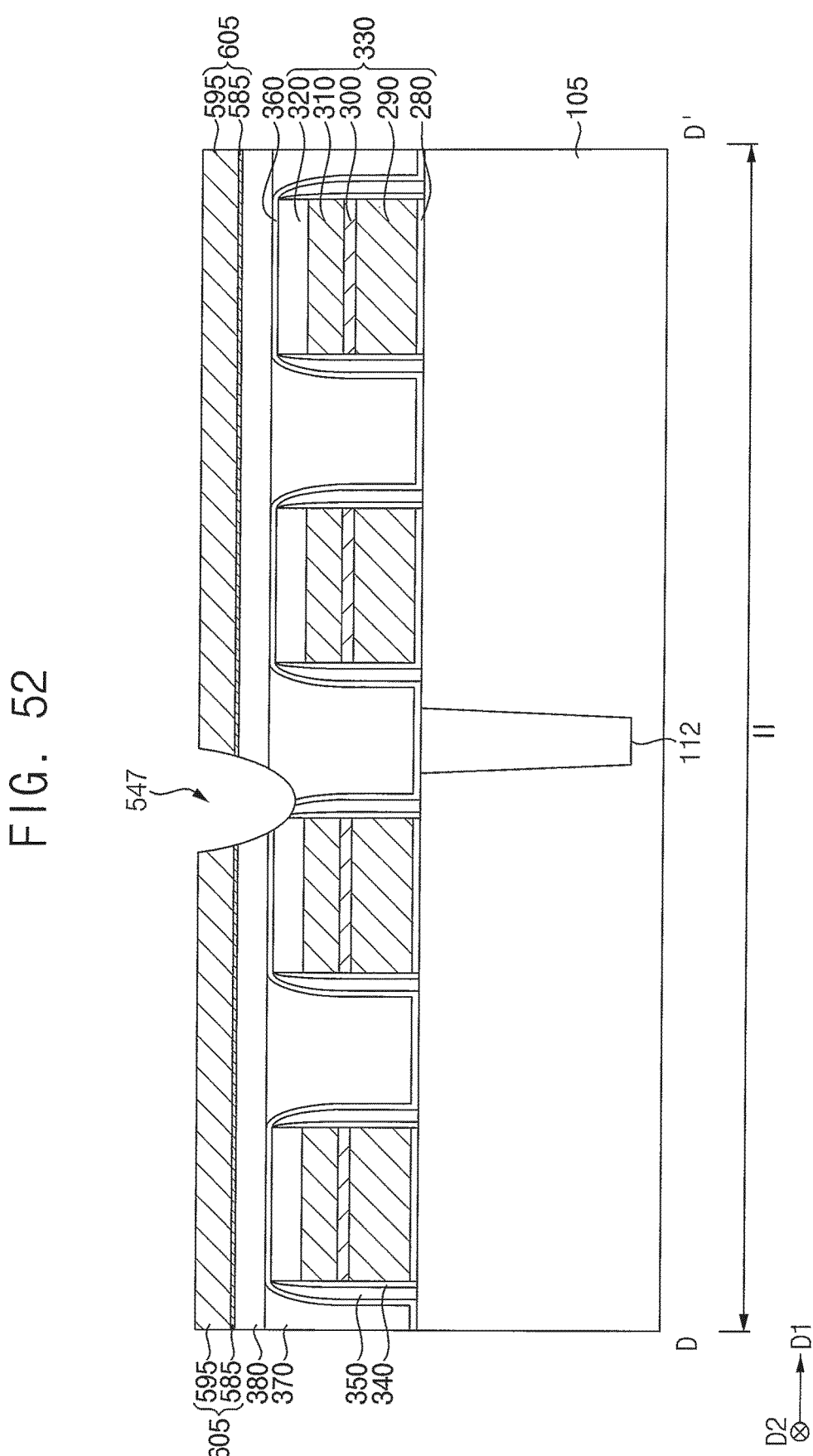

FIG. 52 shows one pair of first conductive pads 605 spaced apart from each other in the first direction D1 by the fourteenth opening 547 extending in the second direction D2, however, the inventive concept may not be limited thereto. That is, the fourteenth opening 547 may extend in the first direction D1, and thus a pair of first conductive pads 605 spaced apart from each other in the second direction D2.

The second conductive pad 607 may overlap the dummy bit line structure in the vertical direction.

In some embodiments, the exposed sixth spacer 430 may be removed to form an air gap connected to the seventh opening 547. The sixth spacer 430 may be removed by, e.g., a wet etching process.

Figure 53:
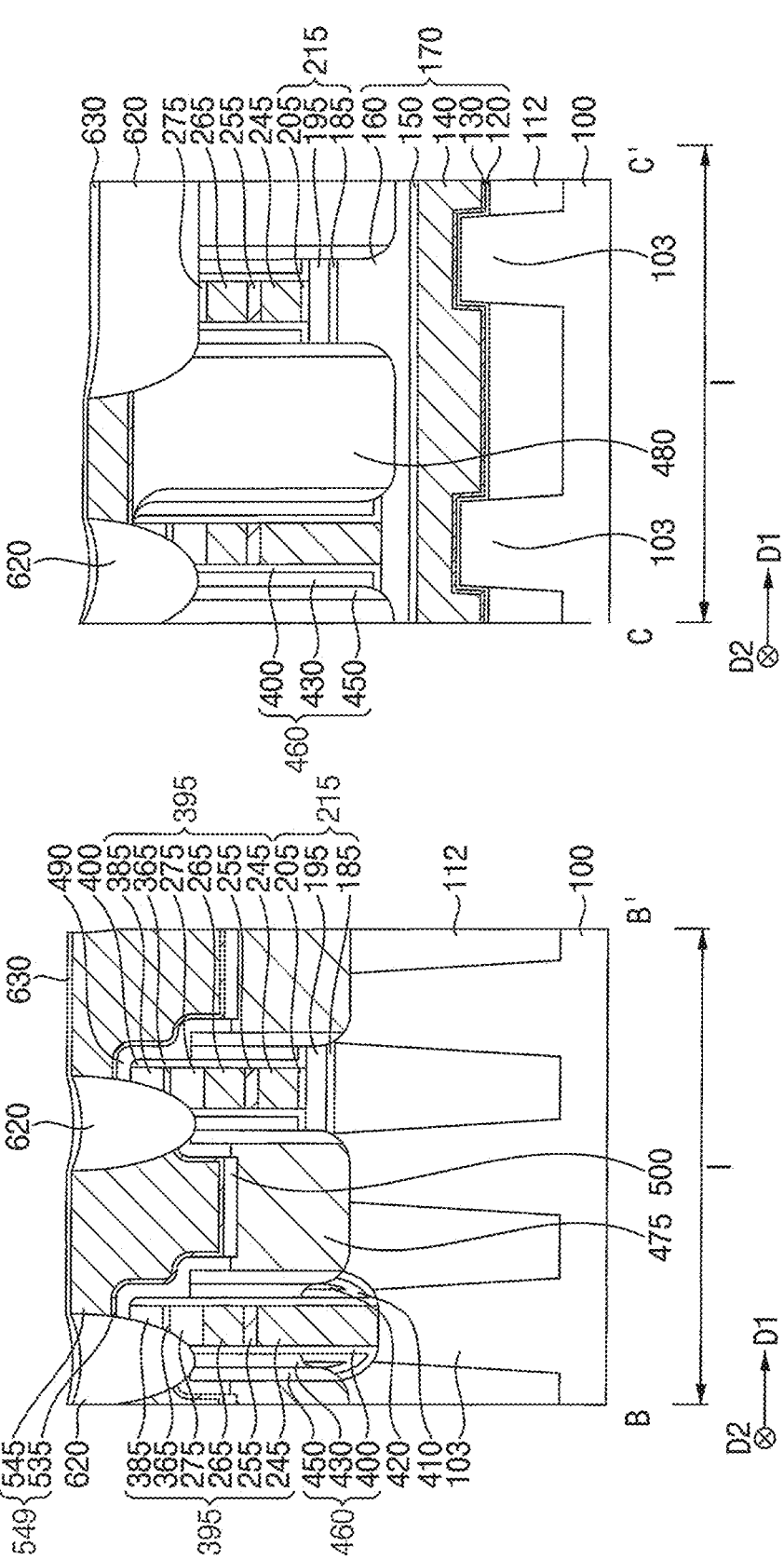
Figure 54:
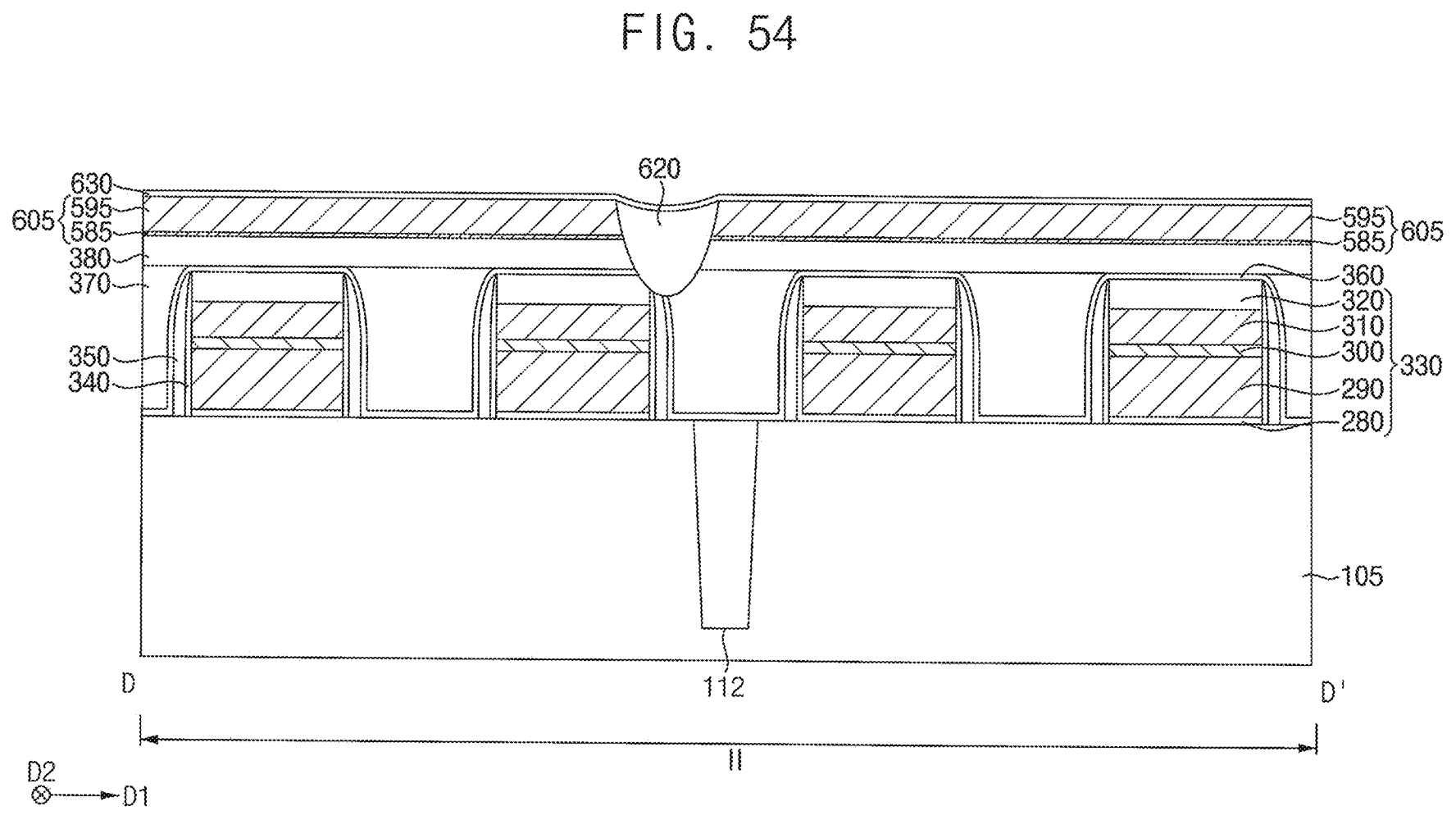

Referring to FIGS. 53 and 54, a sixth insulation layer 620 may be formed to fill the fourteenth opening 547, and a second etch stop layer 630 may be formed on the sixth insulation layer 620, the upper contact plug 549, the third wiring 600 and the first and second conductive pads 605 and 607.

The sixth insulation layer 620 may include a nitride, e.g., silicon nitride, and the second etch stop layer 630 may include a nitride, e.g., silicon boronitride, silicon carbonitride, etc.

If the air gap connected with the fourteenth opening 547 is formed, the sixth insulation layer 620 may be formed to include a material having a low gap filling characteristic, and thus the air gap may not be filled with the sixth insulation layer 620 but remain.

Referring to FIGS. 55 to 58, a first mold layer 720, a first support layer 730, a second mold layer 725 and a second support layer 735 may be sequentially formed on the second etch stop layer 630, and portions of the first mold layer 720, the first support layer 730, the second mold layer 725 and the second support layer 735 and a portion of the second etch stop layer 630 thereunder may be etched to form fifteenth to seventeenth openings 747, 740 and 745 partially exposing the upper contact plug 549 and the first conductive pad 605, respectively.

As the plurality of upper contact plugs 549 is spaced apart from each other in each of the first and second directions D1 and D2 in a honeycomb pattern or a lattice pattern in a plan view, a plurality of fifteenth openings 747 exposing the plurality of upper contact plugs 549, respectively, may be spaced apart from other in each of the first and second directions D1 and D2 in a honeycomb pattern or a lattice pattern in a plan view.

In example embodiments, the sixteenth and seventh openings 740 and 745 may correspond to the second and third openings 40 and 45 illustrate with reference to FIGS. 2 and 3, and thus may be arranged in honeycomb pattern or a lattice pattern in a plan view.

Figure 59:
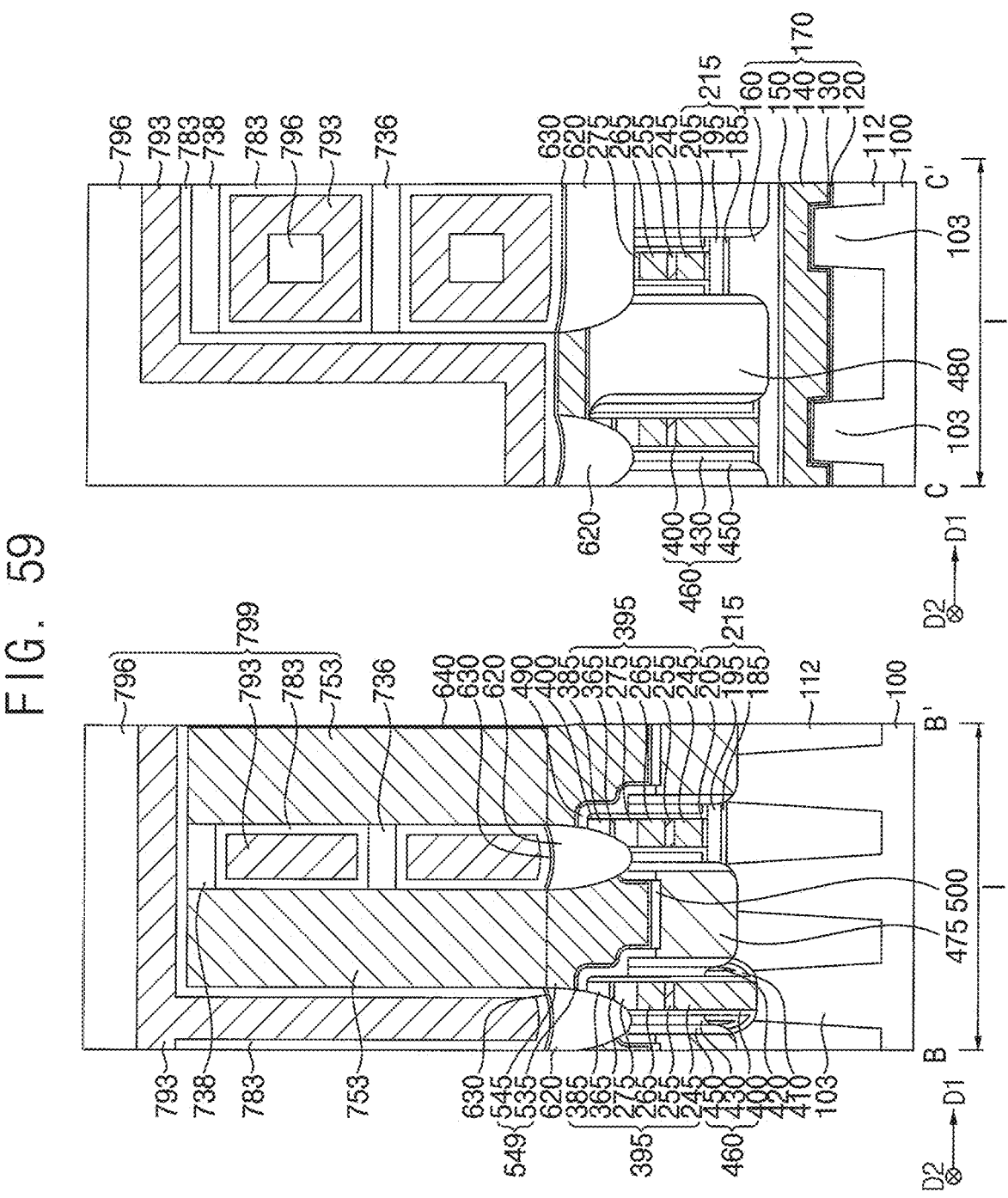
Figure 60:
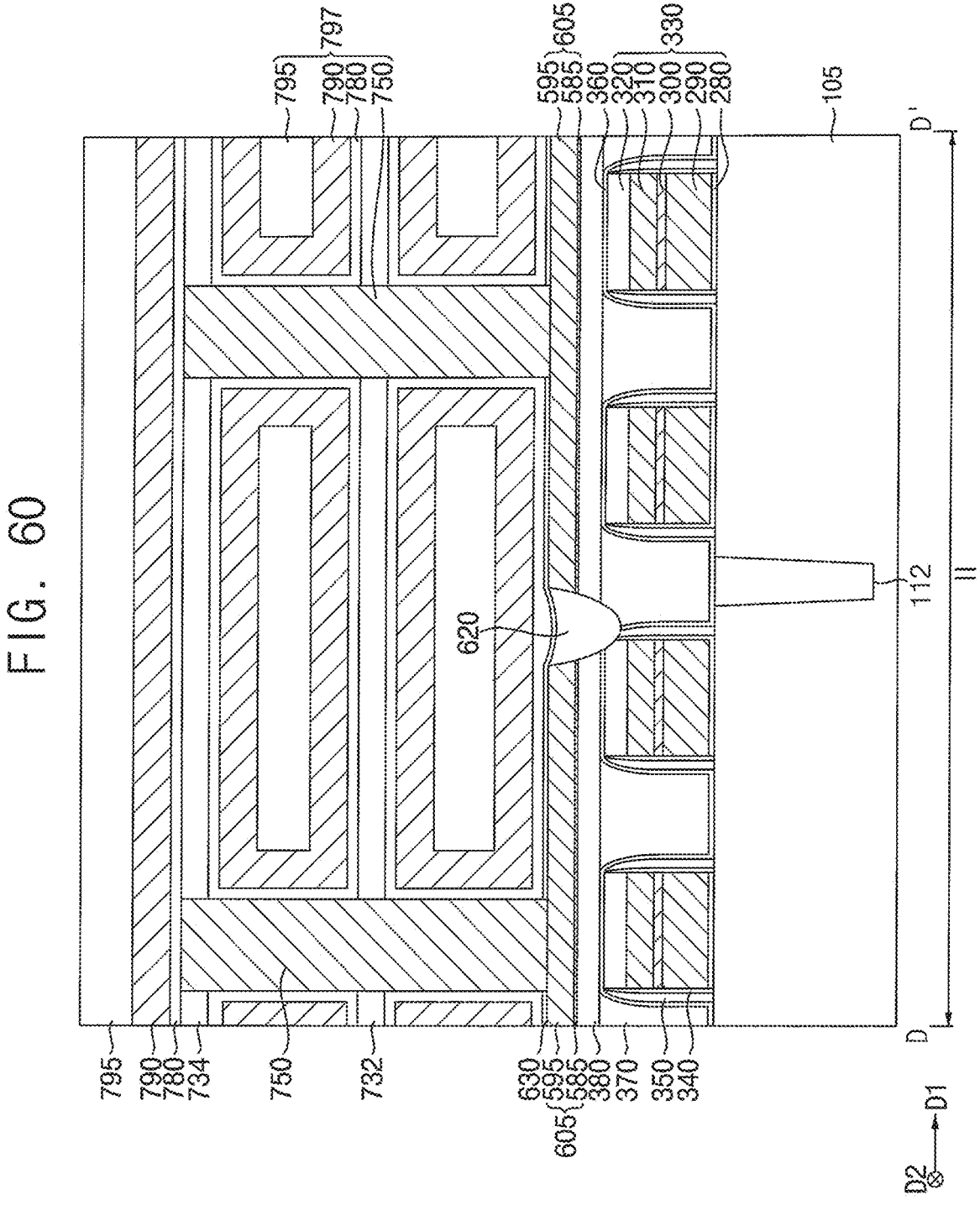

Referring to FIGS. 59 and 60, processes substantially the same as or similar to those illustrated with reference to FIGS. 4 to 11 may be performed.

Thus, a first lower electrode 750 and a second lower electrode may be formed in the sixteenth opening 740 and a seventeenth opening 745, respectively, and a third lower electrode 753 may be formed in the fifteenth opening 747. The third lower electrode 753 may include a material substantially the same as that of the first lower electrode 750 and the second lower electrode.

Additionally, first and second support patterns 736 and 738 may be formed on central and upper sidewalls, respectively, of the first lower electrode 750 and the second lower electrode, and third and fourth support patterns 736 and 738 may be formed on central and upper sidewalls, respectively, of the third lower electrode 753. The third and fourth support patterns 736 and 738 may include materials substantially the same as those of the first and second support patterns 732 and 734, respectively. The first and second support patterns 732 and 734 may form a second support structure, and the third and fourth support patterns 736 and 738 may form a first support structure.

A first dielectric layer 780, a first upper electrode 790 and a second upper electrode 795 may be sequentially stacked on surfaces of the first lower electrode 750, the second lower electrode, and the first and second support patterns 732 and 734, and a second dielectric layer 783, a third upper electrode 793 and a fourth upper electrode 796 may be sequentially stacked on surfaces of the third lower electrode 753 and the third and fourth support patterns 736 and 738. The second dielectric layer 783 may include substantially the same material as the first dielectric layer 780, the third upper electrode 793 may include substantially the same material as the first upper electrode 790, and the fourth upper electrode 796 may include substantially the same material as the second upper electrode 795.

Thus, a first capacitor structure that may include a first upper electrode structure including the third lower electrode 753, the second dielectric layer 783 and the third and fourth upper electrodes 793 and 796, and the first support structure may be formed on the first region I of the substrate 100, and each of the third lower electrodes 753 arranged in a honeycomb pattern or a lattice pattern in a plan view and portions of the second dielectric layer 783 and the third and fourth upper electrodes 793 and 796 corresponding thereto may be referred to as a first capacitor 799. The first capacitor structure may include a plurality of first capacitors 799 arranged in the first and second directions D1 and D2 on the first region I of the substrate 100.

Additionally, a second capacitor structure that may include a second upper electrode structure including the first lower electrode 750, the second lower electrode, the first dielectric layer 780 and the first and second upper electrodes 790 and 795, and the second support structure may be formed on the second region II of the substrate 100, and each of the first lower electrodes 750 and the second lower electrodes arranged in a honeycomb pattern or a lattice pattern in a plan view and portions of the first dielectric layer 780, the first upper electrode 790 and the second lower electrode corresponding thereto may be referred to as a second capacitor 797. The second capacitor structure may include a plurality of second capacitors 797 arranged in the first and second directions D1 and D2 on the second region II of the substrate 100.

In example embodiments, a plurality of second capacitor structures may be spaced apart from each other in the horizontal direction on the second region II of the substrate 100. In example embodiments, a plurality of second capacitors 797 may be formed on each of the first conductive pads 605, and the second capacitors 797 on a pair of first conductive pads 605 may share the first dielectric layer 780 and the first and second upper electrodes 790 and 795. Likewise, the second capacitor structure including the plurality of second capacitors 797 on the pair of first conductive pads 605 and the second support structure on the second region II of the substrate 100 may form a decoupling capacitor structure.

A second insulating interlayer may be formed on the first and second capacitor structures and the second etch stop layer 630 on the first and second regions I and II, the first and second contact plugs 820 and 825 (refer to FIG. 11) may be formed through the second insulating interlayer to contact upper surfaces of the first conductive pads 605, respectively, and the first and second wirings 830 and 835 may be formed to contact upper surfaces of the first and second contact plugs 820 and 825, respectively.

Upper insulating interlayers and upper wirings may be further formed on the second insulating interlayer and the first and second wirings 830 and 835, so that the fabrication of the semiconductor device may be completed.

The second capacitor structure including the plurality of second capacitors 797 may receive source and ground voltages through the first and second wirings 830 and 835 connected to the first conductive pads 605, respectively, spaced apart from each other, and may remove noises between various circuit patterns on the second region II of the substrate 100.

The semiconductor device may have following structural characteristics.

Figure 55:
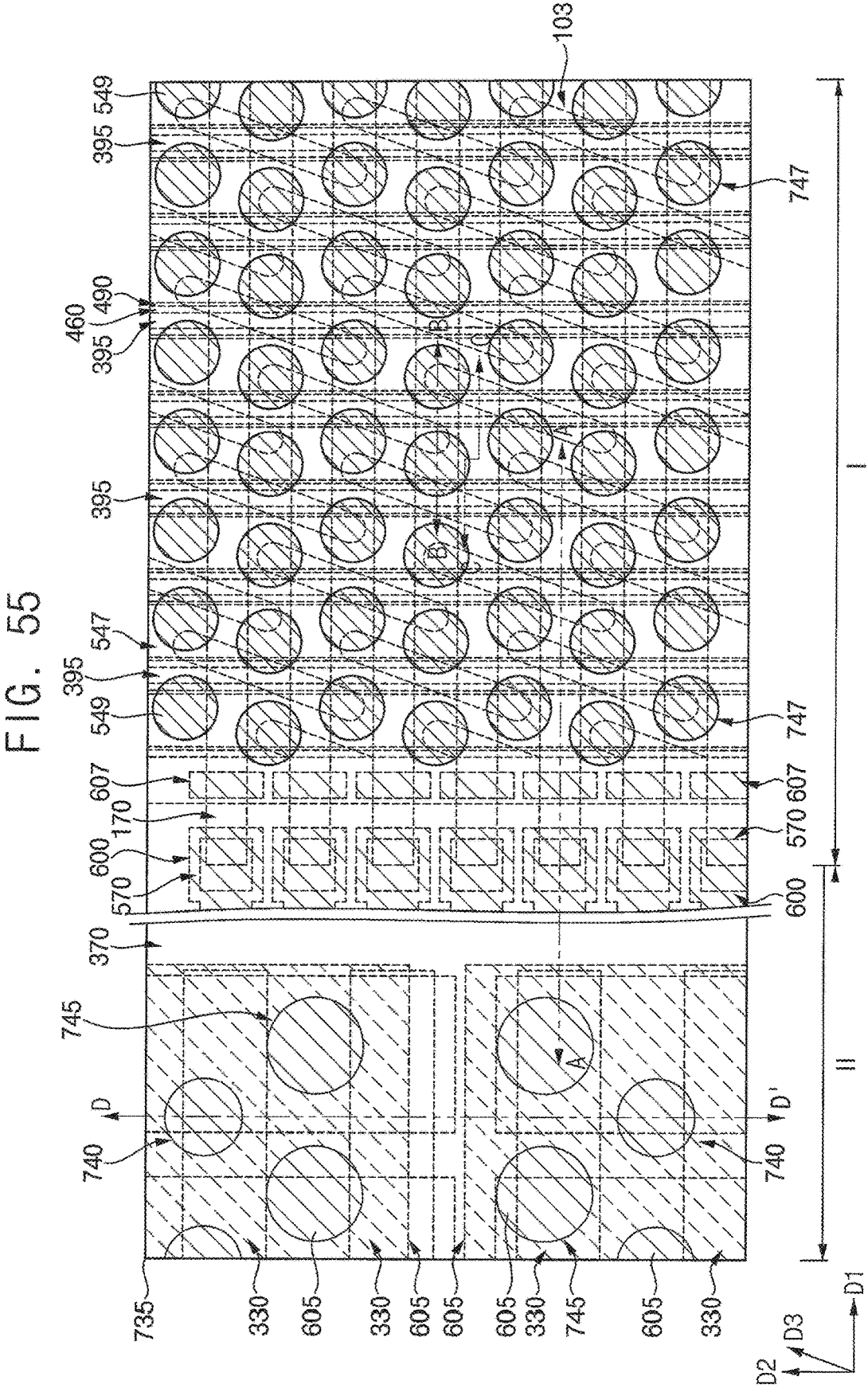
Figure 56:
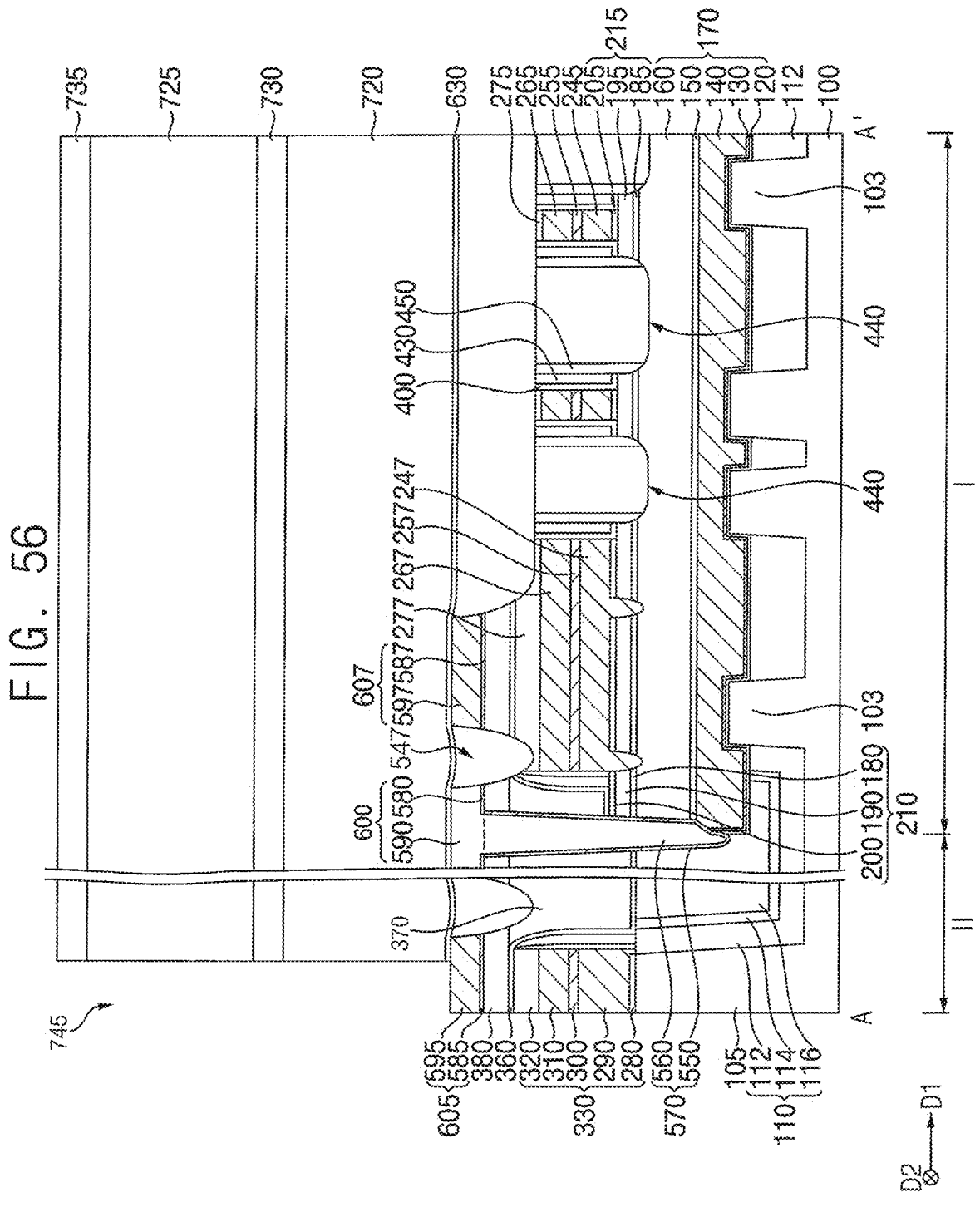
Figure 57:
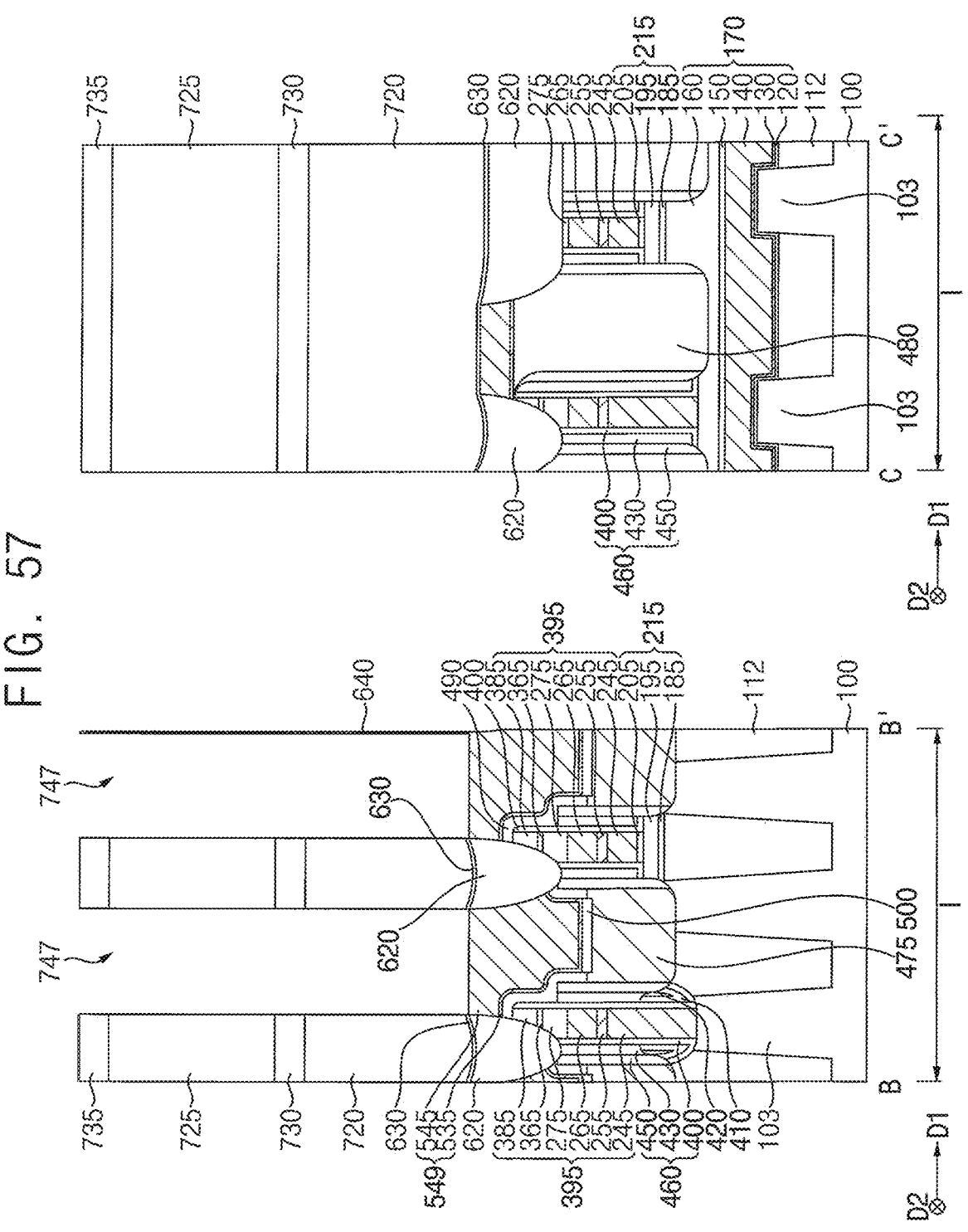
Figure 58:
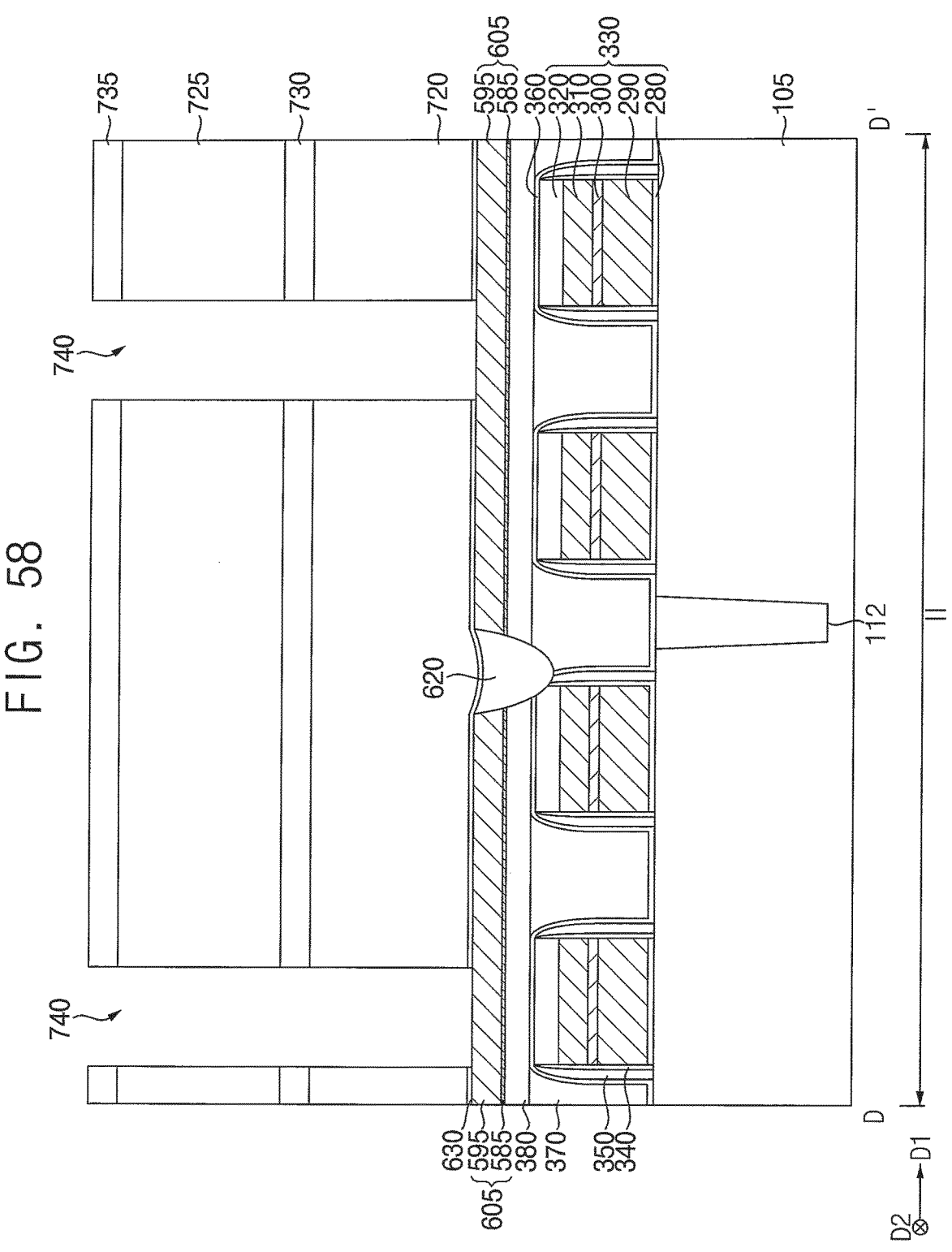

Referring to FIGS. 55, 59 and 60, the semiconductor device may include the first gate structures 170 buried in a cell region I of the substrate 100 including the cell region I and the peripheral circuit region II and each extending in the first direction D1; the bit line structures 395 each extending in the second direction D2 on the cell region I of the substrate 100; the contact plug structures 475, 500 and 549 disposed in the second direction D2 between the bit line structures 395; the first capacitor structure having the first capacitors each including the third lower electrode 753 on a corresponding one of the contact plug structures 475, 500 and 549, the second dielectric layer 783 on the surface of the third lower electrode 753, and the first upper electrode structure 793 and 795 on the surface of the second dielectric layer 783; and the first support structure 736 and 738 contacting and supporting the sidewalls of the third lower electrodes 753; the second capacitor structure having a pair of conductive pads 605 insulated from the substrate 100 on the peripheral circuit region II of the substrate 100 and divided by the sixth insulation layer 620 extending in a third direction substantially parallel to the upper surface of the substrate 100; the second capacitors each including the first lower electrodes 750 and the second lower electrodes spaced apart from each other in the first and second directions D1 and D2 on each of the pair of conductive pads 605, the first dielectric layer 780 on the surfaces of the first lower electrode 750 and the second lower electrodes, and the second upper electrode structure 790 and 795 on the surface of the first dielectric layer 780; and the second support structure 732 and 734 contacting and supporting the sidewalls of the first lower electrodes 750 and the second lower electrodes.

In example embodiments, the first lower electrodes 750 may be arranged in the third direction adjacent to the sixth insulation layer 620, and the second lower electrodes may be spaced apart from the first lower electrodes 750 in the horizontal direction.

In example embodiments, the second support structure 732 and 734 may have the seventh opening 73 (refer to FIG. 10) therethrough. The seventh opening 73 may be formed between ones of the second lower electrodes neighboring in the horizontal direction and may not be formed between the first lower electrodes 750 or between one of the first lower electrodes 750 and a neighboring one of the second lower electrodes.

In example embodiments, the first support structure 736 and 738 may include the third support pattern 736 contacting the central sidewalls of the third lower electrodes 753 and the fourth support pattern 738 contacting the upper sidewalls of the third lower electrodes 753. The second support structure 732 and 734 may include the first support pattern 732 contacting the central sidewalls of the first lower electrodes 750 and the second lower electrodes and the second support pattern 734 contacting the upper sidewalls of the first lower electrodes 750 and the second lower electrodes.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. A decoupling capacitor structure comprising:
an insulating division pattern on a substrate, the insulating division pattern extending in a first direction substantially parallel to an upper surface of the substrate;
a first conductive pad and a second conductive pad on the substrate, the first conductive pad being at a first side of the insulating division pattern, the second conductive pad being at a second side of the insulating division pattern, the first side and the second side being opposite sides in a second direction substantially parallel to the upper surface of the substrate and substantially perpendicular to the first direction;
a first lower electrode set on the first conductive pad and a second lower electrode set on the second conductive pad, the first and second lower electrode sets being spaced apart from each other in a horizontal direction substantially parallel to the upper surface of the substrate;
a support structure between the first and second lower electrode sets, the support structure contacting a first sidewall of the first lower electrode set and a second sidewall of the second lower electrode set and connecting the first and second lower electrode sets to each other;
a dielectric layer on a first surface of the first lower electrode set, a second surface of the second lower electrode set and the support structure; and
an upper electrode structure on a surface of the dielectric layer,
wherein each of the first lower electrode set and the second lower electrode set includes:
first lower electrodes arranged in the first direction and adjacent to the insulating division pattern, and
second lower electrodes spaced apart from the first lower electrodes in the horizontal direction,
wherein the support structure defines an opening through the support structure, and
wherein the opening is between multiple second lower electrodes neighboring in the horizontal direction, and is excluded between the first lower electrodes adjacent in the horizontal direction and between any of the first lower electrodes and one of the second lower electrodes adjacent thereto.

2. The decoupling capacitor structure according to claim 1, wherein the first lower electrodes include:
a first group including multiple first lower electrodes arranged in the first direction and adjacent to the insulating division pattern; and
a second group including multiple first lower electrodes arranged in the first direction, the second group being spaced apart from the first group in the second direction.

3. The decoupling capacitor structure according to claim 1, wherein a width of each of the first lower electrodes is greater than a width of at least one of the second lower electrodes.

4. The decoupling capacitor structure according to claim 1, wherein the opening is formed between two to four second lower electrodes neighboring in the horizontal direction.

5. The decoupling capacitor structure according to claim 1, wherein the opening is one of a plurality of openings defined by the support structure, the plurality of openings being spaced apart from each other in the horizontal direction, and widths of first ones of the plurality of openings adjacent to the first lower electrodes are greater than a width of a second one of the plurality of openings spaced apart from the first ones of the plurality of openings in the horizontal direction.

6. The decoupling capacitor structure according to claim 1, wherein the opening has a shape of a portion of a circle or an ellipse in a plan view.

7. The decoupling capacitor structure according to claim 6, wherein the opening has a shape of a portion of an ellipse in a plan view, and wherein the ellipse has minor axis in the first direction and has a major axis in the second directions or has the major axis in a third direction, the third direction having an acute angle with respect to the first and second directions.

8. The decoupling capacitor structure according to claim 1, wherein the support structure includes:

a first support pattern contacting central sidewalls of the first and second lower electrodes; and a second support pattern contacting upper sidewalls of the first and second lower electrodes.

9. The decoupling capacitor structure according to claim 1, wherein the dielectric layer and the upper electrode structure are in the opening.

10. The decoupling capacitor structure according to claim 1, wherein the upper electrode structure includes:

a first upper electrode on the surface of the dielectric layer; and a second upper electrode on a surface of the first upper electrode.

11. The decoupling capacitor structure according to claim 10, wherein the first upper electrode includes a metal nitride, and the second upper electrode includes silicon-germanium doped with p-type impurities.

12. The decoupling capacitor structure according to claim 1, wherein the conductive pads include first and second conductive pads spaced apart from each other in the second direction, and wherein the support structure commonly contacts the sidewalls of the first and second lower electrodes and connects the first and second lower electrodes to each other.

13. The decoupling capacitor structure according to claim 12, further comprising first and second wirings on and electrically connected to the first and second conductive pads, respectively, wherein the first and second wirings are configured to receive source and ground voltages, respectively.

14. A decoupling capacitor structure comprising:

a conductive pad on a substrate;

first lower electrodes on an edge portion of the conductive pad, the first lower electrodes being spaced apart from each other in a first direction substantially parallel to an upper surface of the substrate;

second lower electrodes on the conductive pad, the second lower electrodes being spaced apart from the first lower electrodes in a second direction substantially parallel to the upper surface of the substrate and substantially perpendicular to the first direction, the second lower electrodes being spaced apart from each other in the first and second directions;

a support structure contacting sidewalls of the first and second lower electrodes and connecting the first and second lower electrodes to each other;

a dielectric layer on surfaces of the first and second lower electrodes and the support structure; and an upper electrode structure on a surface of the dielectric layer, wherein the support structure is in contact with at least one sidewall of each of the first lower electrodes and is not in contact with the sidewalls of ones of the second lower electrodes neighboring with other second lower electrodes wherein the support structure defines an opening through the support structure, and wherein the opening is between the second lower electrodes neighboring in the second direction, and is excluded between the first lower electrodes adjacent in the first direction and between any of the first lower electrodes and one of the second lower electrodes adjacent thereto.

15. The decoupling capacitor structure according to claim 14, wherein the first lower electrodes include first and second groups of the first lower electrodes spaced apart from each other in the second direction, each of the first and second groups of the first lower electrodes including multiple first lower electrodes arranged in the first direction.

16. The decoupling capacitor structure according to claim 14, wherein a width of each of the first lower electrodes is greater than a width of at least one of the second lower electrodes.

17. The decoupling capacitor structure according to claim 14, wherein the support structure includes:

a first support pattern contacting central sidewalls of the first and second lower electrodes; and a second support pattern contacting upper sidewalls of the first and second lower electrodes.

18. The decoupling capacitor structure according to claim 14, wherein the upper electrode structure includes:

a first upper electrode on the surface of the dielectric layer; and a second upper electrode on a surface of the first upper electrode.

19. A semiconductor device comprising:

gate structures in a substrate, the substrate including a cell region and a peripheral circuit region, each of the gate structures extending in the cell region of the substrate in a first direction substantially parallel to an upper surface of the substrate;

bit line structures on the cell region of the substrate, each of the bit line structures extending in a second direction substantially parallel to the upper surface of the substrate and crossing the first direction;

contact plug structures disposed in the second direction between two of the bit line structures on the substrate;

a first capacitor structure including:

first capacitors each including:

a first lower electrode on each of the contact plug structures;

a first dielectric layer on a surface of the first lower electrode; and a first upper electrode structure on a surface of the first dielectric layer; and a first support structure contacting sidewalls of the first lower electrodes and supporting the first lower electrodes;

a pair of conductive pads on the peripheral circuit region of the substrate and electrically insulated from the substrate, the conductive pads being spaced apart from each other by an insulating division pattern extending in a third direction substantially parallel to the upper surface of the substrate; and a second capacitor structure including:

second capacitors, each of the second capacitors including:

second and third lower electrodes spaced apart from each other on each of the pair of conductive pads;

a second dielectric layer on surfaces of the second and third lower electrodes; and a second upper electrode structure on a surface of the second dielectric layer; and a second support structure contacting sidewalls of the second and third lower electrodes and supporting the second and third lower electrodes, wherein the support structure defines an opening through the support structure, and wherein the opening is between multiple third lower electrodes neighboring in a horizontal direction, and is excluded between the second lower electrodes and between one of the second lower electrodes and one of the third lower electrodes adjacent thereto.

20. The semiconductor device according to claim 19, wherein the first support structure includes:

a first support pattern contacting central sidewalls of the first lower electrodes; and a second support pattern contacting upper sidewalls of the first lower electrodes, and wherein the second support structure includes:

a third support pattern contacting central sidewalls of the second and third lower electrodes; and a fourth support pattern contacting upper sidewalls of the second and third lower electrodes.

* * * * *